US006023783A

United States Patent [19]
Divsalar et al.

[11] Patent Number: 6,023,783
[45] Date of Patent: Feb. 8, 2000

[54] HYBRID CONCATENATED CODES AND ITERATIVE DECODING

[75] Inventors: Dariush Divsalar, Pacific Palisades; Fabrizio Pollara, La Canada, both of Calif.

[73] Assignee: California Institute of Technology, Pasadena, Calif.

[21] Appl. No.: 08/857,021

[22] Filed: May 15, 1997

[51] Int. Cl.[7] ........................ H03M 13/12; H03M 13/22; H04L 25/49

[52] U.S. Cl. ........................ 714/792; 375/262; 375/264; 375/265; 714/755; 714/757; 714/794; 714/795

[58] Field of Search .................................. 371/37.4, 37.6, 371/37.06, 43.2, 43.4, 43.6, 43.7; 375/264, 265, 262, 341

[56] References Cited

U.S. PATENT DOCUMENTS

| | | | |
|---|---|---|---|
| 5,233,629 | 8/1993 | Paik et al. ................................. | 375/39 |
| 5,446,747 | 8/1995 | Berrou ....................................... | 371/45 |
| 5,721,745 | 2/1998 | Hladik et al. ............................. | 371/43 |
| 5,729,560 | 3/1998 | Hagenauer et al. .................... | 371/43.1 |
| 5,734,962 | 3/1998 | Hladik et al. ........................... | 455/12.1 |

OTHER PUBLICATIONS

Divsalar, D., et al. "Multiple Turbo Codes for Deep–Space Communications", *The Telecommunications and Data Acquisition Progress Report 42–121 for NASA and California Institute of Technology Jet Propulsion Laboratory*, Joseph H. Yuen, ed., pp. 60–77, May 15, 1995.

Divsalar, D., et al. "On the Design of Turbo Codes", *The Telecommunications and Data Acquisition Progress Report 42–123 for NASA and California Institute of Technology Jet Propulsion Laboratory*, Joseph H. Yuen, ed., pp. 99–121, Nov. 15, 1995.

Divsalar, D., et al., "Low–Rate Turbo Codes for Deep Space Communications", Proceedings from the 1995 IEEE International Symposium on Information Theory, Whistler, British Columbia, Canada, p. 35, Sep. 17–22, 1995.

Benedetto, S., et al., "Bandwidth efficient parallel concatenated coding schemes", *Electronics Letters*, vol. 31, No. 24, pp. 2067–2069, Nov. 23, 1995.

Divsalar, D., et al., "Turbo Codes for PCS Applications", *IEEE ICC '95*, Seattle, WA, pp. 54–59, Jun. 1995.

Divsalar, D., et al., "Multiple Turbo Codes", *MILCOM '95*, San Diego, CA, pp. 279–285, Nov. 5–6, 1995.

(List continued on next page.)

*Primary Examiner*—Stephen M. Baker
*Attorney, Agent, or Firm*—Fish & Richardson, P.C.

[57] ABSTRACT

Several improved turbo code apparatuses and methods. The invention encompasses several classes: (1) A data source is applied to two or more encoders with an interleaver between the source and each of the second and subsequent encoders. Each encoder outputs a code element which may be transmitted or stored. A parallel decoder provides the ability to decode the code elements to derive the original source information d without use of a received data signal corresponding to d. The output may be coupled to a multilevel trellis-coded modulator (TCM). (2) A data source d is applied to two or more encoders with an interleaver between the source and each of the second and subsequent encoders. Each of the encoders outputs a code element. In addition, the original data source d is output from the encoder. All of the output elements are coupled to a TCM. (3) At least two data sources are applied to two or more encoders with an interleaver between each source and each of the second and subsequent encoders. The output may be coupled to a TCM. (4) At least two data sources are applied to two or more encoders with at least two interleavers between each source and each of the second and subsequent encoders. (5) At least one data source is applied to one or more serially linked encoders through at least one interleaver. The output may be coupled to a TCM. The invention includes a novel way of terminating a turbo coder.

74 Claims, 30 Drawing Sheets

OTHER PUBLICATIONS

Benedetto, S., et al. "Soft–Output Decoding Algorithms in Iterative Decoding of Turbo Codes", *The Telecommunications and Data Acquisition Progress Report 42–124 for NASA and California Institute of Technology Jet Propulsion Laboratory*, Joseph H. Yuen, ed., pp. 63–87, Feb. 15, 1996.

Divsalar, D., et al., "Effective free distance of turbo codes", *Electronic Letters*, vol. 32, No. 5, pp. 445–446, Feb. 29, 1996.

Benedetto, S., et al. "Serial Concatenation of Interleaved Codes: Performance Analysis, Design, and Iterative Decoding", *The Telecommunications and Data Acquisition Progress Report 42–126 for NASA and California Institute of Technology Jet Propulsion Laboratory*, Joseph H. Yuen, ed., pp. 1–26, Aug. 15, 996.

Benedetto, S., et al. "A Soft–Input Soft–Output Maximum A Posteriori (MAP) Module to Decode Parallel and Serial Concatenated Codes", *The Telecommunications and Data Acquisition Progress Report 42–127 for NASA and California Institute of Technology Jet Propulsion Laboratory*, Joseph H. Yuen, ed., pp. 1–20, Nov. 15, 1996.

Benedetto, S., et al., "Parallel Concatenated Trellis Coded Modulation", *ICC '96*, pp. 974–978, Jun. 1996.

Benedetto, S., et al., "A Soft–Input Soft–Output APP Module for Iterative Decoding of Concatenated Codes", *IEEE Communication Letters*, vol. 1, No. 1, pp. 22–24, Jan. 1997.

Divsalar, D., et al., "Hybrid Concatenated Codes and Iterative Decoding", Proceedings from the IEEE 1997 International Symposium on Information Theory, Ulm, Germany, p. 10, Jun. 29–Jul. 4, 1997.

Benedetto, S., et al., "Serial Concatenation of interleaved codes: performance analysis, design, and iterative decoding", Proceedings from the IEEE 1997 International Symposium on Information Theory, Ulm, Germany, p. 106, Jun. 29–Jul. 4, 1997.

Benedetto, S., et al., "Serial Concatenated Trellis Coded Modulation with Iterative Decoding", Proceedings from the IEEE 1997 International Symposium on Information Theory, Ulm, Germany, p. 8, Jun. 29–Jul. 4, 1997.

Benedetto, S., et al., "Design of Serially Concatenated Interleaved Codes", *ICC '97*, Montreal, Canada, pp. 710–714, Jun. 1997.

Hagenauer et al., "A Viterbi Algorithm with Soft–Decision Outputs and its Applications", GLOBECOM '89, pp. 47.1.1–47.1.7, Nov. 1989.

Berrou et al., "Near Shannon Limit Error–Correcting Coding and Decoding: Turbo–Codes", ICC '93, pp. 1064–1070, May 1993.

Le Goff et al., "Turbo–Codes and High Spectral Efficiency Modulation", ICC '94, pp. 645–649, May 1994.

Hagenauer et al., "Decoding "Turbo"–Codes with the Soft Output Viterbi Algorithm (SOVA)", 1994 International Symposium on Information Theory, p. 164, Jul. 1994.

Anderson, "'Turbo' Coding for Deep Space Applications", 1995 International Symposium on Information Theory, p. 36, Sep. 1995.

Siala et al., "An Iterative Decoding Scheme for Serially Concatenated Convolutional Codes", 1995 International Symposium on Information Theory, p. 473, Sep. 1995.

Fazel et al., "Combined Multilevel Turbo–Code with 8PSK Modulation", GLOBECOM '95, pp. 649–652, Nov. 1995.

Thitimajshima, "Recursive Systematic Convolutional Codes and Application to Parallel Concatenation", GLOBECOM '95, pp. 2267–2272, Nov. 1995.

Hagenauer et al., "Iterative Decoding of Binary Block and Convolutional Codes", IEEE Trans. on Information Theory, vol. 42, No. 2, Mar. 1996, pp. 429–445, Mar. 1996.

Lee, "Convolutional Coding: Fundamentals and Applications", Artech House, 1997, p. 38, Oct. 1997.

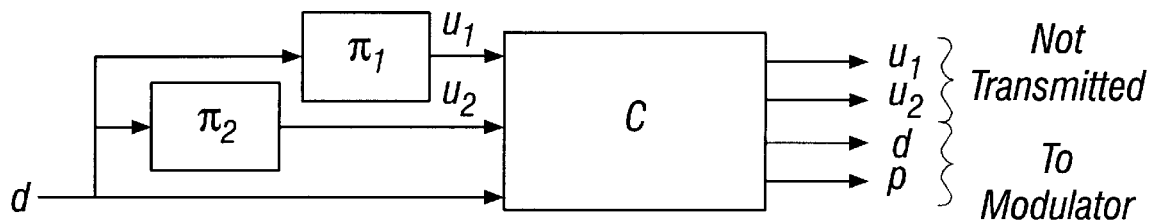
FIG. 6B
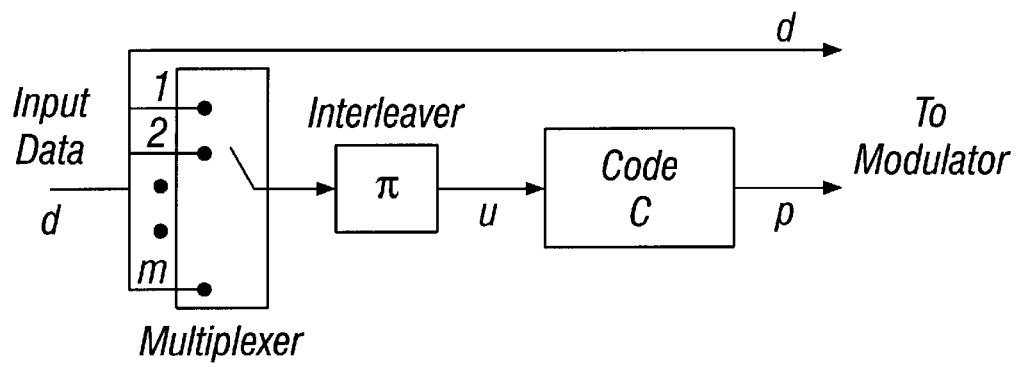
FIG. 6B2

(c)Parallel

Time

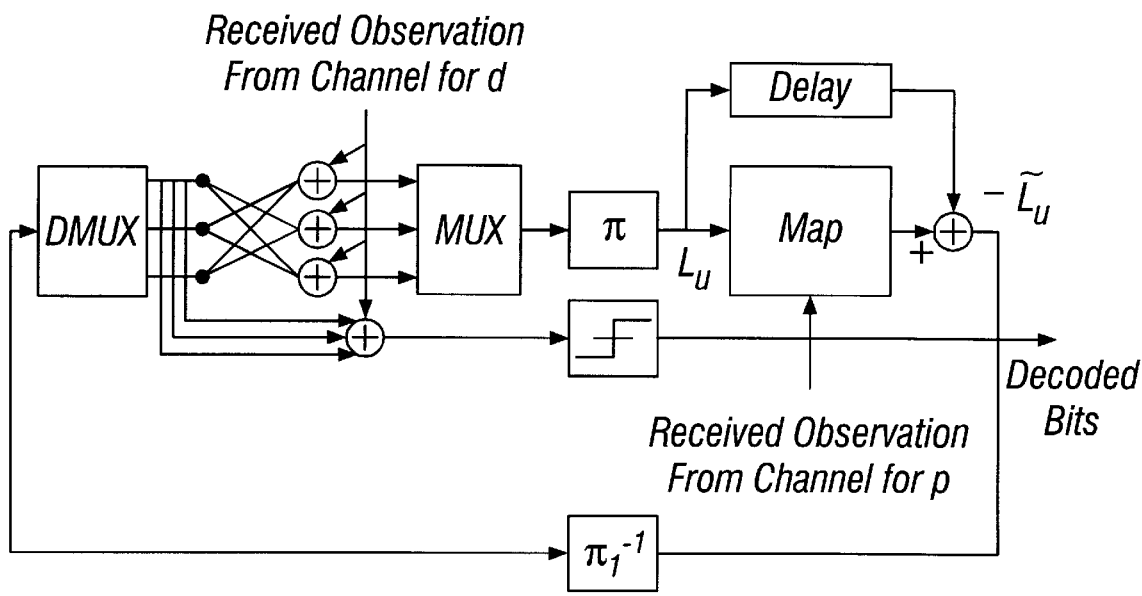
FIG. 20D2
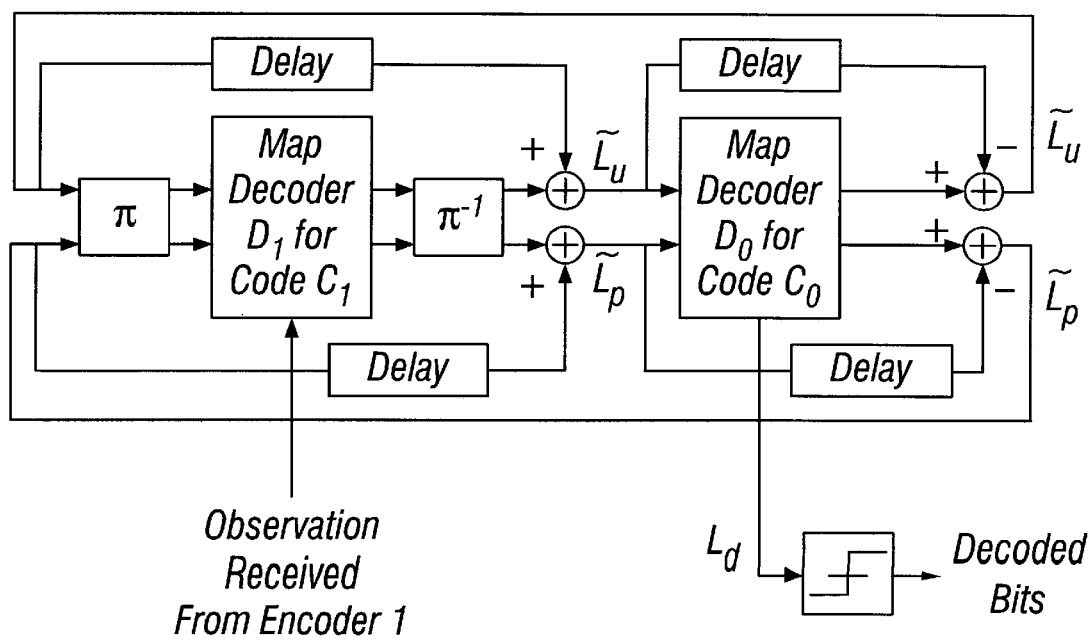
FIG. 20E1

HYBRID CONCATENATED CODES AND ITERATIVE DECODING

ORIGIN OF INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to error correcting codes.

2. Description of Related Art

Turbo codes are binary error-correcting codes built from the parallel concatenation of two recursive systematic convolutional codes and using a feedback decoder. Recently introduced be Berrou, et al. ("Near Shannon limit error-correcting coding and decoding: Turbo-codes", ICC'93, Conf Rec. pp. 1064–1070, Geneva, May 1993), the basics of such codes are described further in U.S. Pat. Nos. 5,446,747 and 5,406,570.

The reference and patents to Berrou describe a basic turbo code encoder architecture of the type shown in the block diagram in FIG. 1. As described in Berrou '747, FIG. 1 shows a block diagram of a coder in an example where two distinct codes are used in parallel. Each source data element d to be coded is coupled to a first systematic coding module 11 and, through a temporal interleaving module 12, to a second systematic coding module 13. The coding modules 11 and 13 may be of any known systematic type, such as convolutional coders, that take into account at least one of the preceding source data elements in order to code the source data element d. The codes implemented in coding modules 11 and 13 may be identical or different.

The input information bits d feed the first coding module 11 and, after being scrambled by the interleaving module 12, enter the second coding module 13. A codeword of a parallel concatenated code consists of the information input bits to the first encoder followed by the parity check bits of both encoders.

Under this architecture, there are at least two coded data elements $Y_1$ and $Y_2$, coming from distinct coders 11 and 13, associated with each source data element d. A data element X, equal to the source data element d, is also transmitted. This characteristic was described in Berrou '747 as "necessary for the making of the decoding modules".

The transmitted coded data elements and source data element become received data elements at a decoder. The task of the decoder is to re-construct the original data source d bit stream from the received data elements, which may have been corrupted by noise.

Thus, an important aspect of prior art turbo code encoders is that they transmit a data element X equal to input source data element d.

The present invention results from observation that the prior art fails to achieve a simpler architecture for the encoder, and fails to provide as robust encoding as is required or desired in certain environments, including low-power, constrained-bandwidth uses, such as deep space communications and personal communication devices, and high-noise environments.

SUMMARY OF THE INVENTION

The present invention encompasses several improved turbo code apparatuses and methods. In a first class of turbo code encoders, a data source d is applied to two or more encoders with an interleaver between the data source and each of the second and subsequent encoders. Each of the encoders outputs a turbo code element which may be transmitted or stored. A parallel decoder provides the ability to decode the turbo code elements to derive the original source information d without use of a received data signal corresponding to d. The output of the turbo code encoder optionally may be coupled to a multilevel trellis-coded modulator that provides excellent performance.

In a second class of turbo code encoders, a data source d is applied to two or more encoders with an interleaver between the data source and each of the second and subsequent encoders. Each of the encoders outputs a turbo code element. In addition, the original data source d is output from the encoder. All of the output elements are coupled to a multilevel trellis-coded modulator.

In a third class of turbo code encoders, at least two data sources are applied to two or more encoders with an interleaver between each data source and each of the second and subsequent encoders. Each of the encoders outputs a plurality of turbo code elements which may be transmitted or stored. The output of the turbo code encoder optionally may be coupled to a multilevel trellis-coded modulator.

In a fourth class of turbo code encoders, at least two data sources are applied to two or more encoders with at least two interleavers between each data source and each of the second and subsequent encoders. Each of the encoders outputs a plurality of turbo code elements which may be transmitted or stored. The output of the turbo code encoder optionally may be coupled to a multilevel trellis-coded modulator.

In a fifth class of turbo code encoders, at least one data source is applied to one or more serially linked encoders through at least one interleaver.

The invention also encompasses a novel method of terminating or resetting a turbo coder, and a general parallel decoder structure.

The details of the preferred embodiments of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 6B is a block diagram of a variation of the coder shown in FIG. 6A, showing a self-concatenating code.

FIG. 6B2 is a block diagram showing a variation of a self-concatenated code, where the encoder has at least one input data line d, and d is sent to the modulator.

FIG. 20D2 is a block diagram showing a decoder corresponding to the self-concatenated coder of FIG. 6B2.

FIG. 20E is a block diagram showing a decoder corresponding to the serial coder of FIG. 7A.

FIG. 20E2 shows a block diagram of an original and a modified MAP algorithm.

Like reference numbers and designations in the various drawings indicate like elements.

DETAILED DESCRIPTION OF THE INVENTION

Figure 1:
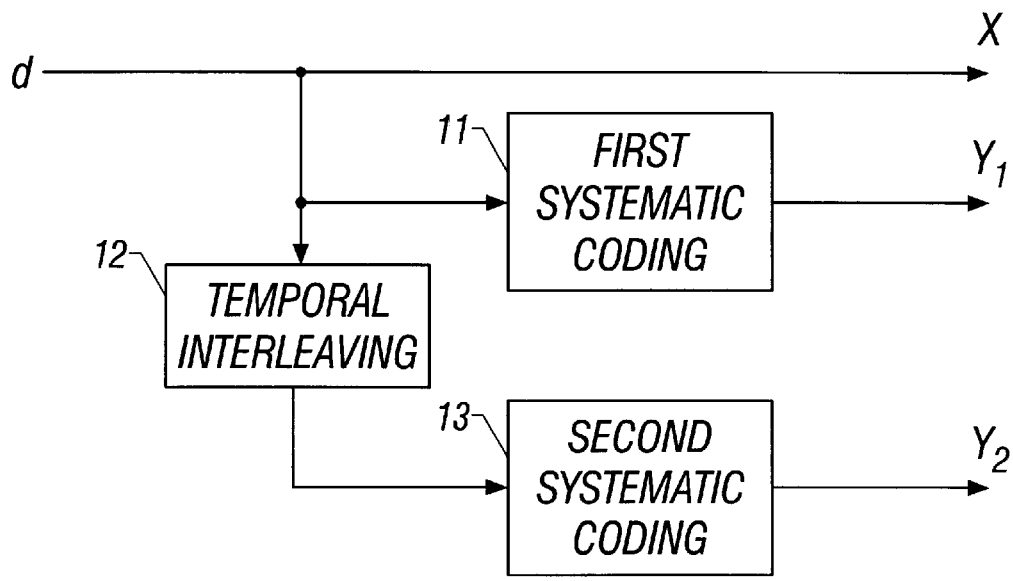
FIG. 1 is a block diagram of a prior art turbo code encoder.

Throughout this description, the preferred embodiment and examples shown should be considered as exemplars, rather than as limitations on the present invention.

Overview

Turbo codes are believed to be able to achieve near Shannon-limit error correction performance with relatively simple component codes and large interleavers. The present invention encompasses several novel designs for turbo code encoders and a corresponding decoder that is suitable for error correction in high noise or constrained-bandwidth, low power uses, such as personal communications systems (PCS) applications, where lower rate codes can be used.

For example, in multiple-access schemes like CDMA (Code Division Multiple Access), the capacity (maximum number of users per cell) can be expressed as:

$$C = \frac{\eta}{E_b/N_o} + 1 \qquad (1)$$

where $\eta$ is the processinggain and $E_b/N_o$ is the required signal-to-noise ratio to achieve a desired bit error rate (BER) performance ($E_b$: energy received per useful bit; $N_o$: monolateral spectral density of noise). For a specified BER, a smaller required $E_b/N_o$ implies a larger capacity or cell size. Unfortunately, to reduce $E_b/N_o$, it is necessary to use very complex codes (e.g., large constraint length convolutional codes). However, the present invention includes turbo codes that are suitable for CDMA and PCS applications and which can achieve superior performance with limited complexity. For example, if a (7, ½) convolutional code is used at BER=$10^{-3}$, the capacity is C=0.5$\eta$. However, if two (5, ⅓) punctured convolutional codes or three (4, ⅓) punctured codes are used in a turbo encoder structure in accordance with the present invention, the capacity can be increased to C=0.8$\eta$ (with 192-bits and 256-bits interleavers, which correspond to 9.6 Kbps and 13 Kbps with roughly 20ms frames). Higher capacity can be obtained with larger interleavers. Note that low rate codes can be used for CDMA since an integer number of chips per coded symbol are used and bandwidth is defined mainly by chip rate.

Implementation

The invention may be implemented in hardware or software, or a combination of both. In the preferred embodiment, the functions of a turbo coder and decoder designed in conformance with the principals set forth herein are implemented as one or more integrated circuits using a suitable processing technology (e.g., CMOS).

As another example, the invention may be implemented in computer programs executing on programmable computers each comprising a processor, a data storage system (including volatile and non-volatile memory and/or storage elements), at least one input device, and at least one output device. Program code is applied to input data to perform the functions described herein and generate output information. The output information is applied to one or more output devices, in known fashion.

Each such program may be implemented in a high level procedural or object oriented programming language to communicate with a computer system. However, the programs can be implemented in assembly or machine language, if desired. In any case, the language may be a compiled or interpreted language.

Each such computer program is preferably stored on a storage media or device (e.g., ROM or magnetic disk) readable by a general or special purpose programmable computer, for configuring and operating the computer when the storage media or device is read by the computer to perform the procedures described herein. The inventive system may also be considered to be implemented as a computer-readable storage medium, configured with a computer program, where the storage medium so configured causes a computer to operate in a specific and predefined manner to perform the functions described herein. An example of one such type of computer is a personal computer.

Turbo Code Encoders

Following is a discussion of several general considerations in designing turbo code encoders and decoders in accordance with the present invention. Since these considerations pertain to the novel designs described below as well as prior art designs in some cases, a simple 3-code encoder, as shown in FIG. 2, will be used as an initial example.

General Structure of an Encoder

Figure 2:
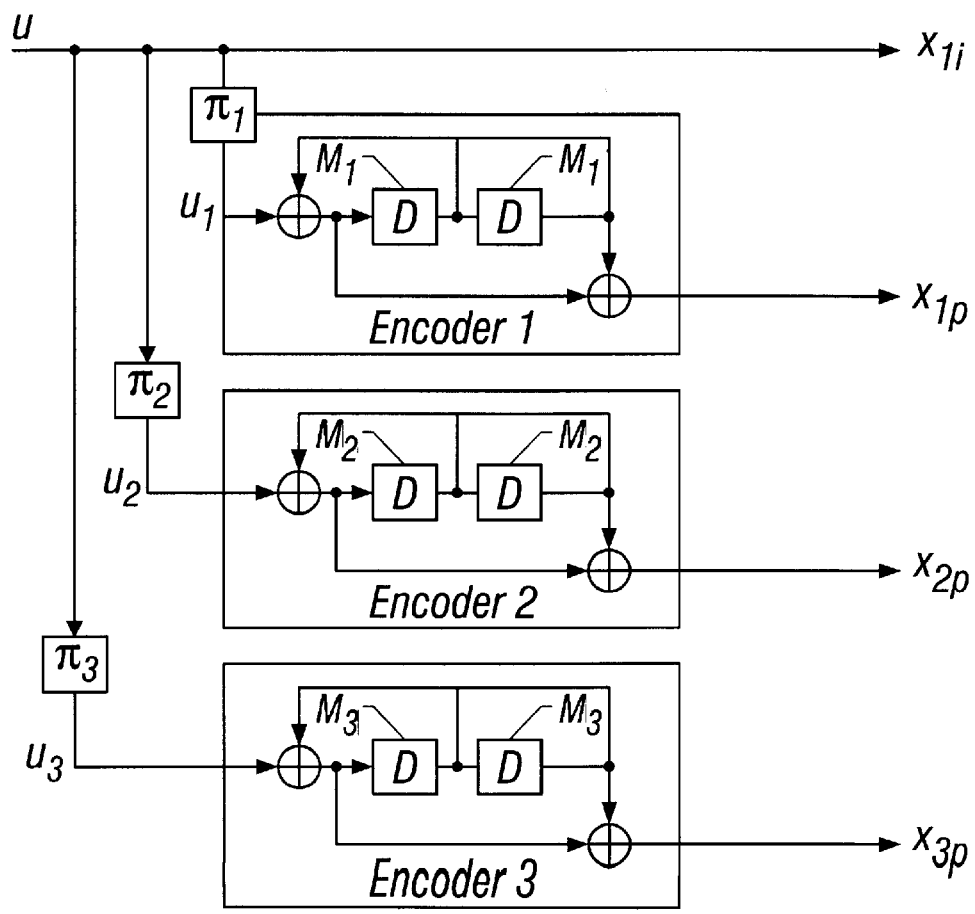
FIG. 2 is a block diagram of a general model of a turbo code encoder having three codes.

In FIG. 2, the turbo code encoder contains three recursive binary convolutional encoders, with $M_1$, $M_2$ and $M_3$ memory cells (comprised of the delay gates D shown in each encoder) respectively. In general, the three component encoders may not be identical and may not have identical code rates. The information bit sequence $u=(u_1, \ldots u_N)$ of length N is applied to the component Encoder 1 through interleaver $\pi_1$ (normally set to the identify function), which outputs a sequence $u_1$. The component Encoder 1 produces two output sequences, $x_{1i}$ and $x_{1p}$ (the subscript i stands for "information" bits, while the subscript p stands for "parity" bits). The component Encoder 2 operates on a reordered sequence of information bits, $u_2$, produced by an interleaver (also known as a permuter), $\pi_2$, of length N, and outputs the sequence $x_{2p}$. The component Encoder 3 operates on a reordered sequence of information bits, $u_3$, produced by an interleaver, $\pi_3$, of length AT, and outputs the sequence $x_{3p}$. Similarly, subsequent component encoders operate on a reordered sequence of information bits, $u_j$, produced by interleaver $\pi_j$, and output the sequence $x_{jp}$.

In the preferred embodiment, each interleaver is a pseudo-random block scrambler defined by a permutation of N elements with no repetitions. That is, a complete block is read into an interleaver and read out in a specified (fixed) random order.

In general, a decoder (discussed more fully below) receives the transmitted sequences $x_{1i}$ and $x_{jp}$, as received sequences $y_j$. As noted above, the task of the decoder is to re-construct the original data source d bit stream from the received data elements, which may have been corrupted by noise. In the present invention, the encoder does not need to transmit the original data sequence. If one or more encoder outputs, including possibly $x_{1i}$, is punctured (not transmitted) based on a predetermined pattern, the punctured positions will be filled with erasures at the receiver.

FIG. 2 shows an example where a rate $r=1/n=¼$ code is generated by three component codes with $M_1=M_2=M_3=M=2$, producing the outputs:

$x_{1i}=u$ $x_{1p}=u \cdot g_b/g_a$ $x_{2p}=u_2 \cdot g_b/g_a$ $x_{3p}=u_3 \cdot g_b/g_a$ $\pi_1$ is assumed to be an identity, i.e., no permutation), where the generator polynomials $g_a$ and $g_b$ have octal representation $(7)_{octal}$ and $(5)_{octal}$, respectively. Note that various code rates can be obtained by proper puncturing of $x_{1p}$, $x_{2p}$, $x_{3p}$, and even $x_{1i}$ if a decoder in accordance with the present invention is used (see below).

Design of Preferred Constituent Encoders

A design for constituent convolutional codes, which are not necessarily optimum convolutional codes, was originally reported in S. Benedetto and G. Montorsi, "Design of Parallel Concatenated Convolutional Codes" (to be published in *IEEE Transactions on Communications*, 1996) for rate 1/n codes. We extend those results to rate b/n codes. It has been suggested (without proof) that good random codes are obtained if $g_a$ is a primitive polynomial. This suggestion, used in the report cited above to obtain "good" rate ½ constituent codes, will be used in this article to obtain "good" rate ⅓, ⅔, ¾, and ⅘ constituent codes. By "good" codes, we mean codes with a maximum effective free distance $d_{ef}$, that is, those codes that maximize the minimum output weight for weight-2 input sequences (because this weight tends to dominate the performance characteristics over the region of interest).

Maximizing the weight of output codewords corresponding to weight-2 data sequences gives the best BER performance for a moderate bit signal-to-noise ratio (SNR) as the random interleaver size N gets large. In this region, the dominant term in the expression for bit error probability of a turbo code with q constituent encoders is:

$$P_b \approx \frac{\beta}{N^{q-1}} Q\sqrt{2r\frac{E_b}{N_0}\left(\sum_{j=1}^{q} d^p_{j,2} + 2\right)} \quad (2)$$

where $d^p_{j,2}$ is the minimum parity-weight (weight due to parity checks only) of the codewords at the output of the jth constituent code due to weight-2 data sequences, and β is a constant independent of N. Define $d_{j,2}=d^p_{j,2}+2$ as the minimum output weight including parity and information bits, if the jth constituent code transmits the information (systematic) bits. Usually one constituent code transmits the information bits (j=1), and the information bits of other codes are punctured. Define $d_{ef}=\Sigma^q_{j=1}d^p_{j,2}+2$ as the effective free distance of the turbo code and $1/N^{q-1}$ as the "interleaver's gain." We have the following bound on $d^p_{j,2}$ for any constituent code: for any $r=b/(b+1)$ recursive systematic convolutional encoder with generator matrix:

$$G = \begin{bmatrix} I_{b \times b} & \begin{matrix} \frac{h_1(D)}{h_0(D)} \\ \frac{h_2(D)}{h_0(D)} \\ \vdots \\ \frac{h_b(D)}{h_0(D)} \end{matrix} \end{bmatrix} \quad (3)$$

where $I_{b \times b}$ is the identity matrix, $\deg[h_i(D)] \leq m$, $h_i(D) \neq h_0(d)$, $i=1,2,\ldots,b$, and $h_0(D)$ is a primitive polynomial of degree $m$, the following upper bound holds:

$$d_2^p \leq \left\lceil \frac{2^{m-1}}{b} \right\rceil + 2 \quad (4)$$

A corollary of this is that, for any $r=b/n$ recursive systematic convolutional code with b inputs, b systematic outputs, and n-b parity output bits using a primitive feedback generator, we have:

$$d_2^p \leq \left\lceil \frac{(n-b)2^{m-1}}{b} \right\rceil + 2(n-b) \quad (5)$$

There is an advantage to using b>1, since the bound in the above equation for rate b/bn codes is larger than the bound for rate 1/n codes. Examples of codes that meet the upper bound for b/bn codes are set forth below.

A. Best Rate b/b+1 Constituent Codes

We obtained the best rate ⅔ codes as shown in Table 1, where $d_2 = d^p_{j,2} + 2$. The minimum-weight codewords corresponding to weight-3 data sequences are denoted by $d_3$, $d_{min}$ is the minimum distance of the code, and $k=m+1$ in all the tables. By "best" we mean only codes with a large $d_2$ for a given m that result in a maximum effective free distance. We obtained the best rate ¾ codes as shown in Table 2 and the best rate ⅘ codes as shown in Table 3.

TABLE 1

Best rate 2/3 constituent codes.

| k | Code generator | | | $d_2$ | $d_3$ | $d_{min}$ |
|---|---|---|---|---|---|---|
| 3 | $h_0 = 7$ | $h_1 = 3$ | $h_2 = 5$ | 4 | 3 | 3 |
| 4 | $h_0 = 13$ | $h_1 = 15$ | $h_2 = 17$ | 5 | 4 | 4 |
| 5 | $h_0 = 23$ | $h_1 = 35$ | $h_2 = 27$ | 8 | 5 | 5 |
|   | $h_0 = 23$ | $h_1 = 35$ | $h_2 = 33$ | 8 | 5 | 5 |
| 6 | $h_0 = 45$ | $h_1 = 43$ | $h_2 = 61$ | 12 | 6 | 6 |

TABLE 2

Best rate 3/4 constituent codes.

| k | Code generator | | | | $d_2$ | $d_3$ | $d_{min}$ |
|---|---|---|---|---|---|---|---|
| 3 | $h_0 = 7$ | $h_1 = 5$ | $h_2 = 3$ | $h_3 = 1$ | 3 | 3 | |
|   | $h_0 = 7$ | $h_1 = 5$ | $h_2 = 3$ | $h_3 = 4$ | 3 | 3 | |
|   | $h_0 = 7$ | $h_1 = 5$ | $h_2 = 3$ | $h_3 = 2$ | 3 | 3 | |
| 4 | $h_0 = 13$ | $h_1 = 15$ | $h_2 = 17$ | $h_3 = 11$ | 4 | 4 | |
| 5 | $h_0 = 23$ | $h_1 = 35$ | $h_2 = 33$ | $h_3 = 25$ | 5 | 4 | |
|   | $h_0 = 23$ | $h_1 = 35$ | $h_2 = 27$ | $h_3 = 31$ | 5 | 4 | |
|   | $h_0 = 23$ | $h_1 = 35$ | $h_2 = 37$ | $h_3 = 21$ | 5 | 4 | |
|   | $h_0 = 23$ | $h_1 = 27$ | $h_2 = 37$ | $h_3 = 21$ | 5 | 4 | |

TABLE 3

Best rate 4/5 constituent codes.

| k | Code generator | | | | | $d_2$ | $d_3$ | $d_{min}$ |
|---|---|---|---|---|---|---|---|---|
| 4 | $h_0 = 13$ | $h_1 = 15$ | $h_2 = 17$ | $h_3 = 11$ | $h_4 = 7$ | 4 | 3 | 3 |
|   | $h_0 = 13$ | $h_1 = 15$ | $h_2 = 17$ | $h_3 = 11$ | $h_4 = 5$ | 4 | 3 | 3 |
| 5 | $h_0 = 23$ | $h_1 = 35$ | $h_2 = 33$ | $h_3 = 37$ | $h_4 = 31$ | 5 | 4 | 4 |
|   | $h_0 = 23$ | $h_1 = 35$ | $h_2 = 21$ | $h_3 = 37$ | $h_4 = 31$ | 5 | 4 | 4 |
|   | $h_0 = 23$ | $h_1 = 35$ | $h_2 = 21$ | $h_3 = 37$ | $h_4 = 31$ | 5 | 4 | 4 |

B. Best Punctured Rate ½ Constituent Codes

A rate ⅔ constituent code can be derived by puncturing the parity bit of a rate ½ recursive systematic convolutional code using, for example, a pattern P=[10]. A puncturing pattern P has zeros where parity bits are removed.

Consider a rate ½ recursive systematic convolutional code $(1, g_1(D)/(g_0(D)))$. For an input $u(D)$, the parity output can be obtained as:

$$x(D) = \frac{u(D)g_1(D)}{g_0(D)} \quad (6)$$

We would like to puncture the output $x(D)$ using, for example, the puncturing pattern P[10] (decimation by 2) and obtain the generator polynomials $h_0(D)$, $h_1(D)$, and $h_2(D)$ for the equivalent rate ⅔ code:

$$G = \begin{bmatrix} 1 & 0 & \frac{h_1(D)}{h_0(D)} \\ 0 & 1 & \frac{h_2(D)}{h_0(D)} \end{bmatrix} \quad (7)$$

We note that any polynominal $f(D)=\Sigma a_i D^i$, $a_i \in GF(2)$, can be written as: $f(D) = f_1(D^2) + Df_2(D^2)$, where $f_1(D^2)$ corresponds to the even power terms of $f(D)$, and $Df_2(D^2)$ corresponds to the odd power terms of $f(D)$. Now, if we use this approach and apply it to $u(D)$, $g_1(D)$, and $g_0(D)$, then we can rewrite the equation for $x(D)$ as:

$$x_1(D^2) + Dx_2(D)^2 = \frac{(u_1(D^2) + Du_2(D^2))(g_{11}(D^2) + Dg_{12}(D^2))}{g_{01}(D^2) + Dg_{02}(D^2)} \quad (8)$$

where $x_1(D)$ and $x_2(D)$ correspond to the punctured output $x(D)$ using puncturing patterns P[10] and P[01], respectively. If we multiply both sides of the above equation by $(g_{01}(D^2) + Dg_{02}(D^2))$ and equate the even and the odd power terms, we obtain two equations in two unknowns, namely $x_1(D)$ and $x_2(D)$. For example, solving for $x_1(D)$, we obtain:

$$x_1(D) = u_1(D)\frac{h_1(D)}{h_0(D)} + u_2(D)\frac{h_2(D)}{h_0(D)} \quad (9)$$

where $h_0(D) = g_0(D)$ and:

$$h_1(D) = g_{11}(D)g_{01}(D) + Dg_{12}(D)g_{02}(D) \quad (10)$$

$$h_2(D) = g_{12}(D)g_{01}(D) + Dg_{11}(D)g_{02}(D) \quad (11)$$

From the second equation above, it is clear that $h_{2,0}=0$. A similar method can be used to show that for P[01] we get $h_{1,m}=0$. These imply that the conditions that $h_{i,0}=1$ and $h_{i,m}=1$ will be violated. Thus, we have the following theorem: if the parity puncturing pattern is P=[10] or P=[01], then it is impossible to achieve the upper bound on $d_2=d^p_{j,2}+2$ for rate ⅔ codes derived by puncturing rate ½ codes.

The best rate ½ constituent codes with puncturing pattern P=[10] that achieve the largest $d_2$ are given in Table 4.

TABLE 4

Best rate 1/2 punctured constituent codes.

| k | Code generator | | $d_2$ | $d_3$ | $d_{min}$ |
|---|---|---|---|---|---|
| 3 | $g_0 = 7$ | $g_1 = 5$ | 4 | 3 | 3 |
| 4 | $g_0 = 13$ | $g_1 = 15$ | 5 | 4 | 4 |
| 5 | $g_0 = 23$ | $g_1 = 37$ | 7 | 4 | 4 |
|   | $g_0 = 23$ | $g_1 = 31$ | 7 | 4 | 4 |
|   | $g_0 = 23$ | $g_1 = 33$ | 6 | 5 | 5 |
|   | $g_0 = 23$ | $g_1 = 35$ | 6 | 4 | 4 |
|   | $g_0 = 23$ | $g_1 = 27$ | 6 | 4 | 4 |

C. Best Rate 1/n Constituent Codes

As known in the art, for rate 1/n codes, the upper bound for b=1 reduces to:

$$d^p_{j,2} \leq (n-1)(2^{m-1}+2) \quad (12)$$

Based on this condition, we have obtained the best rate ⅓ and ¼ codes without parity repetition, as shown in Tables 5 and 6, where $d_2=d^p_{j,2}=2$ represents the minimum output weight given by weight-2 data sequences. The best non-punctured rate ½ constituent codes have been reported by S. Benedetto et al., supra.

TABLE 5

Best rate 1/3 constituent codes.

| k | Code generator | | | $d_2$ | $d_3$ | $d_{min}$ |
|---|---|---|---|---|---|---|
| 2 | $g_0 = 3$ | $g_1 = 2$ | $g_2 = 1$ | 4 | ∞ | 4 |
| 3 | $g_0 = 7$ | $g_1 = 5$ | $g_2 = 3$ | 8 | 7 | 7 |
| 4 | $g_0 = 13$ | $g_1 = 17$ | $g_2 = 16$ | 14 | 10 | 10 |
| 5 | $g_0 = 23$ | $g_1 = 33$ | $g_2 = 37$ | 22 | 12 | 10 |
|   | $g_0 = 23$ | $g_1 = 25$ | $g_2 = 37$ | 22 | 11 | 11 |

TABLE 6

Best rate 1/4 constituent codes.

| k | Code generator | | | | $d_2$ | $d_3$ | $d_{min}$ |
|---|---|---|---|---|---|---|---|
| 4 | $g_0 = 13$ | $g_1 = 17$ | $g_2 = 15$ | $g_3 = 11$ | 20 | 12 | 12 |
| 5 | $g_0 = 23$ | $g_1 = 35$ | $g_2 = 27$ | $g_3 = 37$ | 32 | 16 | 14 |
|   | $g_0 = 23$ | $g_1 = 33$ | $g_2 = 27$ | $g_3 = 37$ | 32 | 16 | 14 |
|   | $g_0 = 23$ | $g_1 = 35$ | $g_2 = 33$ | $g_3 = 37$ | 32 | 16 | 14 |
|   | $g_0 = 23$ | $g_1 = 33$ | $g_2 = 37$ | $g_3 = 25$ | 32 | 15 | 15 |

General Interleaver Design Considerations

In order to estimate the performance of a code, it is necessary to have information about its minimum distance, weight distribution, or actual code geometry, depending on the accuracy required for the bounds or approximations. The challenge is in finding the pairing of codewords from each individual encoder, induced by a particular set of interleavers. We have found that it is best to avoid joining low-weight codewords from one encoder with low-weight words from the other encoders. In the example of FIG. 2, the component codes have minimum distances 5, 2, and 2. This will produce a worst-case minimum distance of 9 for the overall code. Note that this would be unavoidable if the encoders were not recursive since, in this case, the minimum weight word for all three encoders is generated by the input sequence u=(00 . . . 0000100 . . . 000) with a single "1", which will appear again in the other encoders, for any choice of interleavers. This motivates the use of recursive encoders, where the key ingredient is the recursiveness and not the fact that the encoders are systematic. For this example, the input sequence u=(00 . . . 00100100 . . . 000) generates a low-weight codeword with weight 6 for the first encoder. If the interleavers do not "break" this input pattern, the resulting codeword's weight will be 14. In general, weight-2 sequences with 2+3t zeros separating the 1's would result in a total weight of 14+6t if there were no permutations. By contrast, if the number of zeros between the ones is not of this form, the encoded output is nonterminating until the end of the block, and its encoded weight is very large unless the sequence occurs near the end of the block.

With permutations before the second and third encoders, a weight-2 sequence with its 1's separated by $2+3t_i$ zeros will be permuted into two other weight-2 sequences with 1's separated by $2+3t_i$ zeros, where i=2, 3, and where each $t_i$ is defined as a multiple of ⅓. If any $t_i$ is not an integer, the corresponding encoded output will have a high weight because then the convolutional code output is nonterminating (until the end of the block). If all $t_i$'s are integers, the total encoded weight will be $14+2\Sigma^3_{i=1}t_i$. Thus, one of the considerations in designing the interleaver is to avoid integer triplets ($t_1$, $t_2$, $t_3$) that are simultaneously small in all three components. In fact, it would be nice to design an interleaver to guarantee that the smallest value of $\Sigma^3_{i=1}t_i$ (for integer $t_i$) grows with the block size N.

For comparison, consider the same encoder structure in FIG. 2, except with the roles of $g_a$ and $g_b$ reversed. Now the minimum distances of the three component codes are 5, 3, and 3, producing an overall minimum distance of 11 for the total code without any permutations. This is apparently a better code, but it turns out to be inferior as a turbo code. This paradox is explained by again considering the critical weight-2 data sequences. For this code, weight-2 sequences with $1+2t_i$ zeros separating the two 1's produce self-terminating output and, hence, low-weight encoded words. In the turbo encoder, such sequences will be permuted to have separations $1+2t_i$, where i=2, 3, for the second and third encoders, but each $t_i$ is now defined as a multiple of ½. Now the total encoded weight for integer triplets ($t_1$, $t_2$, $t_3$) is $11+2\Sigma^3_{i=1}t_i$. Notice that this weight grows only half as fast with $\Sigma^3_{i=1}t_i$ as the previously calculated weight for the original code. If $\Sigma^3_{i=1}t_i$ can be made to grow with block size by the proper choice of an interleaver, then clearly it is important to choose component codes that cause the overall weight to grow as fast as possible with the individual separations $t_i$. This consideration outweighs the criterion of selecting component codes that would produce the highest minimum distance if unpermuted.

There are also many weight-n, n=3, 4, 5, . . . , data sequences that produce self-terminating output and, hence, low encoded weight. However, as argued below, these sequences are much more likely to be broken up by random interleavers than the weight-2 sequences and are, therefore, likely to produce nonterminating output from at least one of the encoders. Thus, turbo code structures that would have low minimum distances if unpermuted can still perform well if the low-weight codewords of the component codes are produced by input sequences with weight higher than two.

We briefly examine the issue of whether one or more random interleavers can avoid matching small separations between the 1's of a weight-2 data sequence with equally small separations between the 1's of its permuted version(s). Consider for example a particular weight-2 data sequence (.

... 001001000 ...) which corresponds to a low weight codeword in each of the encoders of FIG. 2. If we randomly select an interleaver of size N, the probability that this sequence will be permuted into another sequence of the same form is roughly 2/N (assuming that N is large, and ignoring minor edge effects). The probability that such an unfortunate pairing happens for at least one possible position of the original sequence within the block size of N, is approximately $1-(1-2/N)^N \approx 1-e^{-2}$. This implies that the minimum distance of a two-code turbo code constructed with a random permutation is not likely to be much higher than the encoded weight of such an unpermuted weight-2 data sequence, e.g., 14 for the code in FIG. 2. (For the worst case permutations, the $d_{min}$, of the code is still 9, but these permutations are highly unlikely if chosen randomly). By contrast, if we use three codes and two different interleavers, the probability that the particular sequence above will be reproduced by both interleavers is only $(2/N)^2$. Now the probability of finding such an unfortunate data sequence somewhere within the block of size N is roughly $1-[1-(2/N)^2]^N \approx 4/N$. Thus it is probable that a three-code turbo code using two random interleavers will see an increase in its minimum distance beyond the encoded weight of an unpermuted weight-2 data sequence. This argument can be extended to account for other weight-2 data sequences which may also produce low weight codewords, e.g., (... 00100(000)$^i$1000 ...), for the code in FIG. 2.

For comparison, consider a weight-3 data sequence such as (... 0011100 ...), which for our example corresponds to the minimum distance of the code (using no permutations). The probability that this sequence is reproduced with one random interleaver is roughly $6/N^2$, and the probability that some sequence of that form is paired with another of the same form is $1-(1-6/N^2)^N \approx 6/N$. Thus, for large block sizes, bad weight-3 data sequences have a small probability of being matched with bad weight-3 permuted data sequences, even in a two-code system.

For a turbo code using q codes and q−1 random interleavers, this probability is even smaller, $1-[1-(6/N)^{q-1}]^N \approx 6/N (6/N^2)^{q-2}$. This implies that the minimum distance codeword of the turbo code in FIG. 2 is more likely to result from a weight-2 data sequence of the form (... 001001000 ...) than from the weight-3 sequence (... 0011100 ...) that produces the minimum distance in the unpermuted version of the same code. Higher weight sequences have an even smaller probability of reproducing themselves after being passed through a random interleaver.

For a turbo code using q codes and q−1 interleavers, the probability that a weight-n data sequence will be reproduced somewhere within the block by all q−1 permutations is of the form $1-[1-(\beta/N^{n-1})^{q-1}]^N$, where $\beta$ is a number that depends on the weight-n data sequence but does not increase with block size N. For large N, this probability is proportional to $(1/N)^{nq-n-q}$, which falls off rapidly with N, when n and q are greater than two. Furthermore, the symmetry of this expression indicates that increasing either the weight of the data sequence n or the number of codes q has roughly the same effect on lowering this probability.

In summary, from the above arguments, we conclude that weight-2 data sequences are an important factor in the design of the component codes, and that higher weight sequences have successively decreasing importance. Also, increasing the number of codes and, correspondingly, the number of interleavers, makes it more and more likely that bad input sequences will be broken up by one or more of the permutations.

The minimum distance is not the most important characteristic of the turbo code, except for its asymptotic performance, at very high $E_b/N_o$. At moderate signal-to-noise ratios (SNRs), the weight distribution for the first several possible weights is necessary to compute the code performance. Estimating the complete weight distribution of these codes for large N and fixed interleavers is still an open problem. However, it is possible to estimate the weight distribution for large N for random interleavers by using probabilistic arguments. For further considerations on the weight distribution, see D. Divsalar and F. Pollara, "Turbo Codes for Deep-Space Communications," *The Telecommunications and Data Acquisition Progress Report* 42–120, October–December 1994, Jet Propulsion Laboratory, Pasadena, Calif., pp. 29–39, Feb. 15, 1995 (hereby incorporated by reference).

Interleaver Design

Figure 3:
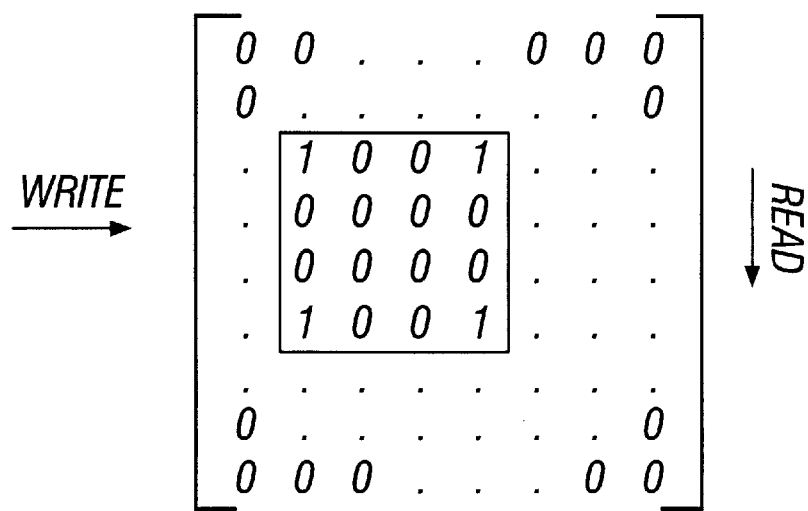
FIG. 3 is a matrix of a weight-4 sequence.

In view of the above discussion, it should be clear that interleavers should be capable of spreading low-weight input sequences so that the resulting codeword has high weight. Block interleavers, defined by a matrix with $v_f$ rows and $v_c$ columns such that $N=v_f \times v_c$, may fail to spread certain sequences. For example, the weight-4 sequence shown in FIG. 3 cannot be broken by a block interleaver. In order to break such sequences, random interleavers are desirable, as discussed above. A method for the design of non-random interleavers is discussed in P. Robertson, "Illuminating the Structure of Code and Decoder of Parallel Concatenated Recursive Systematic (Turbo) Codes, *Proceedings GLOBECOM'94*, San Francisco, Calif., pp. 1298–1303, December 1994 (hereby incorporated by reference).

Block interleavers are effective if the low-weight sequence is confined to a row. If low-weight sequences (which can be regarded as the combination of lower-weight sequences) are confined to several consecutive rows, then the $v_c$ columns of the interleaver should be sent in a specified order to spread as much as possible the low-weight sequence. A method for reordering the columns is given in E. Dunscombe and F. C. Piper, "Optimal interleaving scheme for convolutional codes", *Electronic Letters*, Oct. 26, 1989, Vol. 25, No. 22, pp. 1517–1518 (hereby incorporated by reference). This method guarantees that for any number of columns $v_c=aq+r$, $(r \leq a-1)$, the minimum separation between data entries is q−1, where a is the number of columns affected by a burst. However, as can be observed in the example in FIG. 3, the sequence "1001" will still appear at the input of the encoders for any possible column permutation. Only if we permute the rows of the interleaver in addition to its columns is it possible to break the low-weight sequences. The method in Bahl et al. can be used again for the permutation of rows. Appropriate selection of a and q for rows and columns depends on the particular set of codes used and on the specific low-weight sequences that are to be broken.

We have also designed semi-random permuters (interleavers) by generating random integers i, $1 \leq i \leq N$, without replacement. We define an "S-random" permutation as follows: each randomly selected integer is compared to S previously selected integers. If the current selection is equal to any S previous selections within a distance of ±S, then the current selection is rejected. This process is repeated until all N integers are selected. While the searching time increases with S, we observed that choosing $S<(N/2)^{0.5}$ usually produces a solution in reasonable time. (S=1 results in a purely random interleaver). In simulations, we used S=11 for N=256, and S=31 for N=4096.

The advantage of using three or more constituent codes is that the corresponding two or more interleavers have a better chance to break sequences that were not taken care by another interleaver. The disadvantage is that, for an overall desired code rate, each code must be punctured more, resulting in weaker constituent codes. In our experiments, we have used randomly selected interleavers and interleavers based on the row-column permutation described above. In general, random interleavers and S-random interleavers are good for low SNR operation (e.g., PCS applications requiring $P_b=10^{-3}$), where the overall weight distribution of the code is more important than the minimum distance.

Terminated Parallel Convolutional Codes as Block Codes

Consider the combination of permuter and encoder as a linear block code. Define $P_i$ as the parity matrix of the terminated convolutional code i. Then the overall generator matrix for three parallel codes is $G=[I\ P_1\pi_2P_2\pi_3P_3]$, where $\pi_i$ are the permuters (interleavers). In order to maximize the minimum distance of the code given by G, we should maximize the number of linearly independent columns of the corresponding parity check matrix H. This suggests that the design of $P_i$ (code) and $\pi_i$ (permutation) are closely related, and it does not necessarily follow that optimum component codes (maximum $d_{min}$) yield optimum parallel concatenated codes. For very small N, we used this concept to design jointly the permuter and the component convolutional codes.

Termination

The encoder of FIG. 2 was used to generate an (n(N+M), N) block code, where the M tail bits of code 2 and code 3 are not transmitted. Since the component encoders are recursive, it is not sufficient to set the last M information bits to zero in order to drive the encoder to the all-zero state, i.e., to terminate the trellis. The termination (tail) sequence depends on the state of each component encoder after N bits, which makes it impossible to terminate all component encoders with M predetermined tail bits.

Figure 4:
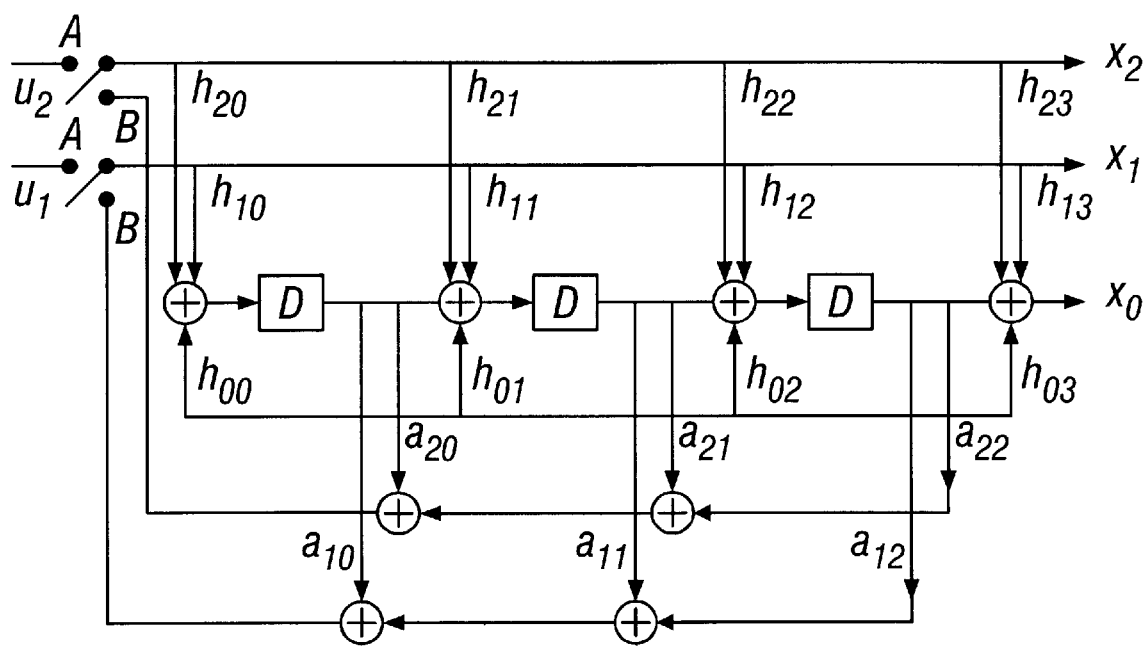
FIG. 4 is a block diagram of an input trellis termination method for turbo code encoders in accordance with the present invention.

FIG. 4 is a block diagram of a general single input coder (the code is not important). However, the inventive termination technique can be applied to b-input coders, where $b \geq 1$. Trellis termination is performed by setting the switches shown in FIG. 4 to position B to permit selective feedback as shown from the taps between delay elements D. The tap coefficients $a_{i,0}, \ldots a_{i,m-1}$ for $i=1,2, \ldots b$ can be obtained by repeated use of the following equation, and by solving the resulting equations:

$$S^k(D) = \left[\sum_{i=1}^{b} u_i^k h_i(D) + DS^{k-1}(D)\right] \bmod h_0(D) \quad (13)$$

where $S^k(D)$ is the state of the encoder at time k with coefficients $S^k_0, S^k_1, \ldots S^k_{m-1}$ for input $u^k_1, \ldots u^k_b$. The trellis can be terminated in state zero with at least m/b and at most m clock cycles. When multiple input bits are used (parallel feedback shift registers), a switch should be used for each input bit.

New Structural Designs

The following further describes several novel structures for turbo code encoders that apply the principals set forth above.

Figure 5:
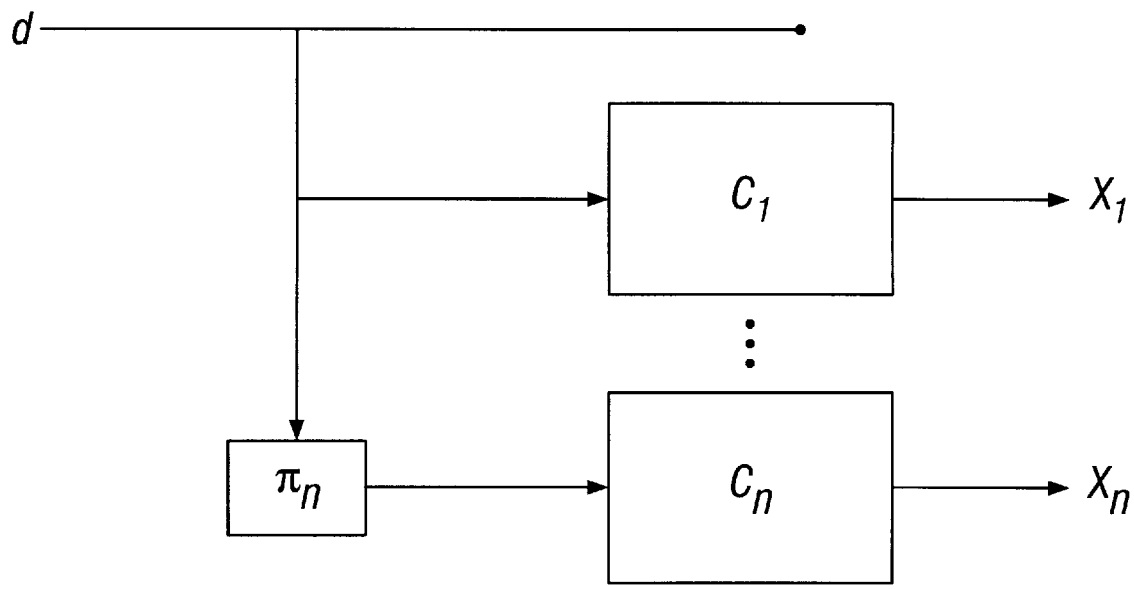
FIG. 5 is a block diagram of a turbo encoder showing output only of encoded parity elements.

FIG. 5 is a block diagram that shows a turbo code encoder having at least two coding modules $C_1$, $C_n$ and at least one interleaver $\pi_n$ for each of the second and subsequent coding modules. Additional coding modules with corresponding interleavers may be added as desired. Notably, this structure outputs only encoded parity elements $X_n$ from the coding modules C—the original data source elements d are not transmitted or stored. The decoder structure described below is capable of reconstructing d only from the received elements Yn corresponding to the encoded elements Xn. The structure shown in FIG. 5 has good performance (i e., low BER for a given SNR), is less complex than the prior art, and permits a simple decoder to be used for C, (see, for example, FIG. 10)

Figure 6A:
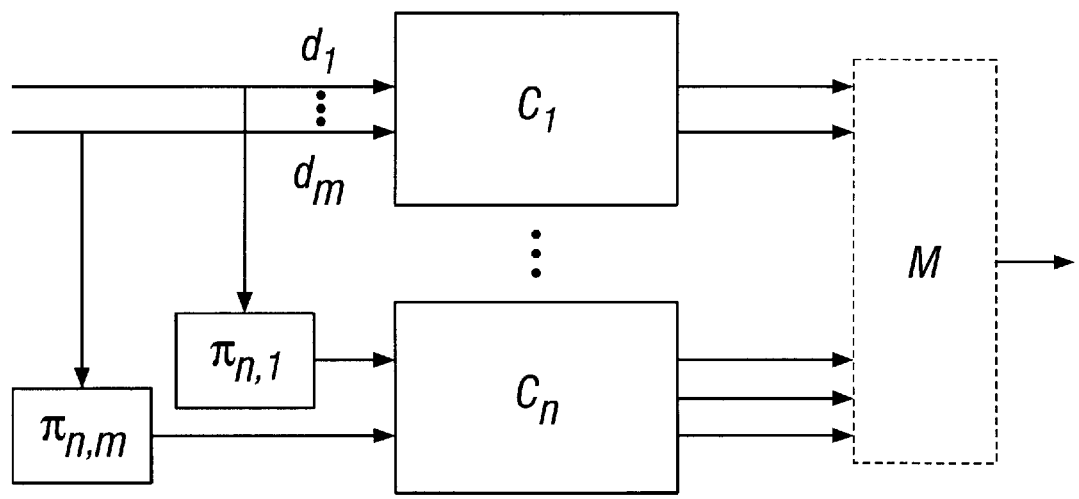
FIG. 6A is a block diagram of a third embodiment of the present invention, showing output of multiple encoded elements derived from multiple input data sources, the use of multiple interleavers on at least one data source, and an optional multilevel trellis-coded modulator.
Figure 9:
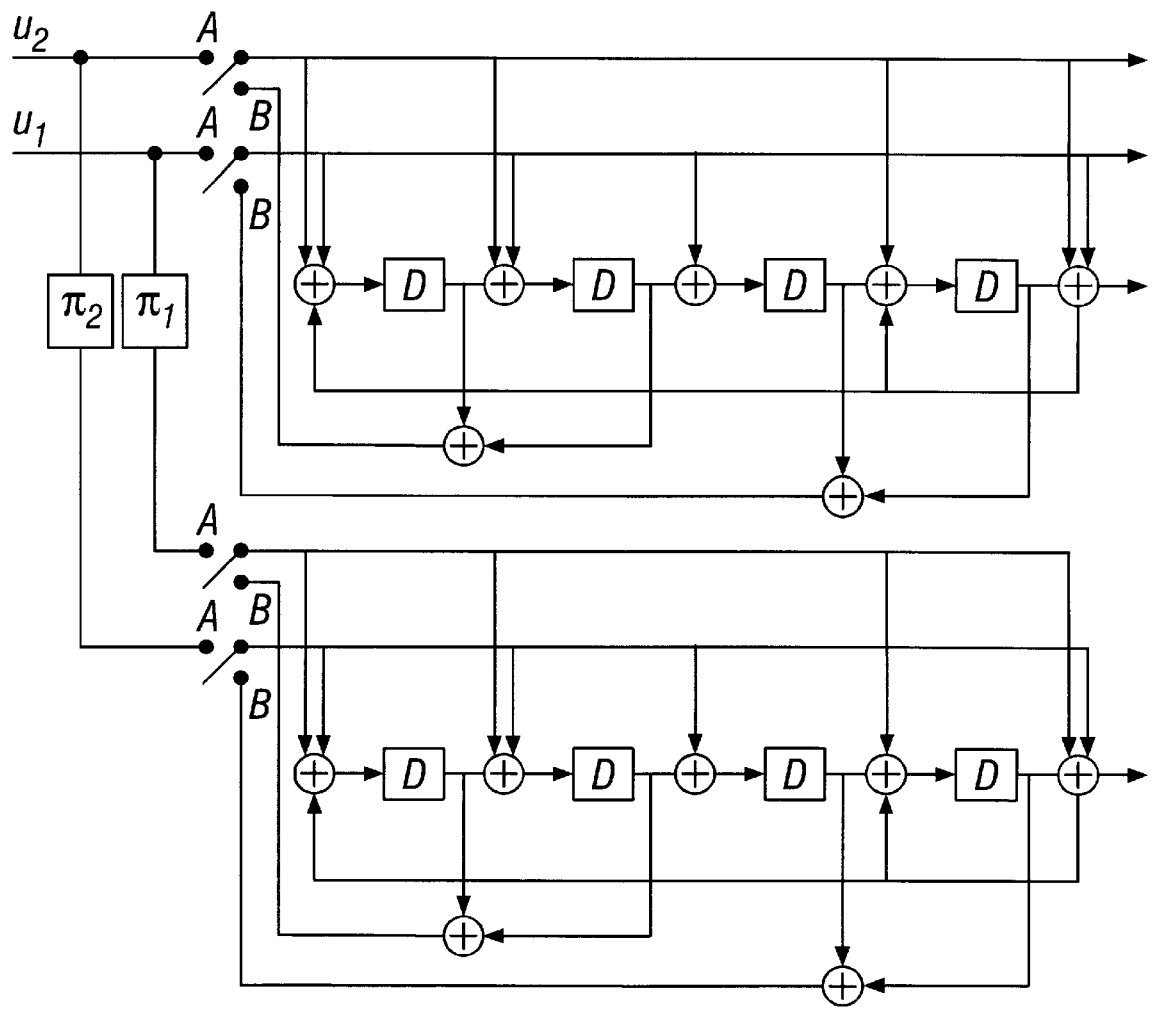
FIG. 9 is a block diagram of a first rate ½ turbo coder in accordance with the present invention.
Figure 21A:
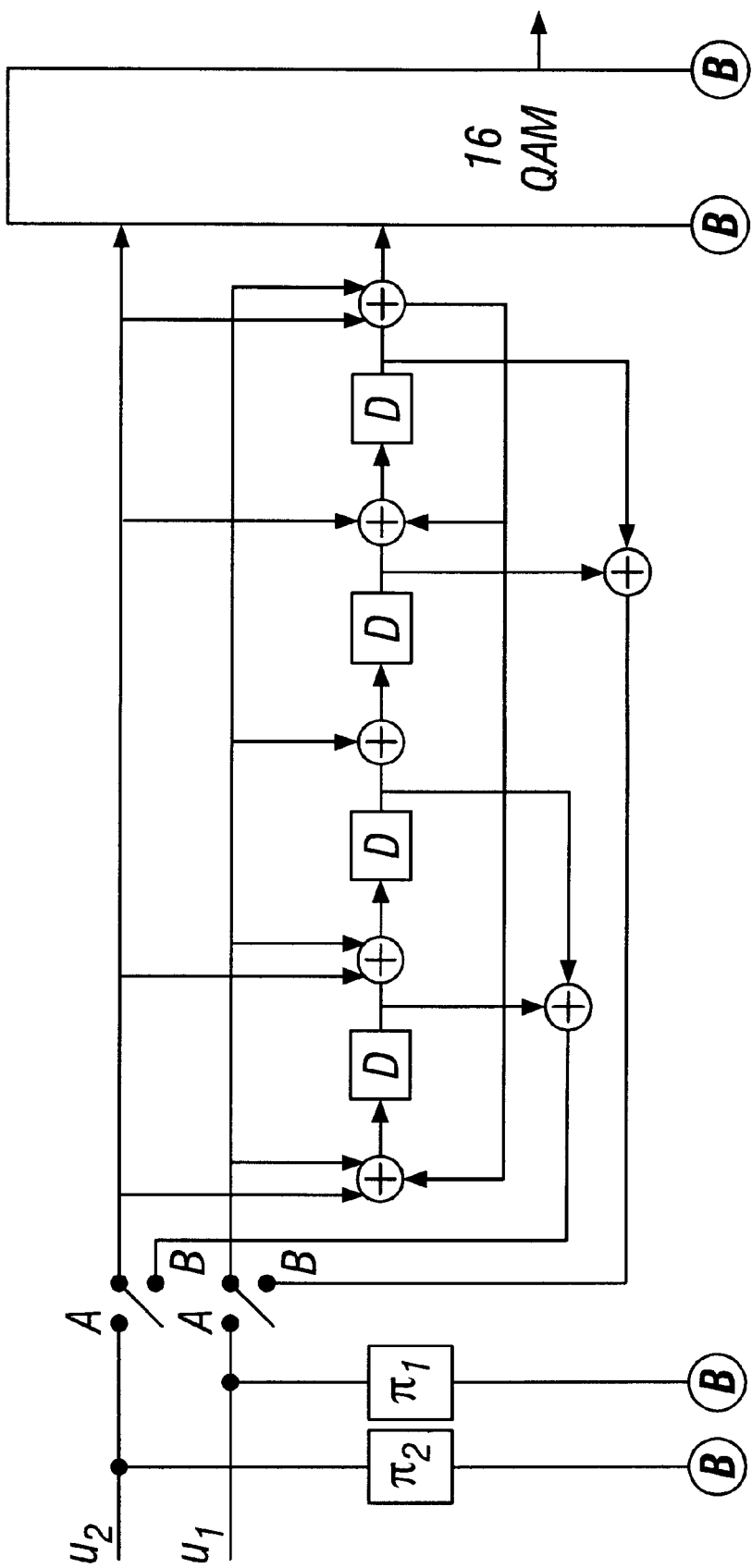
FIG. 21 is a block diagram of a 16 QAM turbo trellis-coded modulation coder in accordance with the present invention.
Figure 21B:
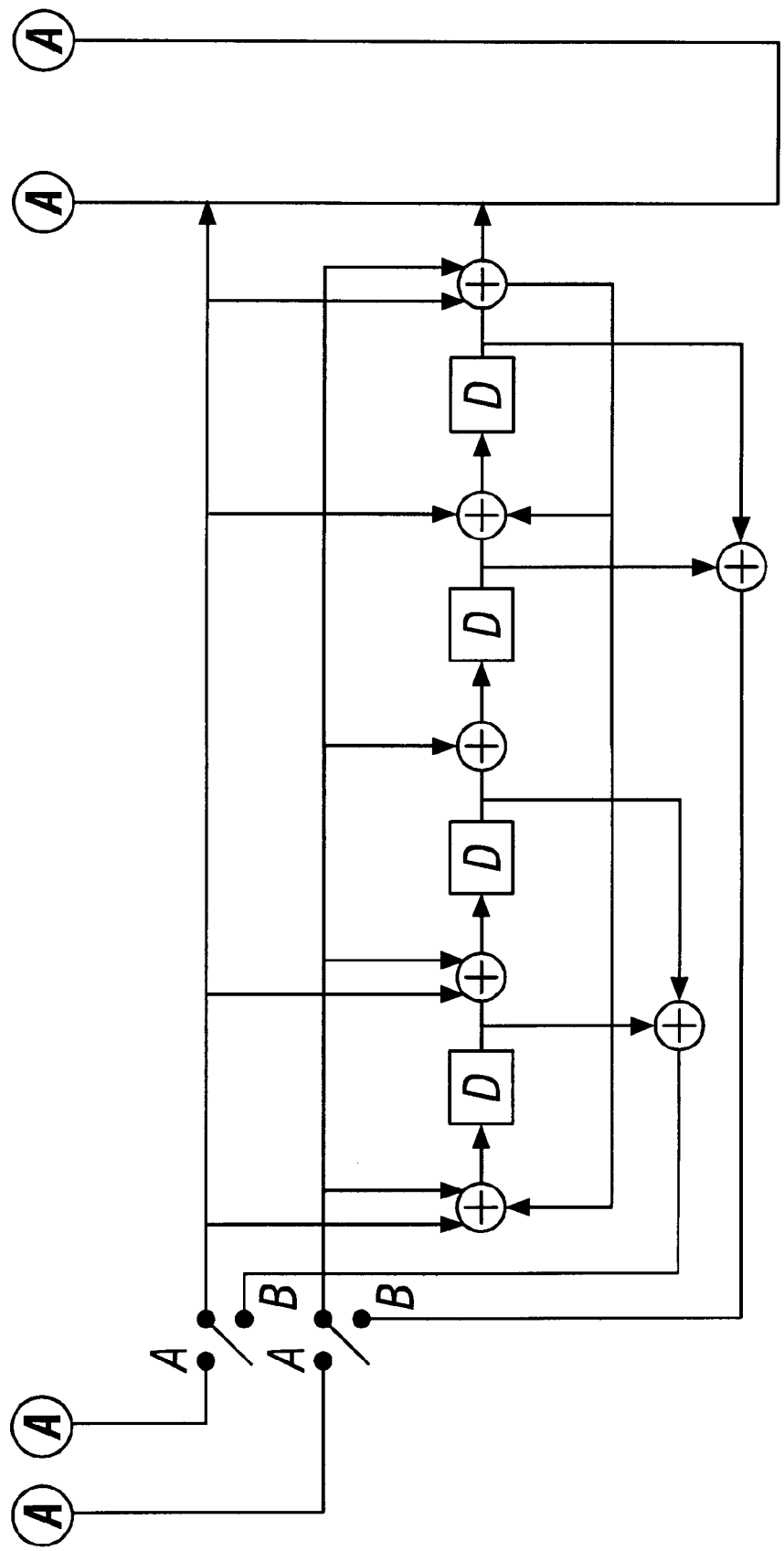

FIG. 6A is a block diagram that shows a turbo code encoder having at least two input data lines $d_1$, $d_m$ coupled as shown to at least two coding modules $C_1$, $C_n$. In addition, each data line is coupled through a corresponding interleaver $\pi_{n,m}$ to each of the second and subsequent coding modules. The codes for each coding module may differ, and the number of outputs from each coder may differ. Further, not all data lines need be applied to all coding modules. Examples of multiple input encoders are shown in FIGS. 9 and 21. Again, additional data lines and coding modules with corresponding interleavers may be added as desired. Also shown in dotted outline is an optional multilevel trellis-coded modulator M described below. The structure shown in FIG. 6 is particularly useful for generating output to a binary modulator (such as shown in FIG. 9) or a multilevel modulator (such as a trellis code modulator as shown in FIG. 21).

FIG. 6B is a block diagram showing a variation of FIG. 6A, in which a turbo code encoder has at least one input data line d coupled as shown to only one coding module C, directly and through at least one interleaver (two, $\pi_1$, and $\pi_2$, are shown by way of illustration). This structure is a self-concatenated coder. Outputs $u_1$ and $u_2$ contribute to the encoding function but need not be transmitted. A decoder for this encoder is shown in FIG. 20D, as described below.

FIG. 6B2 is a block diagram showing a variation of a self-concatenated code, where the encoder has at least one input data line d, and d is sent to the modulator. Each incoming bit of d is repeated m times, multiplexed and interleaved to generate the data line u which enters the systematic recursive convolutional code C. Systematic bits at the output of C are not transmitted. Only the parity bits or a punctured version of them are used at the output of C.

Figure 6C:
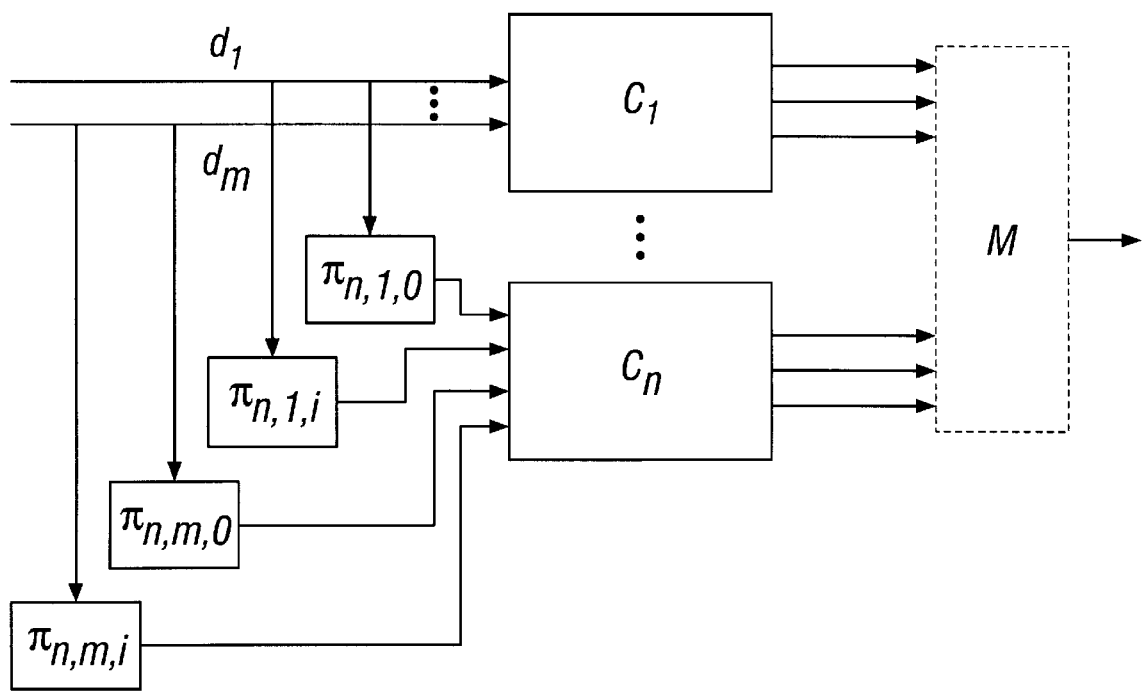
FIG. 6C is a block diagram of a fourth embodiment of the present invention, showing output of multiple encoded elements derived from multiple input data sources, the use of multiple interleavers on at least one data source, and an optional multilevel trellis-coded modulator.

FIG. 6C is a block diagram that shows a turbo code encoder having at least two input data lines $d_1$, $d_m$ coupled as shown to at least two coding modules $C_1$, $C_n$. In addition, each data line is coupled through a plurality of corresponding interleavers $\pi_{n,1,0}$, $\pi_{n,m1}$ to each of the second and subsequent coding modules. The number of interleavers per coding module need not be the same, and the codes for each coding module may differ. Again, additional data lines and coding modules with corresponding sets of interleavers may be added as desired. Also shown in dotted outline is an optional multilevel trellis-coded modulator M described below. The structure shown in FIG. 6C is particularly useful for generating output to a binary modulator (such as shown in FIG. 9) or a multilevel modulator (such as a trellis code modulator as shown in FIG. 21). It also generates a more random encoding of input data than the structure shown in FIG. 6A, thus generally providing good performance (i.e., a lower bit error rate for a particular signal to noise ratio).

Figure 7A:
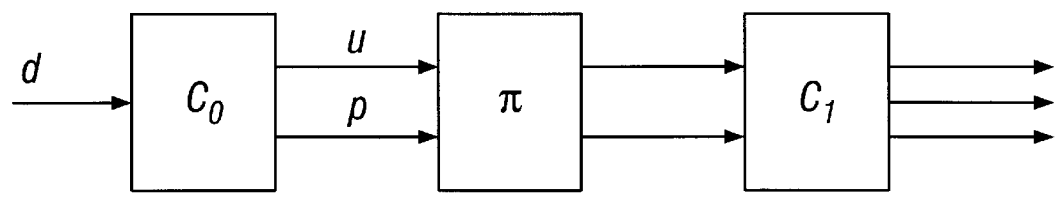
FIG. 7A is a block diagram of a serial encoder in accordance with the present invention.

FIG. 7A is a block diagram of a serial encoder in accordance with the present invention. At least one data stream d is passed through at least one "pre" coder $C_0$ to generate a stream of coded bits (coded bits u and p are shown by way of illustration), which are applied to at least one permuter $\pi$, the output of which is applied to at least one "post" coder $C_1$. If desired, the permuter $\pi$ can be constructed from multiple parallel permuters. Preliminary data indicates good performance for this structure. If the encoder $C_1$ is a systematic recursive convolutional code, the "pre-"coder $C_0$ can be non-systematic or systematic, but not necessarily recursive. Both $C_0$ and $C_1$ can be punctured to adjust the overall code rate. A decoder for this encoder is shown in FIG. 20E, as described below.

Figure 7B:
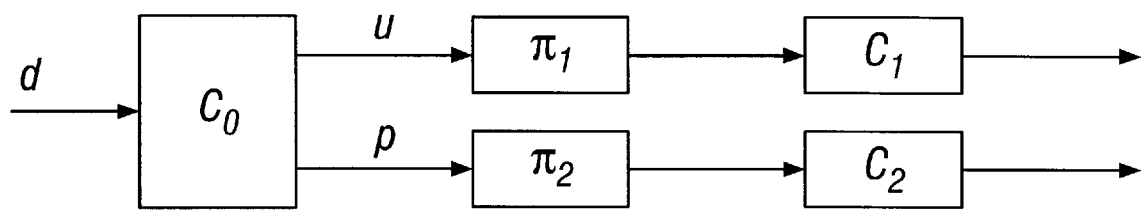
FIG. 7B is a block diagram of a parallel-serial encoder in accordance with the present invention.

FIG. 7B is a block diagram of a parallel-serial encoder in accordance with the present invention. At least one data stream d is passed through a first coder $C_0$ to generate at least one stream of code bits (Coded bits u and p are shown by way of illustration; note that both u and p are preferred to be identical steams, u=p in FIG. 7B), which are applied to respective at least two permuters $\pi_1$ and $\pi_2$. The output of the permuters is applied to at least two separate coders $C_1$, $C_2$, as shown. Preliminary data indicates good performance for this structure if u and p are identical coded streams. A decoder for this encoder is shown in FIG. 20F, as described below.

Figure 7C:
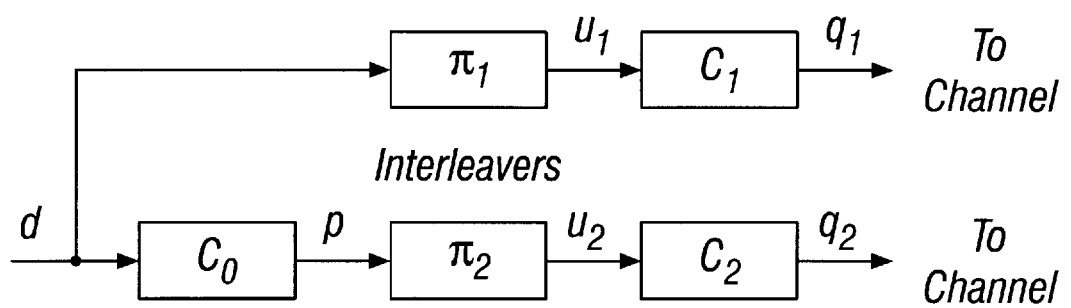
FIG. 7C is a block diagram of a serial-parallel hybrid encoder in accordance with the present invention.

FIG. 7C is a block diagram of a serial-parallel hybrid encoder in accordance with the present invention. At least one data stream d is passed through a first coder $C_0$ to generate at least one stream p of coded bits, which are applied to permuter $\pi_2$. The output of permuter $\pi_2$ (denoted as $u_2$) is applied to coder $C_2$, producing coded output $q_2$. The input data stream d is also permuted by permuter $\pi_1$, producing the output denoted as $u_1$. Signal $u_1$ is applied to coder $C_1$, producing coded output $q_1$.

It should be noted that the structures shown in FIGS. 5–7 are general in nature, and provide advantages independent of specific interleavers and coders. Additional advantages are provided if those coders connected to modulation or channels and preceded by an interleaver produce high output weight for input weight one. This can be achieved, for example, with recursive convolutional codes.

Performance and Simulation Results

The following sets forth results from applying the principals set forth above.

A. Performance of Various Rate Codes

Figure 8:
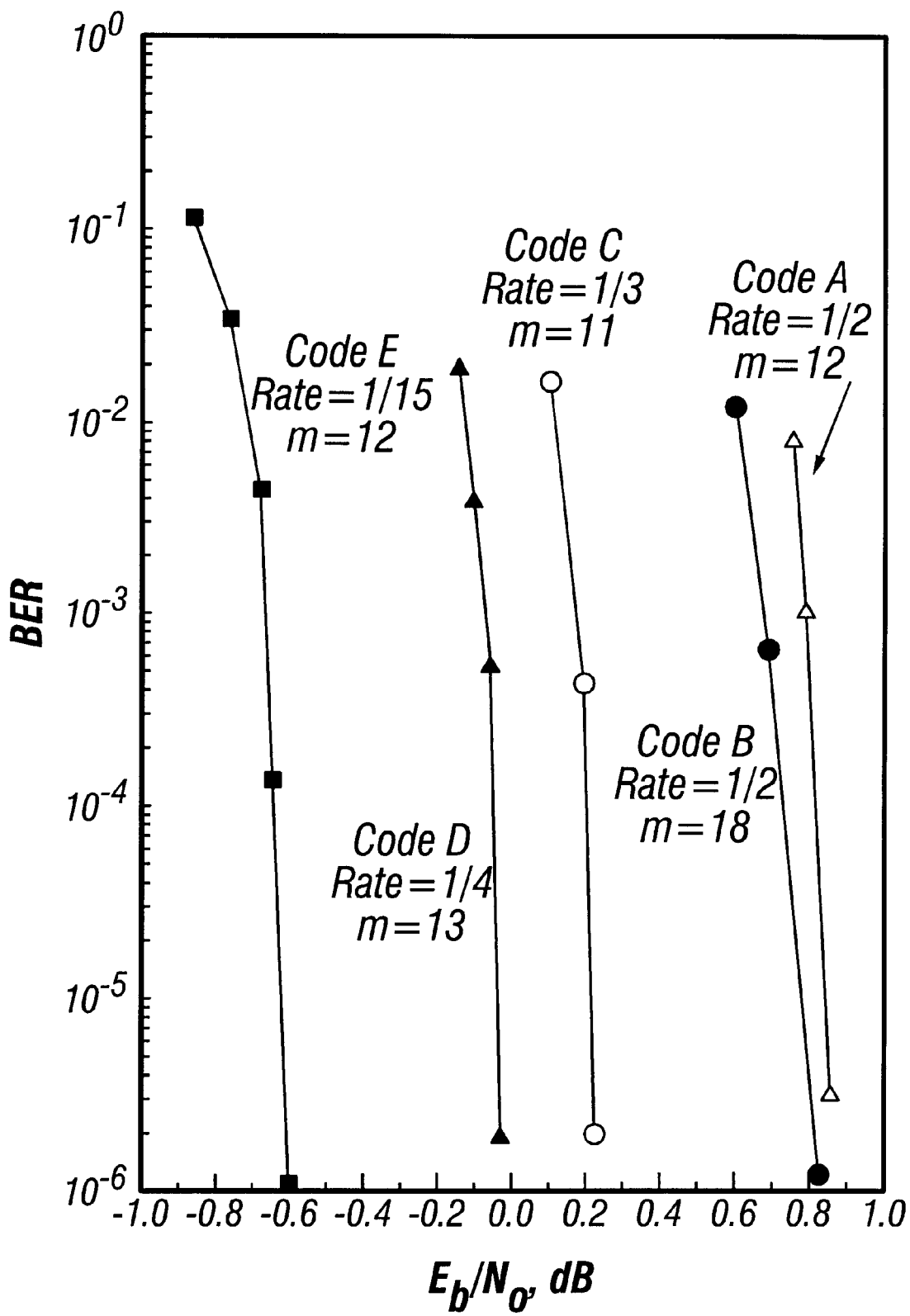
FIG. 8 is a diagram showing the performance of various turbo codes.
Figure 10:
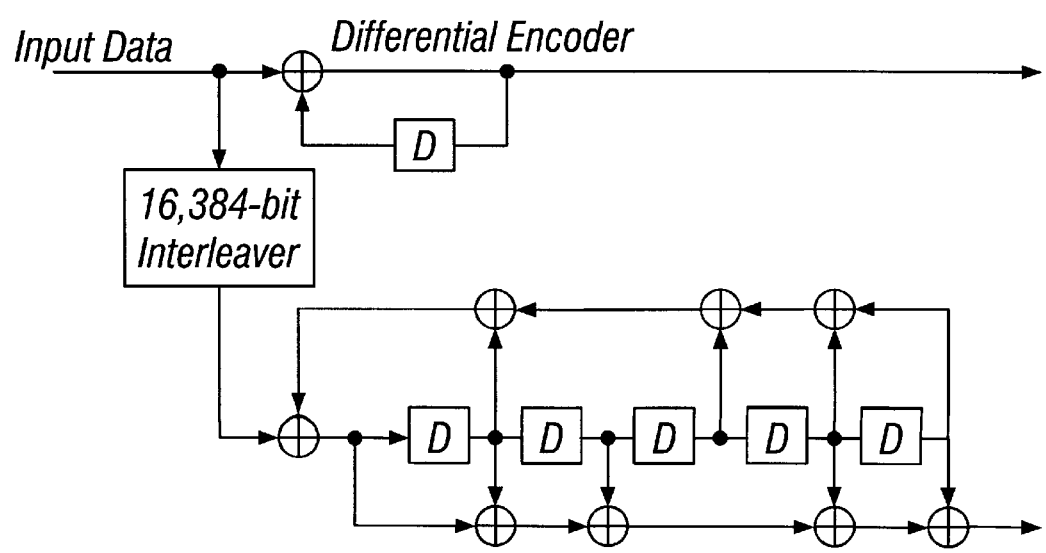
FIG. 10 is a block diagram of a second rate ½ turbo coder in accordance with the present invention.

FIG. 8 shows the performance of turbo codes with m iterations and an interleaver size of N=16,384. The following codes are used as examples:

(1) Rate ½ Turbo Codes.
  Code A: Two 16-state, rate ⅔ constituent codes are used to construct a rate ½ turbo code as shown in FIG. 9. The (worst-case) minimum codeword weights, $d_i$, corresponding to a weight-i input sequence for this code, are $d_{ef}=14$, $d_3=7$, $d_4=8$, $d_5=5=d_{min}$, and $d_6=6$.
  Code B: A rate ½ turbo code also was constructed by using a differential encoder and a 32-state, rate ½ code, as shown in FIG. 10. This is an example where the systematic (information) bits applied to both encoders are not transmitted. The (worst-case) minimum codeword weights, $d_i$, corresponding to a weight-i input sequence for this code, are $d_{ef}=19$, $d_4=6=d_{min}$, $d_6=9$, $d_8=8$, and $d_{10}=11$. The output weights for odd i are large.

Figure 11:
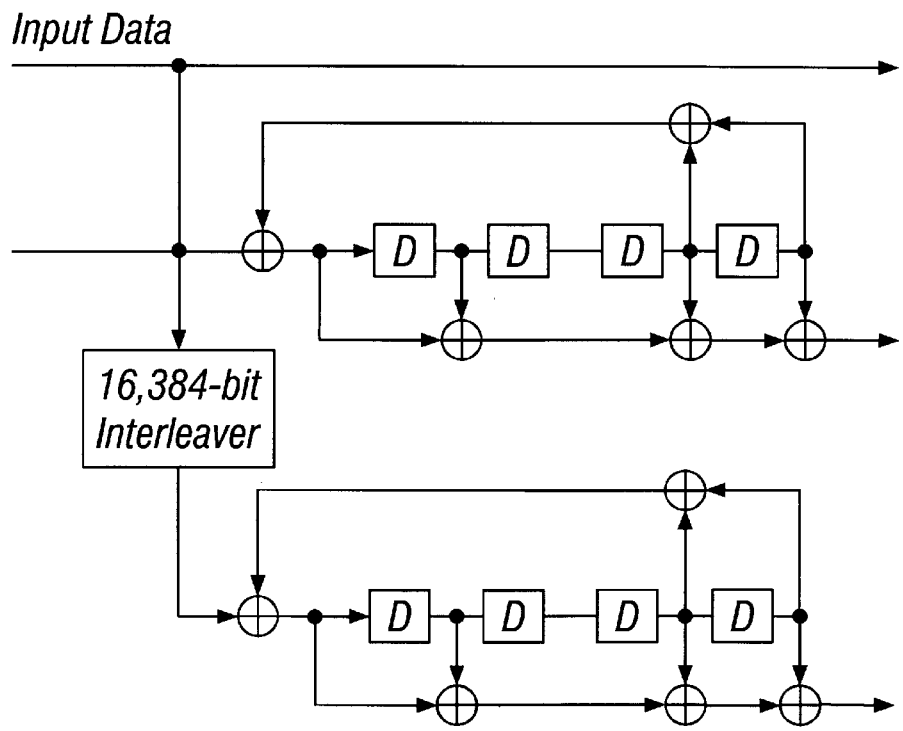
FIG. 11 is a block diagram of a rate ⅓ turbo coder in accordance with the present invention.

(2) Rate ⅓ Turbo Code.
  Code C: Two 16-state, rate ½ constituent codes are used to construct a rate ⅓ turbo code as shown in FIG. 11. The (worst-case) minimum codeword weights, $d_i$, corresponding to a weight-i input sequence for this code, are $d_{ef}=22$, $d_3=11$, $d_4=12$, $d_5=9=d_{min}$, $d_6=14$, and $d_7=15$.

Figure 12:
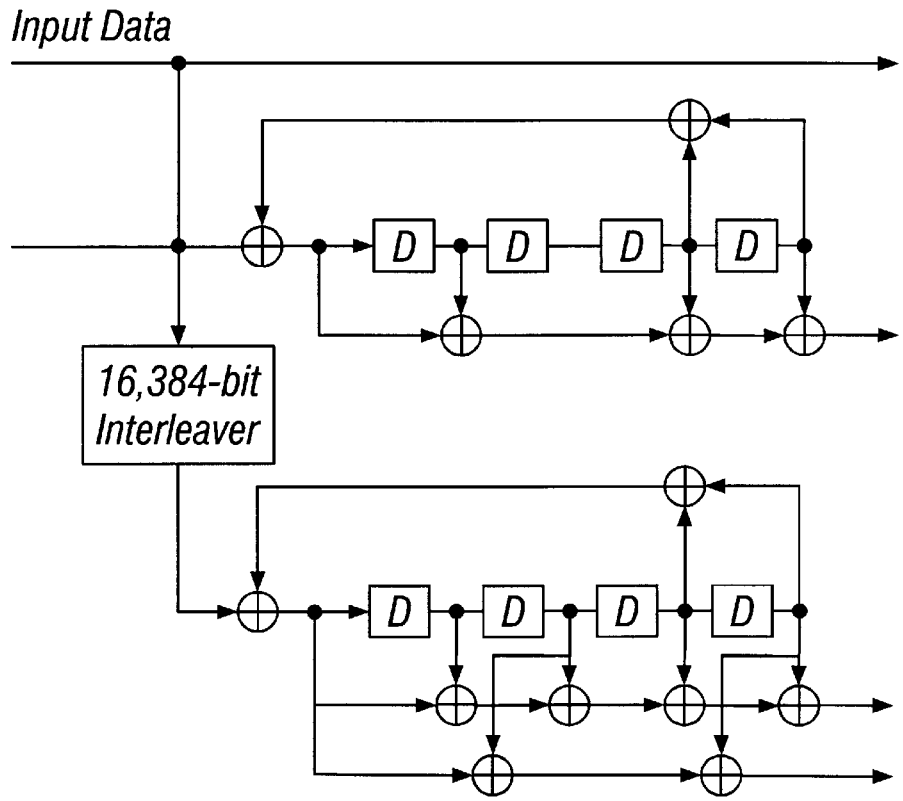
FIG. 12 is a block diagram of a rate ¼ turbo coder in accordance with the present invention.

(3) Rate ¼ Turbo Code.
  Code D: Two 16-state, rate ½ and rate ⅓ constituent codes are used to construct a rate ¼ turbo code, as shown in FIG. 12, with $d_{ef}=32$, $d_3=15=d_{min}$, $d_4=16$, $d_5=17$, $d_6=16$, and $d_7=19$.

(4) Rate ¹⁄₁₅ Turbo Code
  Code E: Two 16-state, rate ⅛ constituent codes are used to construct a rate ¹⁄₁₅ turbo code, $(1, g_1/g_0, g_2/g_0, g_3/g_0,$ $g_4/g_0, g_5/g_0, g_6/g_0, g_7/g_0)$ and $(g_1/g_0, g_2/g_0, g_3/g_0, g_4/g_0,$ $g_5/g_0, g_6/g_0, g_7/g_0)$, with $g_0=(23)_{octal}$, $g_1=(21)_{octal}$, $g_2=(25)_{octal}$, $g_3=(27)_{octal}$, $g_4=(31)_{octal}$, $g_5=(33)_{octal}$, $g_6=(35)_{octal}$, and $g_7=(37)_{octal}$. The (worst-case) minimum codeword weights, $d_i$, corresponding to a weight i input sequence for this code are $d_{ef}=142$, $d_3=39=d_{min}$, $d_4=48$, $d_5=45$, $d_6=50$, and $d_7=63$.

B. Performance of Two Codes

Figure 13:
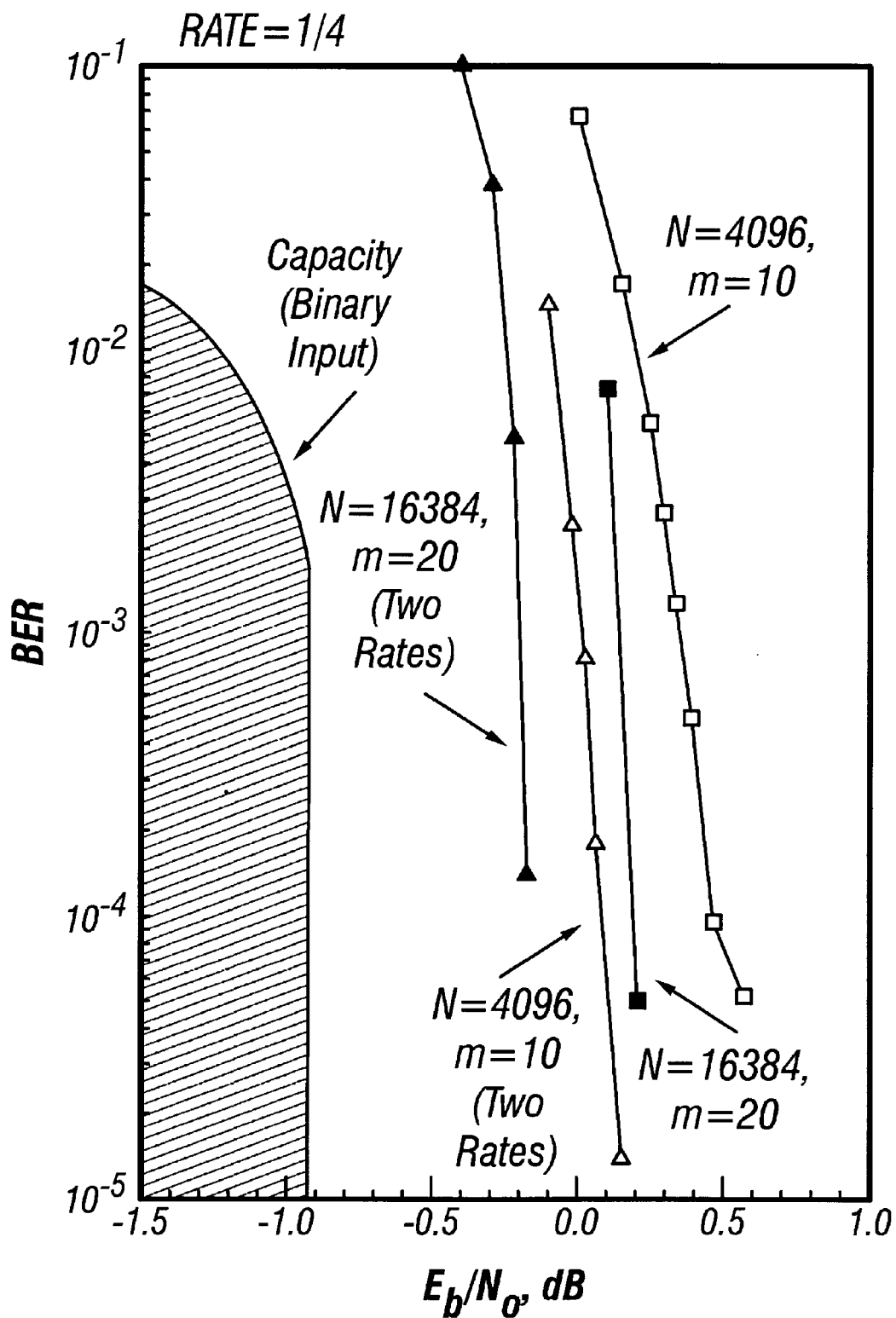
FIG. 13 is a diagram showing the performance of various rate ¼ turbo codes.

The performance obtained by turbo decoding the code with two constituent codes $(1, g_b/g_a)$, where $g_a=(37)_{octal}$ and $g_b=(21)_{octal}$, and with random permutations of lengths N=4096 and N=16,384 is compared in FIG. 13 to the capacity of a binary-input Gaussian channel for rate r=¼. The best performance curve is approximately 0.7 dB from the Shannon limit at BER=$10^{-4}$.

C. Unequal Rate Encoders

Figure 14:
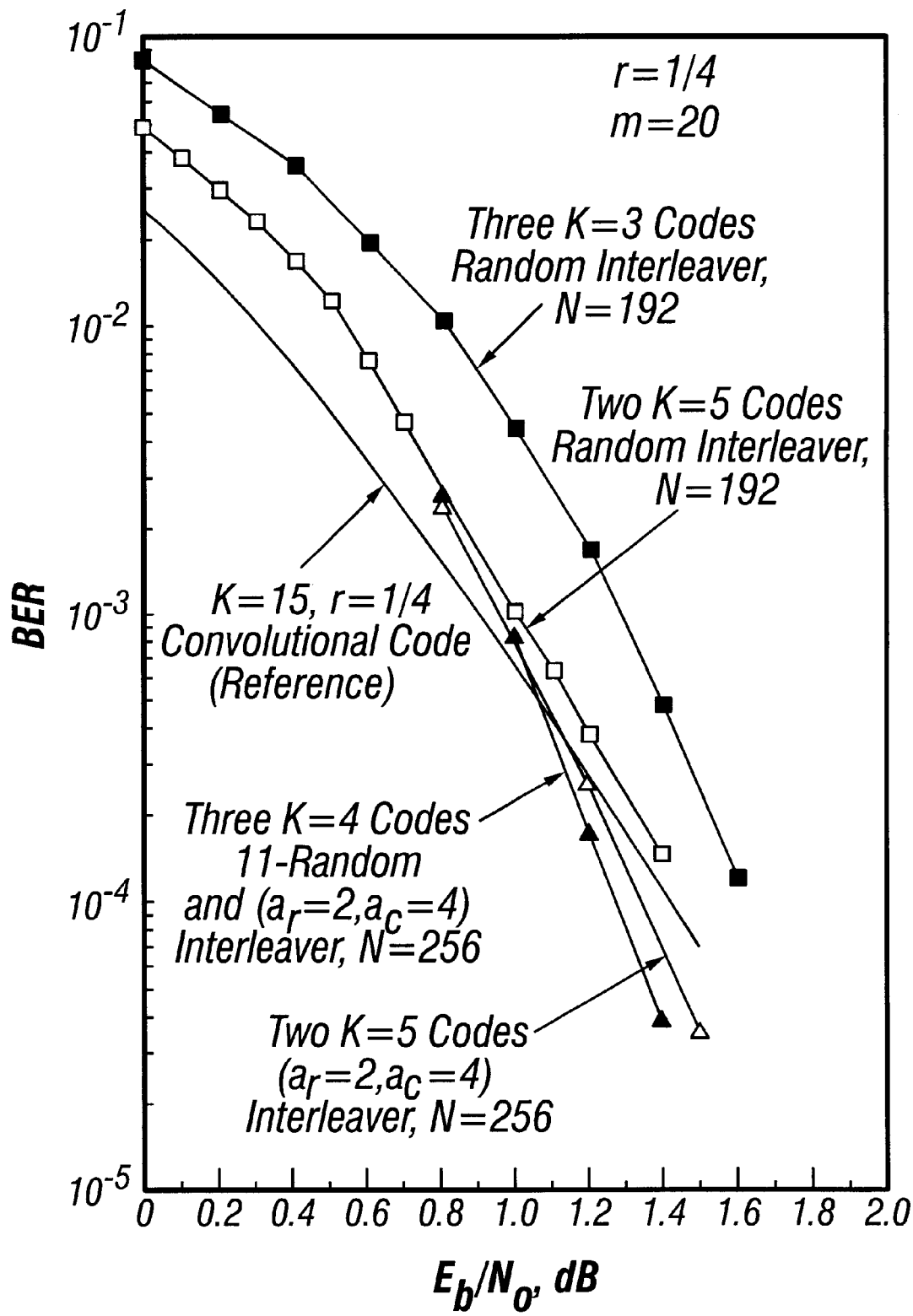
FIG. 14 is a diagram showing the performance of various turbo codes with short block sizes.

We now extend the results to encoders with unequal rates with two K=5 constituent codes $(1, g_b/g_a, g_c/g_a)$ and $(g_b/g_a)$, where $g_a=(37)_{octal}$, $g_b=(33)_{octal}$ and $g_c=(25)_{octal}$. This structure improves the performance of the overall, rate ¼, code, as shown in FIG. 13. This improvement is due to the fact that we can avoid using the interleaved information data at the second encoder and that the rate of the first code is lower than that of the second code. For PCS applications, for example, short interleavers should be used, since the vocoder frame is usually 20 ms. Therefore we selected 192 bit and 256 bit interleavers as an example, corresponding to 9.6 and 13 Kbps. (Note that this small difference of interleaver size does not affect significantly the performance). The performance of codes with short interleavers is shown in FIG. 14 for the K=5 codes described above for random permutation and row-column permutation with a=2 for rows and a=4 for columns.

D. Performance of Three Codes

Figure 15:
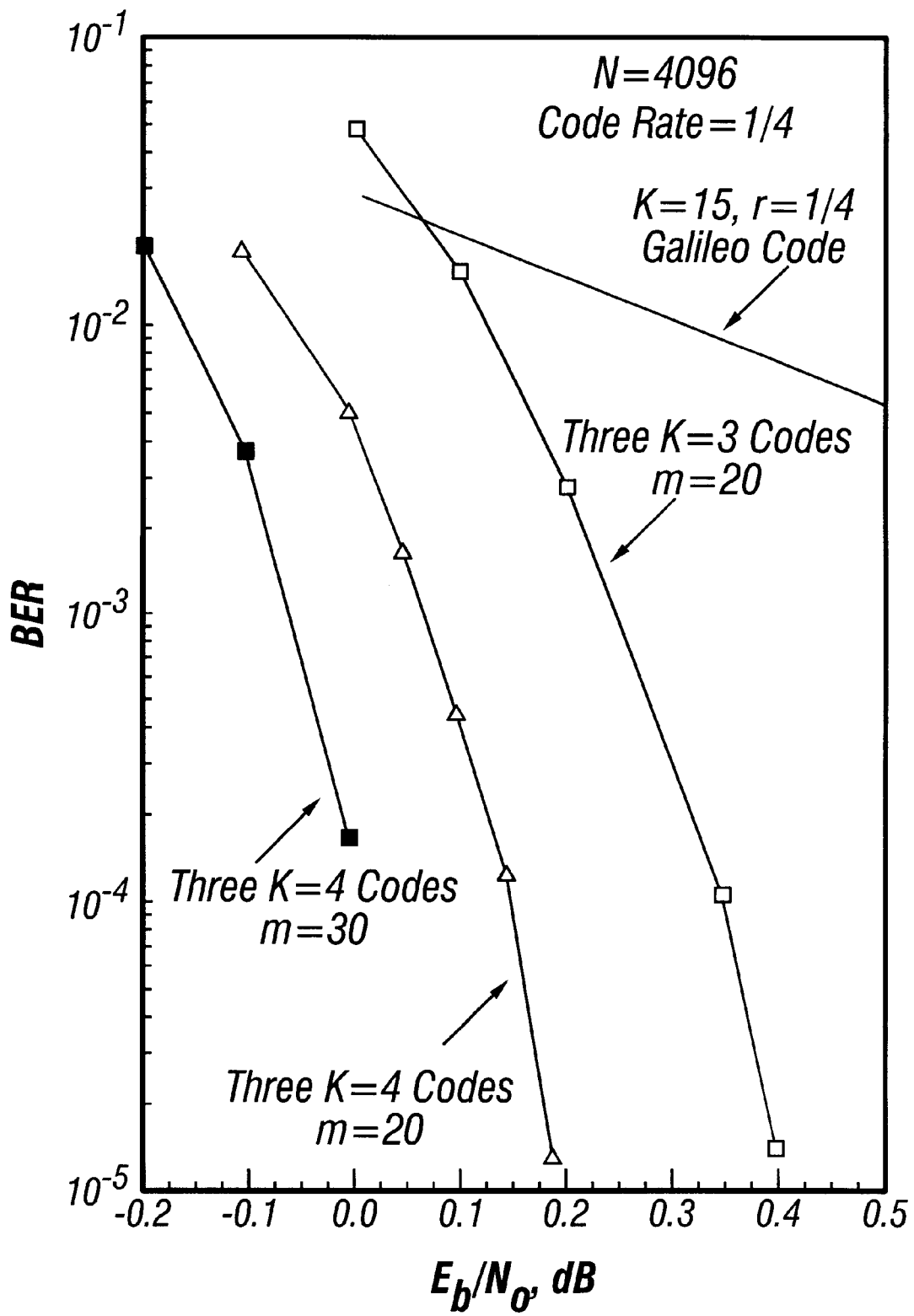
FIG. 15 is a diagram showing the performance of various three code turbo codes.

The performance of two different three-code turbo codes with random interleavers is shown in FIG. 15 for N=4096. The first code uses three recursive codes shown in FIG. 2 with constraint length K=3. The second code uses three recursive codes with K=4, $g_a=(13)_{octal}$, and $g_b=(11)_{octal}$. Note that the nonsystematic version of the second encoder is catastrophic, but the recursive systematic version is non-catastrophic. We found that this K=4 code has better performance than several others.

The performance of the K=4 code was improved by going from 20 to 30 iterations. We found that the performance could also be improved by using an S-random interleaver with S=31. For shorter blocks (192 and 256 bits), the results are shown in FIG. 14, where it can be observed that approximately 1 dB SNR is required for BER=$10^{-3}$, which implies, for example, a CDMA capacity C=0.8η. We have noticed that the slope of the BER curve changes around BER=$10^{-5}$ (flattening effect) if the interleaver is not designed properly to maximize $d_{min}$ or is chosen at random.

Turbo Code Decoders

Figure 16:
FIG. 16 is a block diagram of a prior art decoder structure.

The turbo decoding configuration proposed by Berrou for two codes is shown schematically in FIG. 16. This configuration operates in serial mode, i.e., decoder DEC1 processes data before decoder DEC2 starts operation, and so on. However, we show below an improved decoder configuration and its associated decoding rule based upon a parallel structure for three or more codes.

Figure 17:
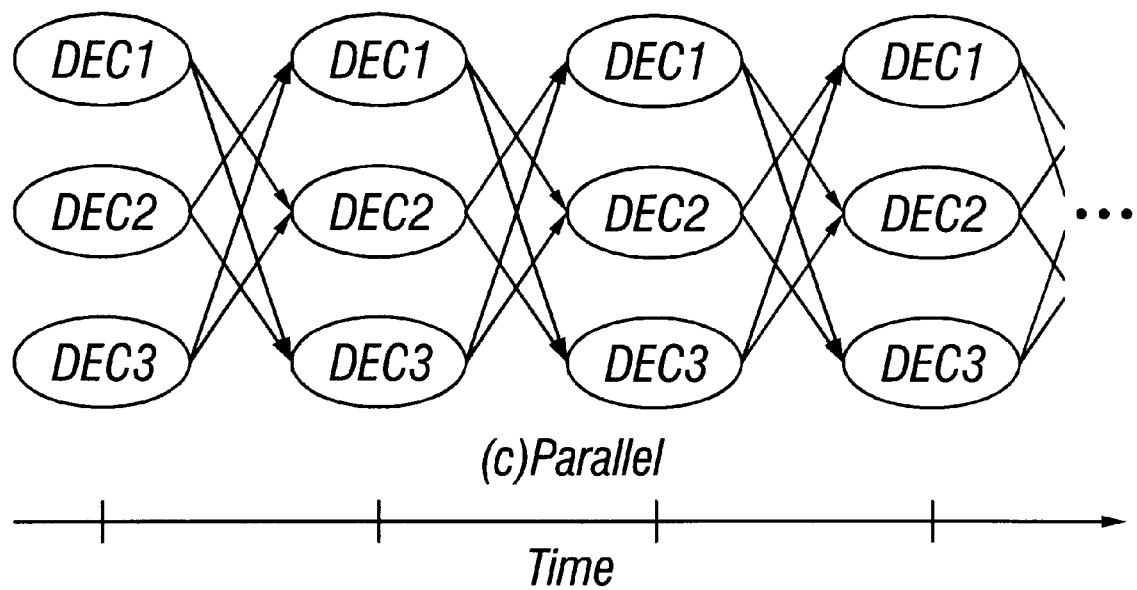
FIG. 17 is a block diagram of a parallel decoder structure in accordance with the present invention.

FIG. 17 is a block diagram of a parallel decoder structure in accordance with the present invention. Decoder DEC1 processes data in parallel with decoders DEC2 and DEC3, and each passes output to the other decoders at each of a plurality of stages, as shown. Self loops are not allowed in these structures since they cause degradation or divergence in the decoding process (positive feedback).

We have determined that the parallel structure shown in FIG. 17 has better performance than the prior art series decoder. To demonstrate this, let $u_k$ be a binary random variable taking values in $\{0,1\}$, representing the sequence of information bits $u=(u_1, \ldots, u_N)$. The MAP (maximum a posteriori) probability algorithm described by Bahl et al., supra, provides the log likelihood ratio $L_k$, given the received symbols y:

$$L_k = \log \frac{P(u_k = 1 \mid y)}{P(u_k = 0 \mid y)} \tag{14}$$

$$= \log \sum_{u:u_k=1} \frac{P(y \mid u) \prod_{j \neq k} P(u_j)}{\sum_{u:u_k=0} P(y \mid u) \prod_{j \neq k} P(u_j)} + \log \frac{P(u_k = 1)}{P(u_k = 0)} \tag{15}$$

For efficient computation of Eq. (2) when the a priori probabilities $P(u_j)$ are nonuniform, the modified MAP algorithm in J. Hagenauer and P. Robertson, "Iterative (Turbo) Decoding of Systematic Convolutional Codes With the MAP and SOVA Algorithms," *Proc. of the ITG Conference on Source and Channel Coding* (Frankfurt, Germany, October 1994) is simpler to use. Therefore, we use the modified MAP algorithm.

If the rate b/n constituent code is not equivalent to a punctured rate 1/n' code or if turbo trellis coded modulation is used, we can first use the symbol MAP algorithm to compute the log-likelihood ratio of a symbol $u=u_1, u_2, \ldots, u_b$ given the observation y as:

$$\lambda(u) = \log \frac{P(u \mid y)}{P(0 \mid y)} \tag{16}$$

where 0 corresponds to the all-zero symbol. Then we obtain the log-likelihood ratios of the jth bit within the symbol by:

$$L(u_j) = \log \frac{\sum_{u:u_j=1} e^{\lambda(u)}}{\sum_{u:u_j=0} e^{\lambda(u)}} + \prod_{k=1}^{b} P(u_k) \tag{17}$$

In this way, the turbo decoder operates on bits and bit interleaving, rather than symbol interleaving, is used.

Figure 18:
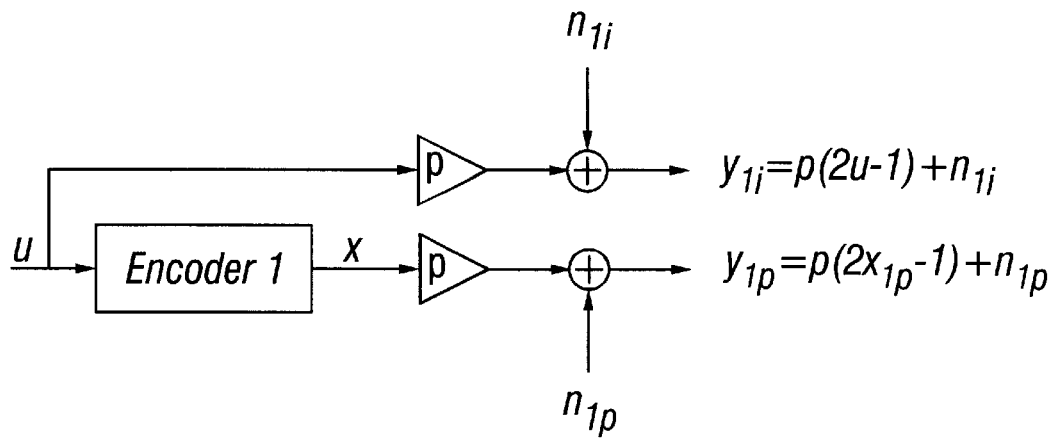
FIG. 18 is a block diagram of a channel model.

FIG. 18 is a block diagram of a channel model, where the $n_{ik}$'s and $n_{pk}$'s are independent identically distributed (i.i.d.) zero-mean Gaussian random variables with unit variance, $\rho = (2rE_b/N_o)^{0.5}$ is the signal to noise ratio, and r is the code rate. The same model is used for each encoder. To explain the basic decoding concept, we restrict ourselves to three codes, but extension to several codes is straightforward. In order to simplify the notation, consider the combination of permuter and encoder as a block code with input u and outputs $x_i$, $i=0, 1, 2, 3$ ($x_0=u$), and the corresponding received sequences $y_i$, $i=0, 1, 2, 3$. The optimum bit decision metric on each bit is (for data with uniform a priori probabilities):

$$L_k = \log \sum_{u:u_k=1} \frac{P(y_0 \mid u)P(y_1 \mid u)P(y_2 \mid u)P(y_3 \mid u)}{\sum_{u:u_k=0} P(y_0 \mid u)P(y_1 \mid u)P(y_2 \mid u)P(y_3 \mid u)} \tag{18}$$

In practice, we cannot compute Eq. (5) for large N because the permutations $\pi_2$, $\pi_3$ imply that $Y_2$ and $y_3$ are no longer simple convolutional encodings of u. Suppose that we evaluate $P(y_i \mid u)$, $i=2, 3$ in Eq. (5) using Bayes' rule and using the following approximation:

$$P(u \mid y_i) \approx \prod_{k=1}^{N} \tilde{P}_i(u_k) \tag{19}$$

Note that $P(u \mid y_i)$ is not separable in general. However, for $i=0$, $P(u \mid y_i)$ is separable; hence, Eq. (6) holds with equality. If such an approximation can be obtained, we can use it in Eq. (5) for $i=2$ and $i=3$ (by Bayes' rule) to complete the algorithm. A reasonable criterion for this approximation is to choose the right-hand term of Eq. 6 such that it minimizes the Kullback distance or free energy. Define $\tilde{L}_{ik}$ by:

$$\tilde{P}_i(u_k) = \frac{e^{u_k \tilde{L}_{ik}}}{1 + e^{\tilde{L}_{ik}}} \tag{20}$$

where $u_k \in \{0,1\}$. Then the Kullback distance is given by:

$$F(\tilde{L}_i) = \sum_u \frac{e^{\sum_{k=1}^{N} u_k \tilde{L}_{ik}}}{\prod_{k=1}^{N}(1 + e^{\tilde{L}_{ik}})} \log \frac{e^{\sum_{k=1}^{N} u_k \tilde{L}_{ik}}}{\prod_{k=1}^{N}(1 + e^{\tilde{L}_{ik}}) P(u \mid y_i)} \tag{21}$$

Minimizing Eq. 8 involves forward and backward recursions analogous to the MAP decoding algorithm. Instead of using Eq. (8) to obtain $\{\tilde{P}_i\}$, or equivalently $\{\tilde{L}_{ik}\}$, we use Eqs. (6) and (7) for $i = 0, 2, 3$ (by Bayes' rule) to express Eq. (5) as:

$$L_k = f(y_1, \tilde{L}_0, \tilde{L}_2, \tilde{L}_3, k) + \tilde{L}_{0k} + \tilde{L}_{2k} + \tilde{L}_{3k} \tag{22}$$

where $\tilde{L}_{0k} = 2\rho y_{0k}$ (for binary modulation) and:

$$f(y_1, \tilde{L}_0, \tilde{L}_2, \tilde{L}_3, k) = \log \frac{\sum_{u:u_k=1} P(y_1 \mid u) \prod_{j \neq k} e^{u_j(\tilde{L}_{0j}+\tilde{L}_{2j}+\tilde{L}_{3j})}}{\sum_{u:u_k=0} P(y_1 \mid u) \prod_{j \neq k} e^{u_j(\tilde{L}_{0j}+\tilde{L}_{2j}+\tilde{L}_{3j})}} \tag{23}$$

We can use Eqs. (6) and (7) again, but this time for $i=0, 1, 3$ to express Eq. (5) as:

$$L_k = f(y_2, \tilde{L}_0, \tilde{L}_1, \tilde{L}_3, k) + \tilde{L}_{0k} + \tilde{L}_{1k} + \tilde{L}_{3k} \tag{24}$$

and similarly, $$L_k = f(y_3, \tilde{L}_0, \tilde{L}_1, \tilde{L}_2, k) + \tilde{L}_{0k} + \tilde{L}_{1k} + \tilde{L}_{2k} \tag{25}$$

A solution to Eqs. (9), (11), and (12) is:

$$\tilde{L}_{1k} = f(y_1, \tilde{L}_0, \tilde{L}_2, \tilde{L}_3, k) \tag{26}$$

$$\tilde{L}_{2k} = f(y_2, \tilde{L}_0, \tilde{L}_1, \tilde{L}_3, k) \tag{27}$$

$$\tilde{L}_{3k} = f1(y_3, \tilde{L}_0, \tilde{L}_1, \tilde{L}_2, k) \tag{28}$$

for $k=1, 2, \ldots, N$ (provided that a solution to Eqs. (13–15) does indeed exist). The final decision is then based on:

$$L_k = \tilde{L}_{0k} + \tilde{L}_{1k} + \tilde{L}_{2k} + \tilde{L}_{3k} \qquad (29)$$

which is passed through a hard limiter with zero threshold. We attempted to solve the nonlinear equations in Eq. (11) for $\tilde{L}_1$, $\tilde{L}_2$, and $\tilde{L}_3$ by using the iterative procedure:

$$\tilde{L}^{(m+1)}{}_{1k} = \alpha^{(m)}{}_1 \, f(y_1, \tilde{L}_0, \tilde{L}^{(m)}{}_2, \tilde{L}^{(m)}{}_3, \tilde{L}_{3k}, k) \qquad (30)$$

for k=1, 2, ..., N, iterating on m. Similar recursions hold for $\tilde{L}^{(m)}{}_{2k}$ and $\tilde{L}^{(m)}{}_{3k}$. The gain $\alpha^{(m)}{}_1$ should be equal to one, but we noticed experimentally that better convergence can be obtained by optimizing this gain for each iteration, starting from a value slightly less than one and increasing toward one with the iterations, as is often done in simulated annealing methods.

Figure 19:
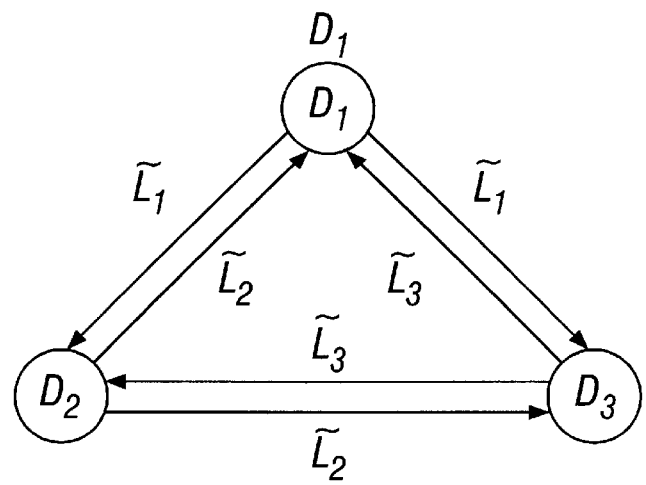
FIG. 19 is a signal flow graph for extrinsic information in a decoder.

We start the recursion with the initial condition $\tilde{L}^{(0)}{}_1 = \tilde{L}^{(0)}{}_2 = \tilde{L}^{(0)}{}_3 = \tilde{L}_0$ (note that the components of the $\tilde{L}$ corresponding to the tail bits are set to zero for all iterations). For the computation of $f(\cdot)$, we preferably use the modified MAP algorithm as described in "Turbo Codes for Deep-Space Communications", supra, with permuters (direct and inverse) where needed. Call this basic decoder $D_i$, i=1, 2, 3. The $\tilde{L}^{(m)}{}_{ik}$, i=1, 2, 3 represent the extrinsic information. The signal flow graph for extrinsic information is shown in FIG. 19, which is a fully connected graph without self-loops. Parallel, serial, or hybrid implementations can be realized based on the signal flow graph of FIG. 19 (in this figure, $y_0$ is considered part of $y_1$). Based on the equations above, each node's output is equal to internally generated reliability L minus the sum of all inputs to that node.

Figure 20A:
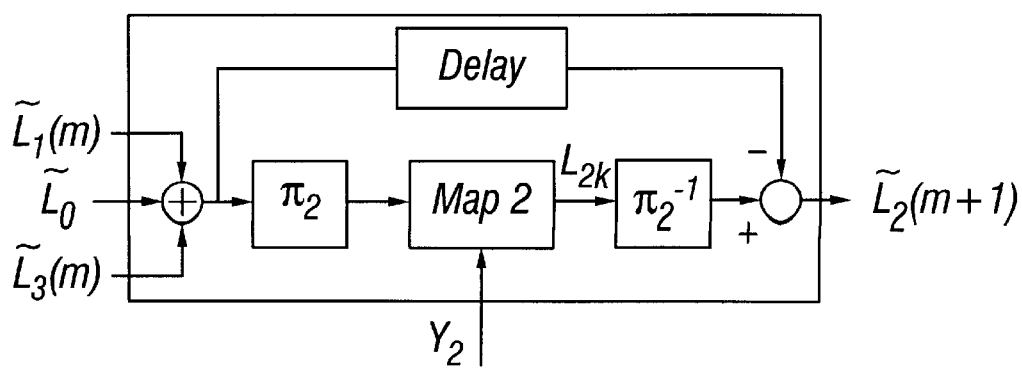
FIG. 20A is a block diagram of a single parallel block decoder in accordance with the present invention.

FIG. 20A is a block diagram of a single parallel block decoder in accordance with the present invention. Inputs include feedback terms $\tilde{L}^{(m)}{}_1$ and $\tilde{L}^{(m)}{}_3$, and input terms $\tilde{L}_0$ and $y_2$, as described above. Direct permuter (interleaver) $\pi_2$ is coupled to a MAP function block as shown, which in turn is coupled to the corresponding inverse permuter $\pi^{-1}{}_2$.

In all instances, the MAP algorithm always starts and ends at the all-zero state since we always terminate the trellis as described above or in "Turbo Codes for Deep-Space Communications", supra. Similar structures apply for block decoder 1 (we assumed $\pi_1 = I$, identity; however, any $\pi_1$ can be used) and block decoder 3 in a three code system. The overall decoder is composed of block decoders connected as in FIG. 17, which can be implemented as a pipeline or by feedback.

An alternative design to that shown in FIG. 20A, which is more appropriate for use n turbo trellis coded modulation or when the systematic bits are not transmitted, sets $\tilde{L}_0 = 0$ and considers $y_0$ as part of $y_1$ (that is, no direct use is made of the received term corresponding to the original signal data d). Even in the presence of systematic bits, if desired, one can set $\tilde{L}_0 = 0$ and consider $y_0$ as part of $y_1$. If the systematic bits are distributed among encoders, we use the same distribution of $y_0$ among the MAP decoders.

Figure 20B:
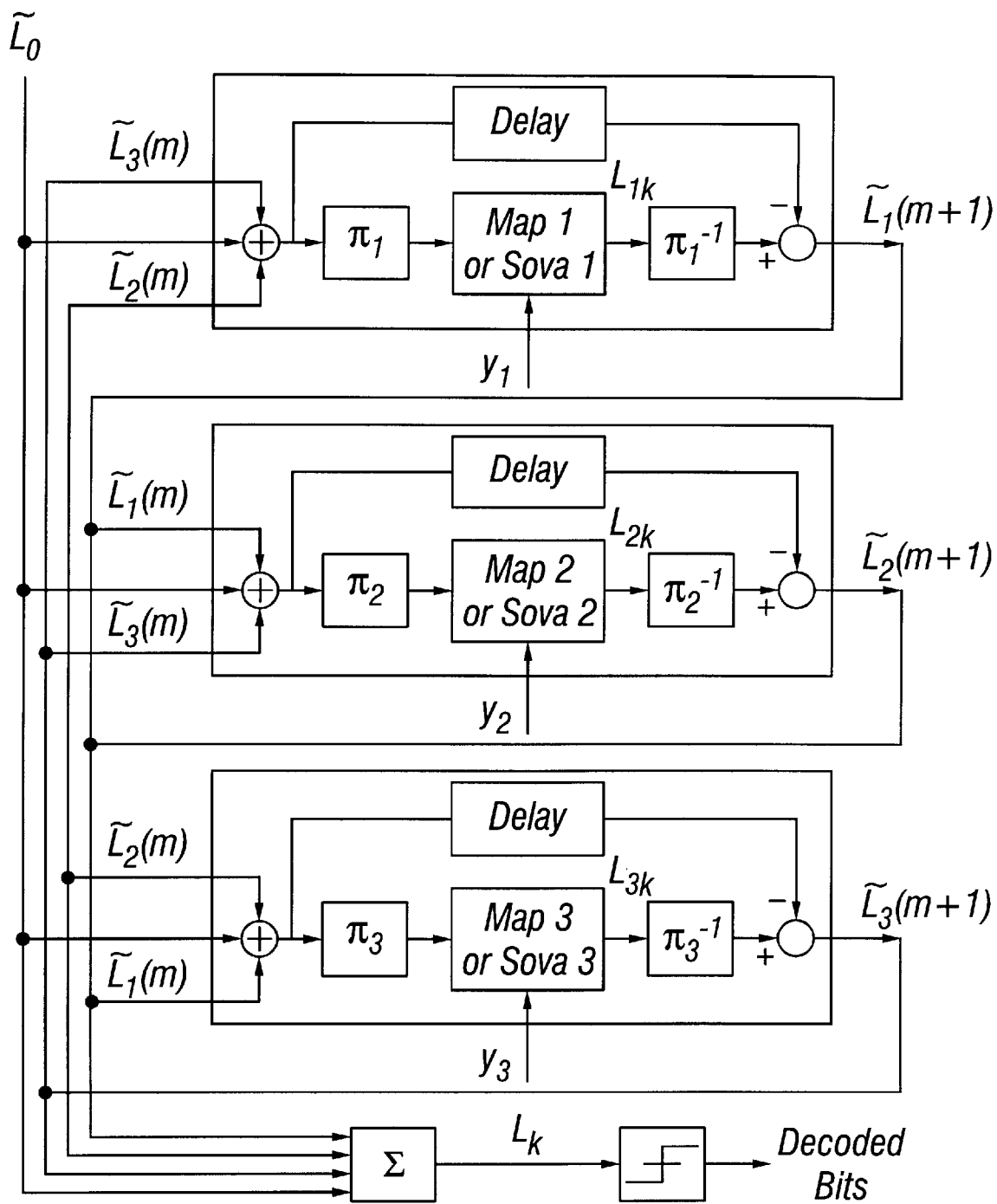
FIG. 20B is a block diagram showing a multiple turbo code decoder for a three code system, using three blocks similar to the decoder in FIG. 20A.

FIG. 20B is a block diagram showing a multiple turbo code decoder for a three code system, using three blocks similar to the decoder in FIG. 20A. In this embodiment, the parity output $x_{1p}$, $x_{2p}$, $x_{3p}$ of the encoder shown in FIG. 2, received as $y_1$, $y_2$, $y_3$, can be used to reconstruct d. This decoder can also be configured to a two code system and for more than three codes.

Figure 20C:
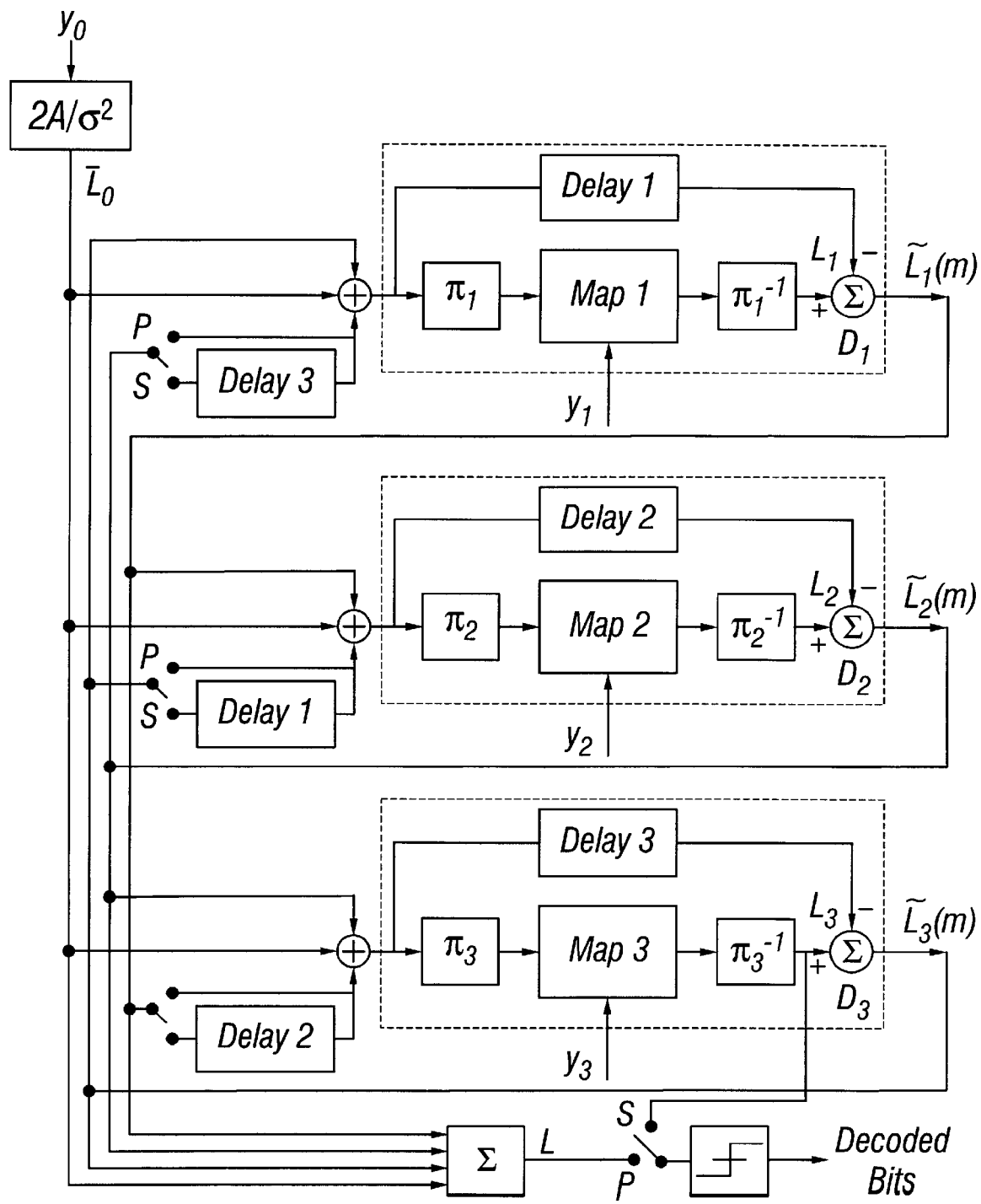
FIG. 20C is a block diagram showing a multiple turbo code decoder for a three code system, using three blocks similar to the decoder in FIG. 20A, and having a switchable serial decoder mode.
Figure 20D:
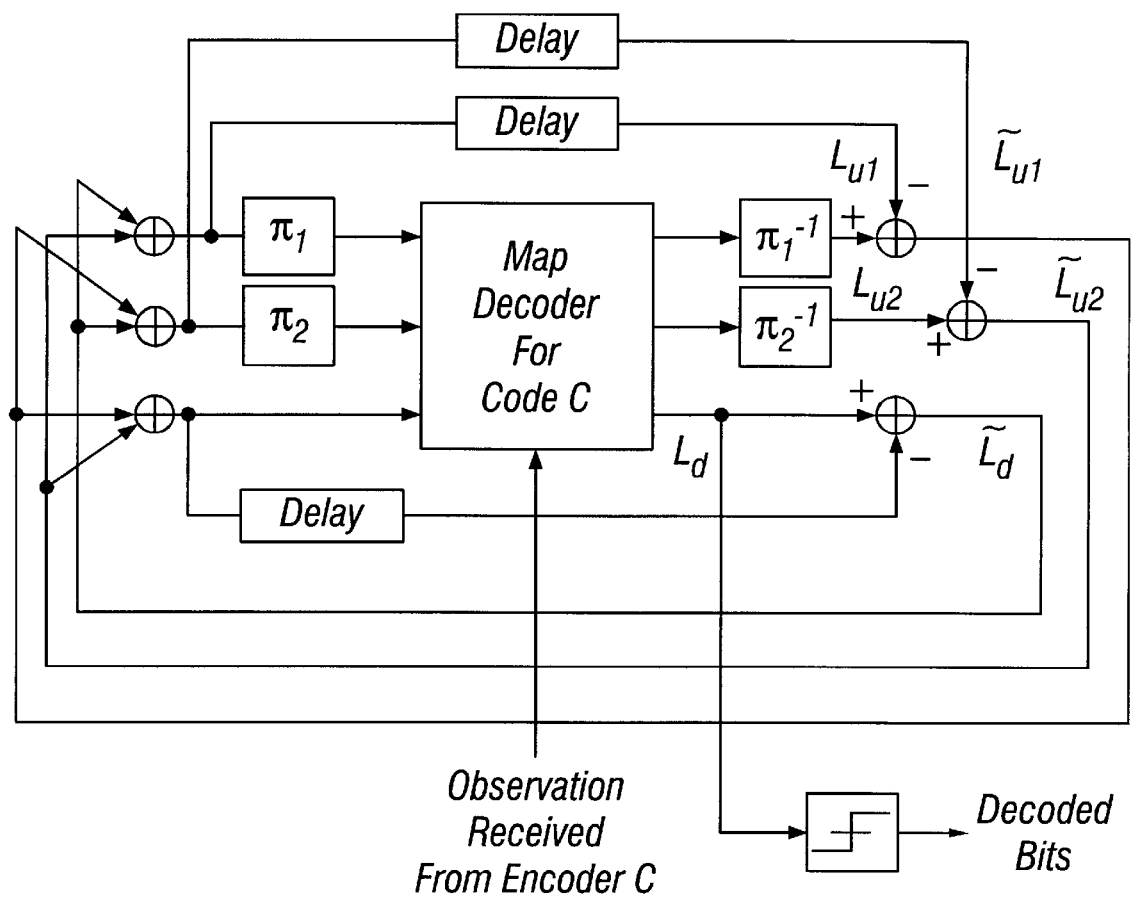
FIG. 20D is a block diagram showing a decoder corresponding to the self-concatenating coder of FIG. 6B.
Figure 20F:
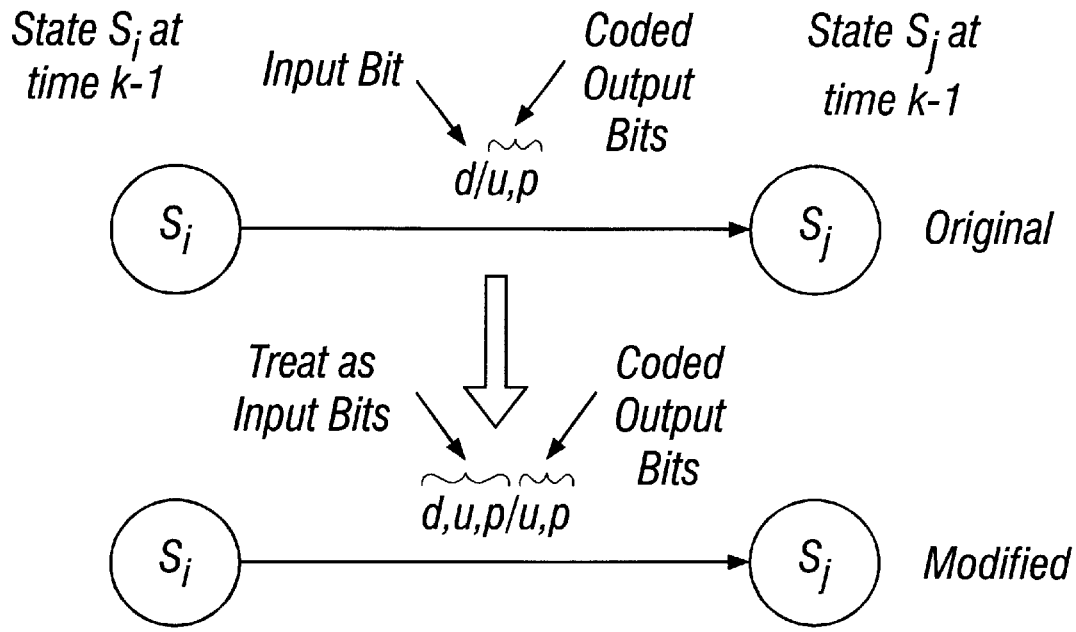
FIG. 20F is a block diagram showing a decoder corresponding to the serial coder of FIG. 7B.
Figure 20F:
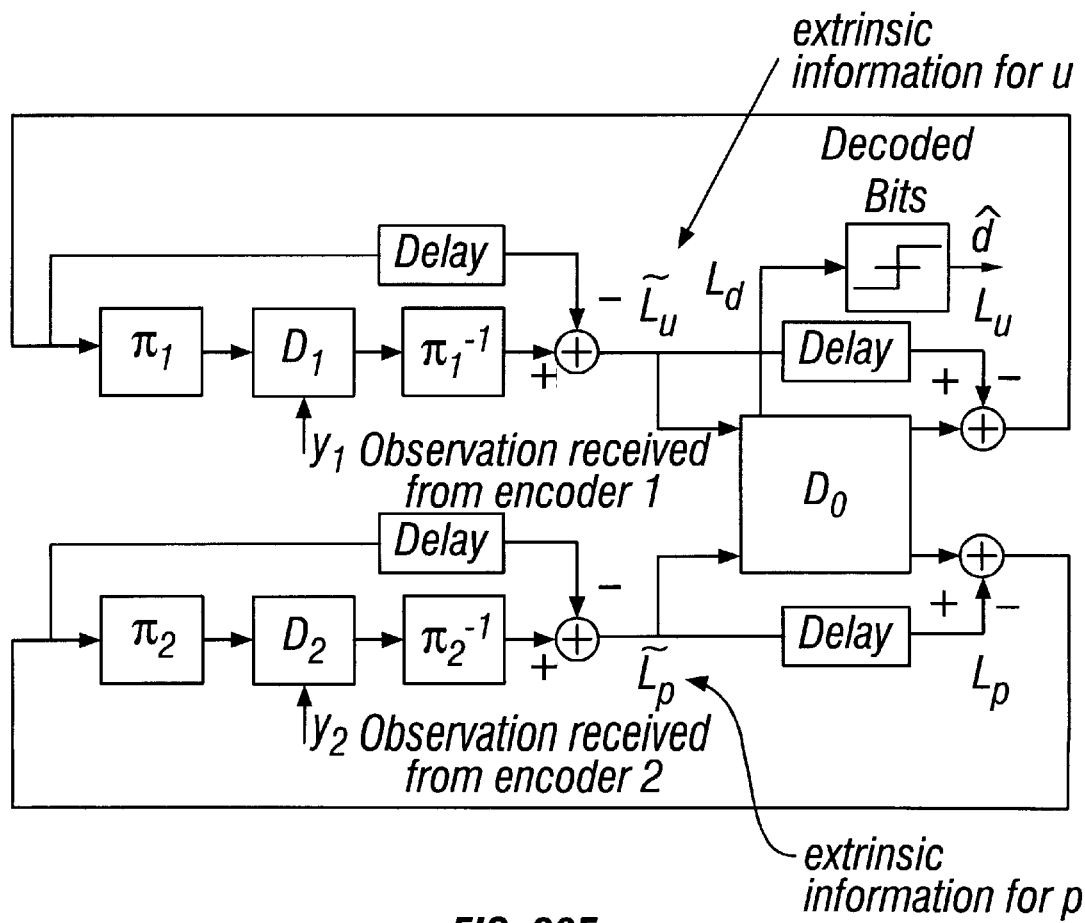

FIG. 20C is a block diagram showing a multiple turbo code decoder for a three code system, using three blocks similar to the decoder in FIG. 20A. This embodiment shows a serial implementation when the switches are in position S and the delay elements are present. This decoder can also be configured to a two code system and for more than three codes.

At this point, further approximation for turbo decoding is possible if one term corresponding to a sequence u dominates other terms in the summation in the numerator and denominator of Eq. (10). Then the summations in that equation can be replaced by "maximum" operations with the same indices, i.e., replacing $\Sigma_{u:u_k=i}$ with $\max_{u:u_k=i}$ for i=0,1. A similar approximation can be used for $\tilde{L}_{2k}$ and $\tilde{L}_{3k}$ Eqs. (13)–(15). This suboptimum decoder then corresponds to a turbo decoder that uses soft output Viterbi (SOVA)-type decoders rather than MAP decoders. Accordingly, FIG. 20B indicates that the decoders may be MAP or SOVA decoders. Further approximations, i.e., replacing $\Sigma$ with max, can also be used in the MAP algorithm.

FIG. 20D is a block diagram showing a decoder corresponding to the self-concatenating coder of FIG. 6B. The MAP decoder for decoding the specific embodiment shown in FIG. 6B generates the reliabilities of $u_1$, $u_2$, and d. The input reliabilities to the MAP decoder are subtracted from the proper deinterleaved reliabilities and are fed back to the same decoder as shown in FIG. 20D The new input reliability to the MAP decoder for $u_1$ is the interleaved version of $\tilde{L}_{u_2} + \tilde{L}_d$; for u2 is the interleaved version of $\tilde{L}_{u_1} + \tilde{L}_d$; and for d is $\tilde{L}_{u_1} + \tilde{L}_{u_2}$. At the first iteration, the decoder starts with zero input reliabilities. Using the received observation (ie., the noisy version of d and p if $u_1$ and $u_2$ were not transmitted; see FIG. 6B), the MAP decoder generates the new reliabilities for $u_1$, $u_2$, and d. At the second iteration, all input reliabilities are non-zero. The decoder proceeds in the way described above for as many iterations as desired. Since there is only one MAP decoder, we call it self-iterative decoder.

FIG. 20D2 is a block diagram showing a decoder corresponding to the self-concatenated coder of FIG. 6B2. $\tilde{L}_u$ is generated by the MAP decoder for coder C. $\tilde{L}_u$ is deinterleaved, demultiplexed and provided to the adders as shown in FIG. 20D2 (where repetition, m=3, is used as an example). The normalized observation for d is added through the same adders. The outputs of the adders are multiplexed and are fed to the interleaver. The output of the interleaver represents the input reliabilities $L_u$ for the MAP decoder. The whole decoder iterates as many times as desired. The final decision is made at the last iteration by adding the demultiplexer output to the observation d, and hard-limiting the result.

FIG. 20E is a block diagram showing a decoder corresponding to the serial coder of FIG. 7A. The MAP decoder $C_0$ in FIG. 20E is modified in order to generate not only the reliability for the input data d but also the reliability for coded bits u and p. This can be done by treating the input reliabilities for u and p coming from the MAP decoder $C_1$ as new received observations for MAP decoder $C_0$. In the trellis representation (which is required for the MAP algorithm) of code $C_0$, on each branch of the trellis, we treat u and p similarly to d, as if they are used as input to encoder $C_0$. In this way we can generate the reliability of u and p in a manner similar to how we generate the reliability of d in the original MAP algorithm. This simple stratagem provides the required modified MAP algorithm. The original and modified methods are illustrated in FIG. 20E2.

FIG. 20F is a block diagram showing a decoder corresponding to the parallel-serial coder of FIG. 7B. Decoder $D_0$, based on the MAP algorithm, accepts as an input the reliability of parity bits generated by decoder $D_2$, and generates the new extrinsic information on the parity p (using the MAP algorithm), which is passed to decoder $D_2$.

Figure 20G:
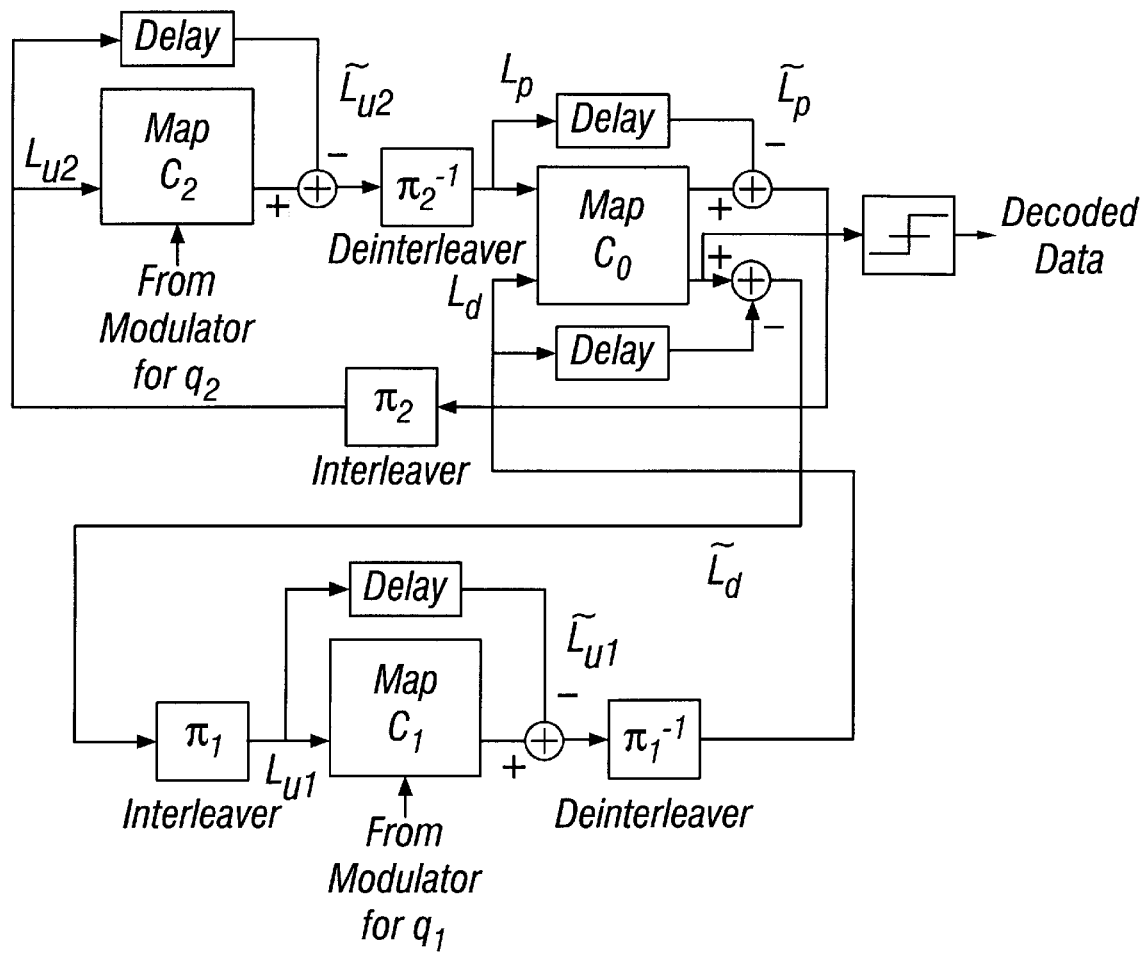
FIG. 20G is a block diagram showing a decoder corresponding to the hybrid concatenated code (serial-parallel, type II) of FIG. 7C.

FIG. 20G is a block diagram showing a decoder corresponding to the hybrid concatenated code (serial-parallel, type II) of FIG. 7C. The MAP decoder C2, after receiving the observation $q_2$, generates the quantity $\tilde{L}_{u_2}$, which, after passing through a deinterleaver, produces the input reliability $L_p$ of code bits for $C_0$. The MAP decoder $C_1$, after receiving observation q1, generates the quantity $\tilde{L}_{u_1}$, which, after passing through a deinterleaver, produces the input reliability $L_d$ of data bits for $C_0$. The modified MAP decoder $C_0$ (as explained for FIG. 20E) accepts $L_p$ and $L_d$ as input reliabilities and generates the quantity $\tilde{L}_p$ (for coded bit p) and $\tilde{L}_d$ (for data bits d). $\tilde{L}_p$ is provided to the MAP decoder for $C_2$ through interleaver $\pi_2$. $\tilde{L}_d$ is provided to the MAP decoder through interleaver $\pi_1$. The whole decoder iterates as many times as desired. The decoded bits are obtained by hard-limiting the reliabilities for d provided by MAP decoder $C_0$.

Multiple-Code Algorithm Applied to Decoding of Two Codes

For turbo codes with only two constituent codes, Eq. (17) reduces to $$\tilde{L}^{m+1}{}_{1k} = \alpha^{(m)}{}_1 f(y_1, \tilde{L}_0, \tilde{L}^{(m)}{}_2, k) \quad (31)$$

$$\tilde{L}^{m+1}{}_{2k} = \alpha^{(m)}{}_2 f(y_2, \tilde{L}_0, \tilde{L}^{(m)}{}_1, k) \quad (32)$$

for k=1, 2, ..., N and m=1, 2, ..., where, for each iteration, $\alpha^{(m)}{}_1$ and $\alpha^{(m)}{}_2$ can be optimized (simulated annealing) or set to 1 for simplicity. The decoding configuration for two codes reduces to duplicate copies of the structure in FIG. 16 (ie., to the serial mode).

If we optimize $\alpha^{(m)}{}_1$ and $\alpha^{(m)}{}_2$, our method for two codes is similar to the decoding method proposed by Berrou. However, our method with $\alpha^{(m)}{}_1$ and $\alpha^{(m)}{}_2$ equal to 1 is simpler and achieves the same performance reported in Robertson, supra, for rate ½ codes.

Turbo Trellis-Coded Modulation

A pragmatic approach for turbo codes with multilevel modulation has been was proposed in S. LeGoff, A. Glavieux, and C. Berrou, "Turbo Codes and High Spectral Efficiency Modulation", *Proceedings of the IEEE ICC'94*, New Orleans, La., pp. 645–651, May 1–5, 1994. Here we propose a different approach that out performs those results when M-ary quadrature amplitude modulation (M-QAM) or M-ary phase shift keying (MPSK) modulation is used.

A straightforward method for the use of turbo codes for multilevel modulation is the following:

(1) select a rate b/(b+1) constituent code, where the outputs are mapped to a $2^{b-1}$-level modulation based on Ungerboeck's set partitioning method (G. Ungerboeck, "Channel Coding With Multi-Level Phase Signals", *IEEE Transactions on Information Theory*, vol. IT-28, pp. 55–67, January 1982) (ie., we can use Ungerboeck's codes with feedback).

(2) If MPSK modulation is used, for every b bits at the input of the turbo encoder, we transmit two consecutive $2^{b+1}$ phase-shift keying (PSK) signals, one per each encoder output. This results in a throughput of b/2 bits/s/Hz.

(3) If M-QAM modulation is used, we map the b+1 outputs of the first component code to the $2^{b+1}$ quadrature levels (Q-channel). The throughput of this system is b bits/s/Hz.

First, we note that these methods require more levels of modulation than conventional trellis-coded modulation (TCM), which is not desirable in practice. Second, the input information sequences are used twice in the output modulation symbols, which also is not desirable. One remedy is to puncture the output symbols of each trellis code and select the puncturing pattern such that the output symbols of the turbo code contain the input information only once. If the output symbols of the first encoder are punctured, for example, as 101010 . . ., the puncturing of the second encoder must be nonuniform to guarantee that all information symbols are used, and it depends on the particular choice of interleaver. Now, for example, for $2^{b+1}$ PSK, a throughput b can be achieved. This method has two drawbacks: It complicates the encoder and decoder, and the reliability of punctured symbols may not be fully estimated at the decoder. A better remedy, for rate b/(b+1) (b even) codes, is discussed in the next section.

A New Method to Construct Turbo TCM

For a q=2 turbo code with rate b/(b+1) constituent encoders, select the b/2 systematic outputs and puncture the rest of the systematic outputs, but keep the parity bit of the b/(b+1) code (note that the rate b/(b+1) code may have been obtained already by puncturing a rate ½ code). Then do the same to the second constituent code, but select only those systematic bits that were punctured in the first encoder. This method requires at least two interleavers: the first interleaver permutes the bits selected by the first encoder and the second interleaver permutes those bits punctured by the first encoder. For MPSK (or M-QAM), we can use $2^{1+b/2}$ PSK symbols (or $2^{1+b/2}$ QAM symbols) per encoder and achieve throughput of b/2. For M-QAM, we can also use $2^{1+b/2}$ levels in the I-channel and $2^{1+b/2}$ levels in the Q-channel and achieve a throughput of b bits/s/Hz.

These methods are equivalent to a multidimensional trellis-coded modulation scheme (in this case, two multilevel symbols per branch) that uses $2^{b/2} \times 2^{1+b/2}$ symbols per branch, where the first symbol in the branch (which depends only on uncoded information) is punctured. Now, with these methods, the reliability of the punctured symbols can be fully estimated at the decoder. Obviously, the constituent codes for a given modulation should be redesigned based on the Euclidean distance.

EXAMPLES

Figure 22:
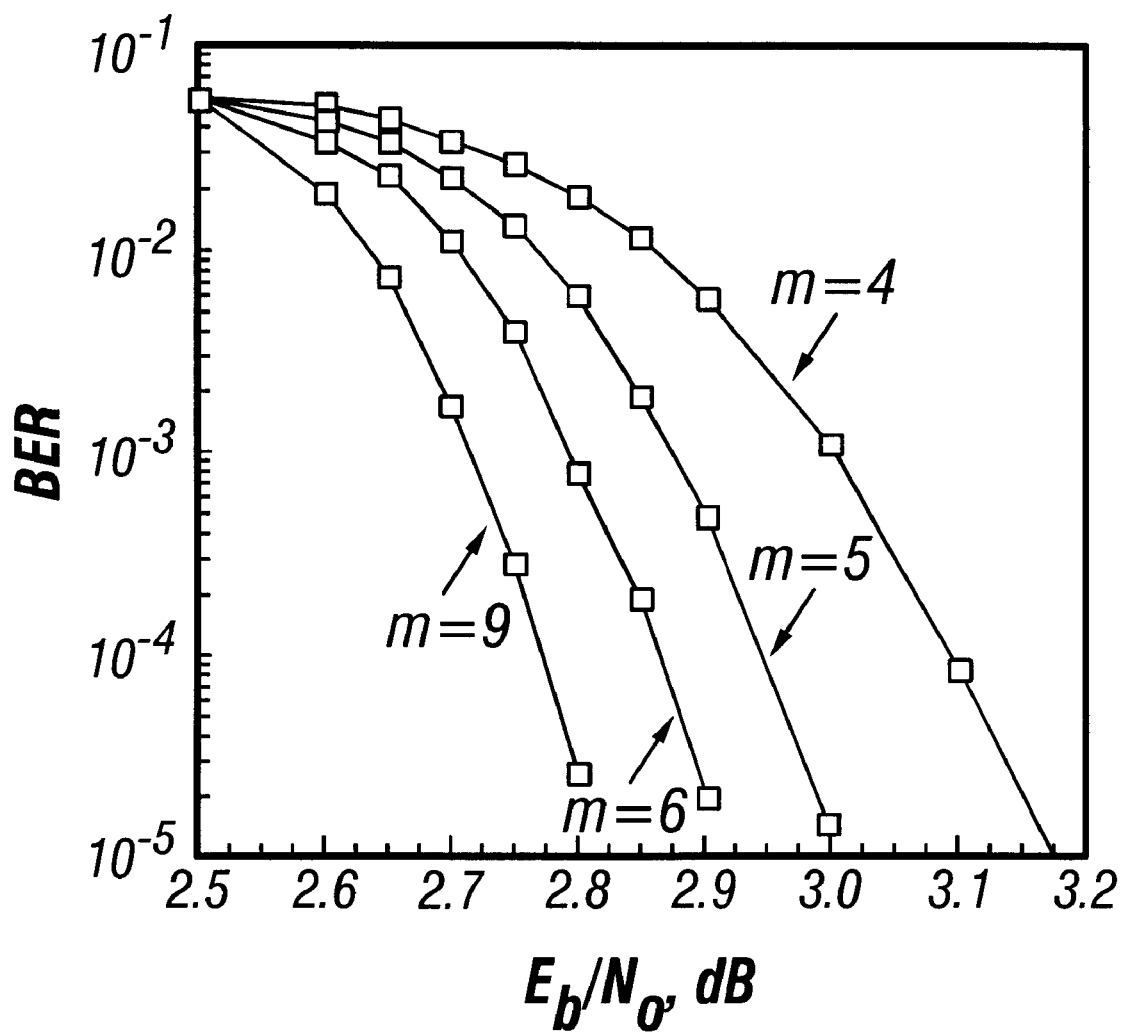
FIG. 22 is a diagram showing the BER performance of the coder shown in FIG. 21.

The first example is for b=2 with 16 QAM modulation where, for simplicity, we can use the ⅔ codes in Table I above with Gray code mapping. Note that this may result in suboptimum constituent codes for multilevel modulation. A turbo encoder with 16 QAM and two clock-cycle trellis termination is shown in FIG. 21. The BER performance of this code with the turbo decoding structure for two codes discussed above is given in FIG. 22. For permutations $\pi_1$ and $\pi_2$, we used S-random permutations with S=40 and S=32, with a block size of 16,384 bits. Throughput was 2 bits/s/Hz.

Figure 23A:
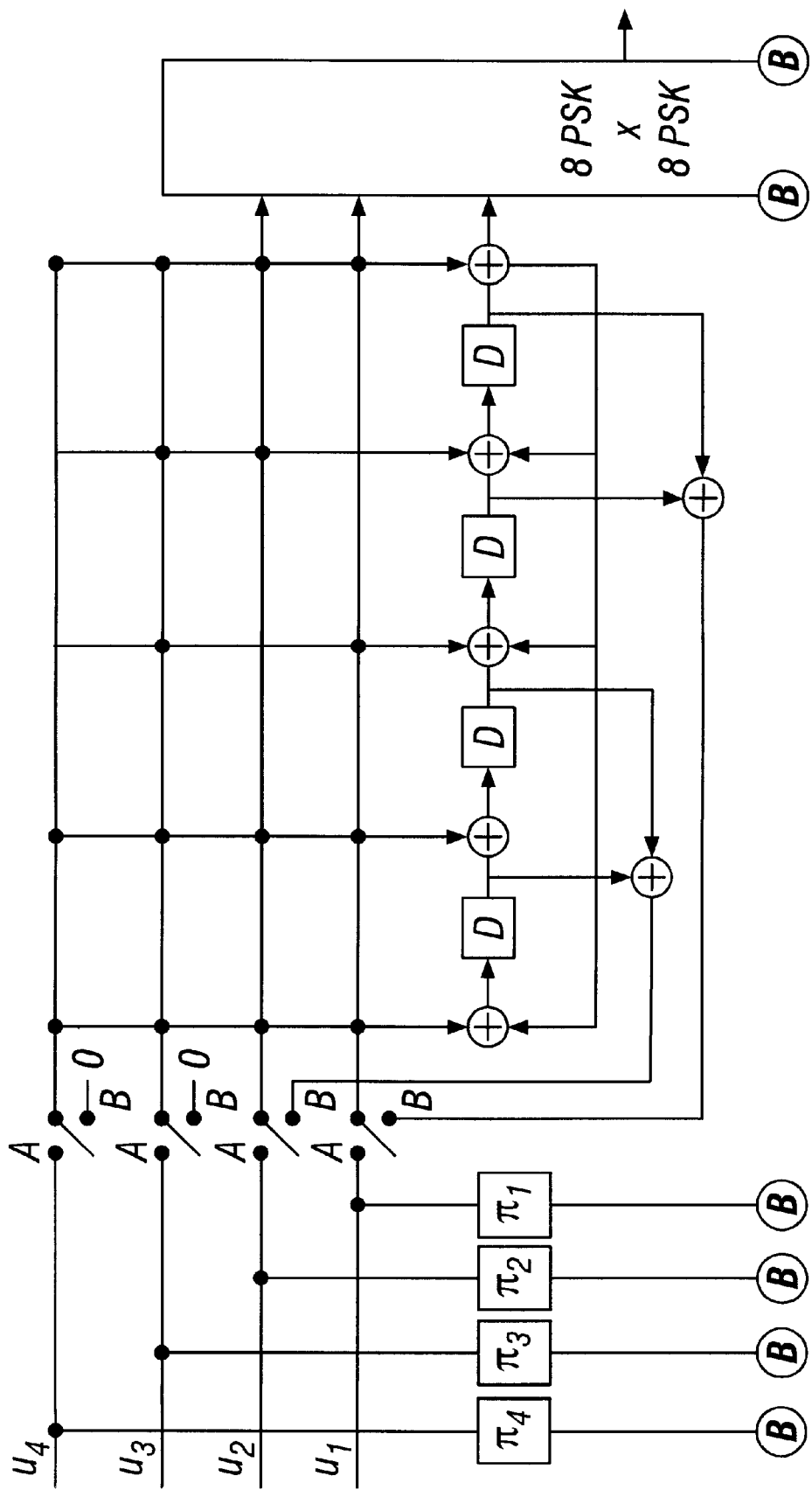
FIG. 23 is a block diagram of an 8 PSK turbo trellis-coded modulation coder in accordance with the present invention.
Figure 23B:
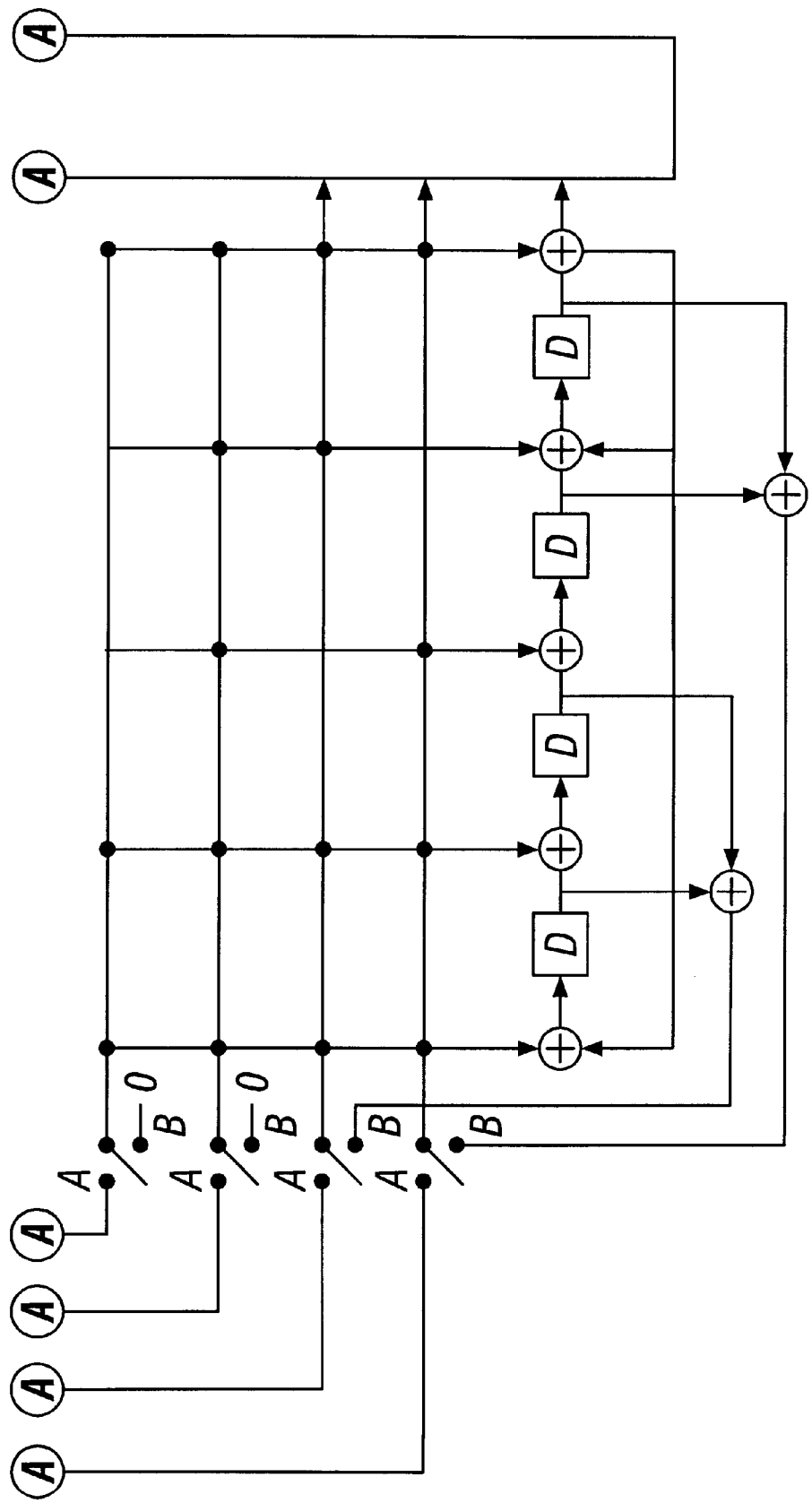
Figure 24:
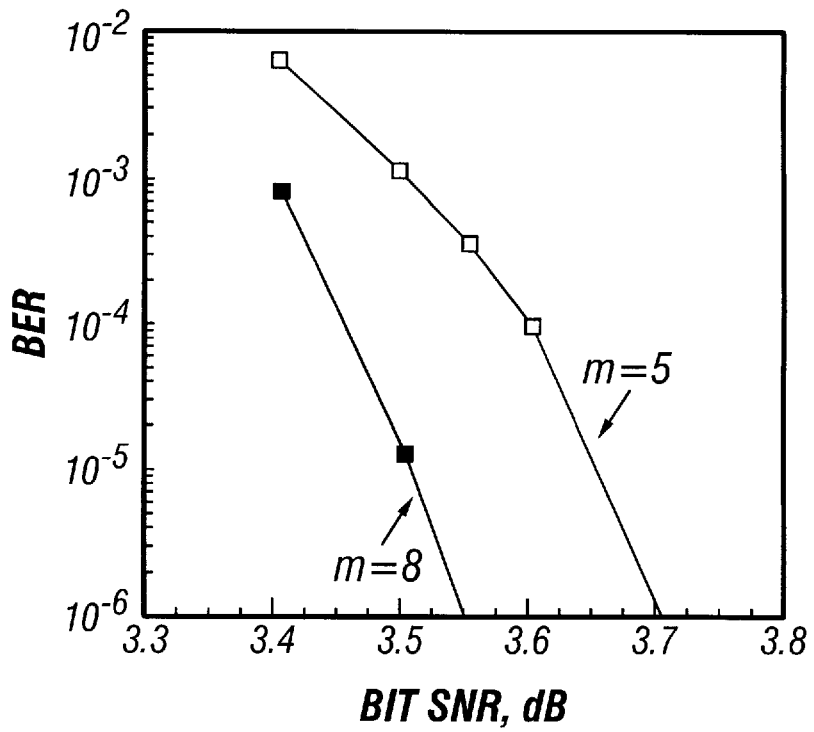
FIG. 24 is a diagram showing the BER performance of the coder shown in FIG. 23.

For 8 PSK modulation, we used two 16-state, rate ⅘ codes given above to achieve a throughput of 2 bits/s/Hz. The parallel concatenated trellis codes with 8 PSK and two clock-cycle trellis termination is shown in FIG. 23. The BER performance of this code is given in FIG. 24.

Figure 26:
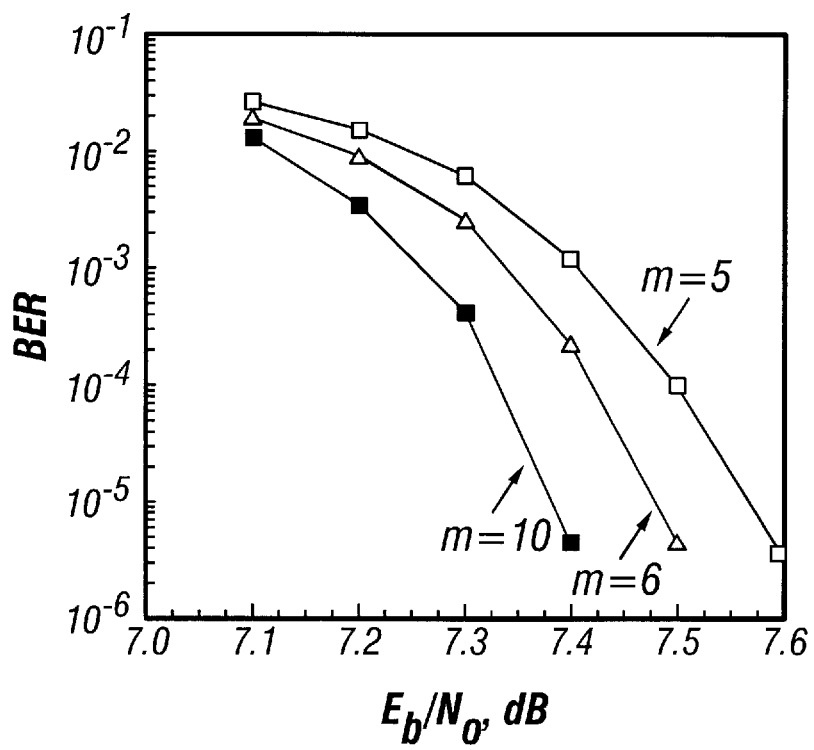
FIG. 26 is a diagram showing the BER performance of the coder shown in FIG. 25.
Figure 25A:
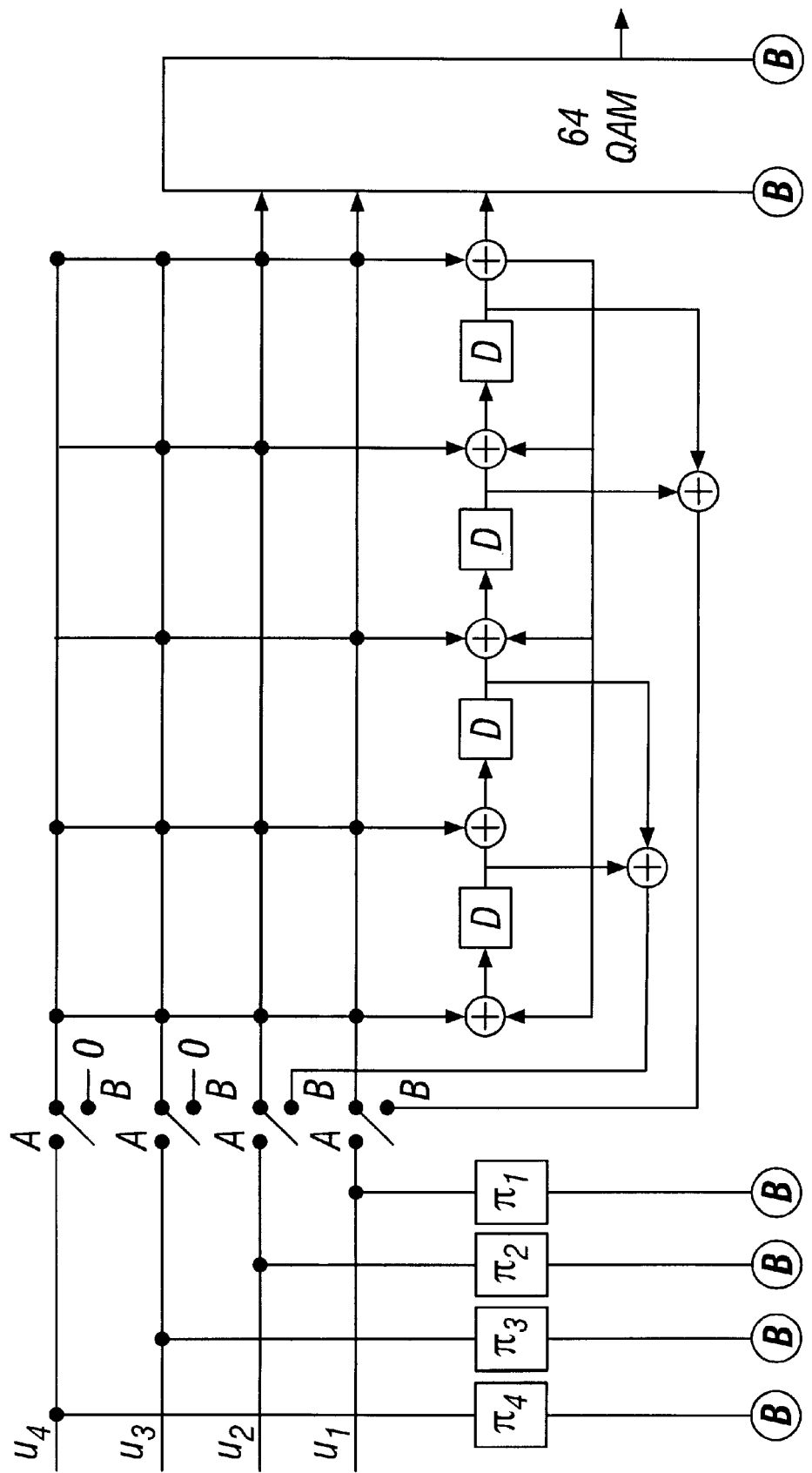
FIG. 25 is a block diagram of a 64 QAM turbo trellis-coded modulation coder in accordance with the present invention.
Figure 25B:
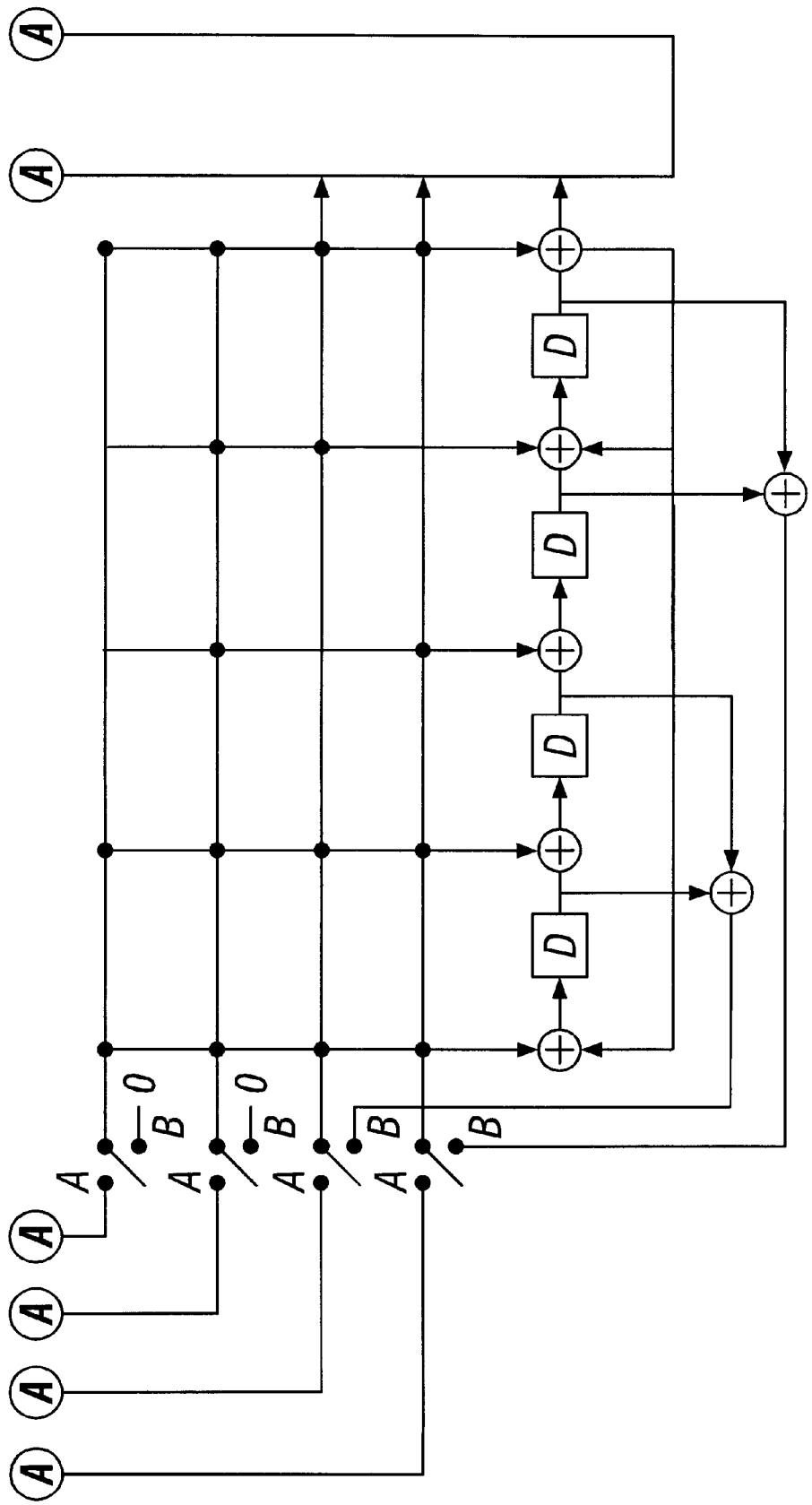

For 64 QAM modulation, we used two 16-state, rate ⅘ codes given above to achieve a throughput of 4 bits/s/Hz. The parallel concatenated trellis codes with 64 QAM and two clock-cycle trellis termination is shown in FIG. 25. The BER performance of this code is given in FIG. 26.

For permutations $\pi_1, \pi_2, \pi_3, \pi_4$ in FIGS. 23 and 25, we used random permutations, each with a block size of 4096 bits. As discussed above, there is no need to use four permutations; two permutations suffice, and may even result in a better performance. Extension of the described method for construction of turbo TCM based on Euclidean distance is straightforward.

Application of TCM to the turbo code structures shown here in provides a number of advantages, including power efficiency and bandwidth efficiency, resulting in a higher data rate.

Figure 27:
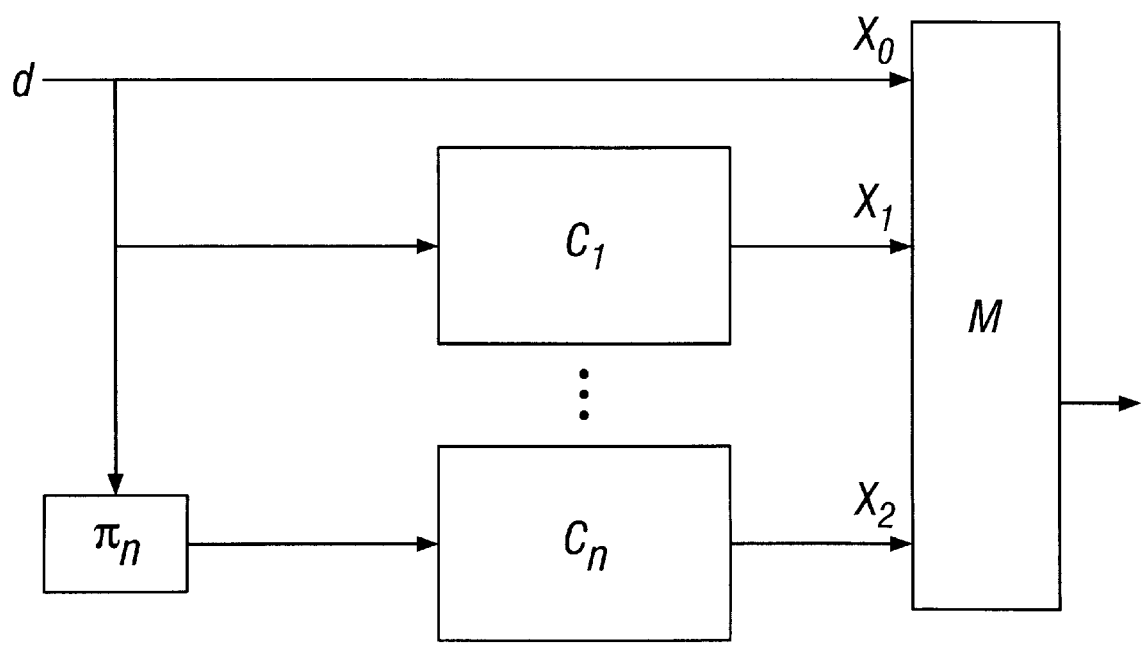
FIG. 27 is a block diagram of general embodiment of the present invention, showing output of the source data element and encoded elements to a multilevel trellis-coded modulator.

FIG. 27 is a block diagram showing application of a TCM module M in combination with a conventional two code turbo coder to give the advantages noted above. In addition, such a module M is shown in outline in FIGS. 6 and 7. It should be noted that the structures shown in FIGS. 6, 7, and 27 are general in nature, and provide advantages independent of specific interleavers, coders, and TCM modules.

Figure 28:
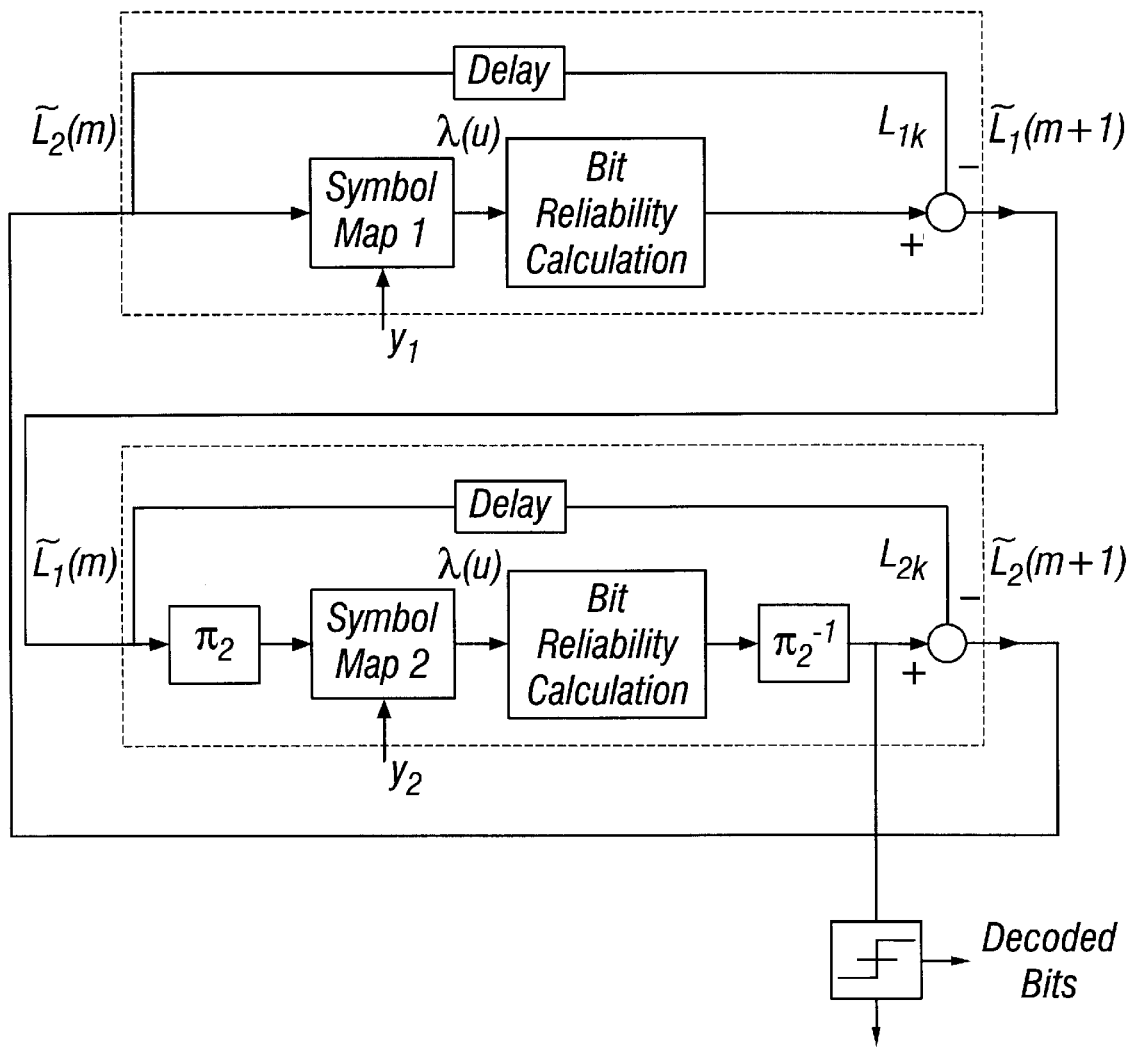
FIG. 28 is a block diagram showing a general decoder for the TCM encoded output of, for example, FIGS. 21, 23, and 25.

FIG. 28 is a block diagram showing a general iterative decoder structure for the TCM encoded output of, for example, FIGS. 21, 23, and 25.

Conclusion

Further information about some aspects of the present invention, such as proofs of theorems, may be found in the following articles, which are hereby incorporated by reference:

D. Divsalar and F. Pollara, "Multiple Turbo Codes for Deep-Space Communications", *The Telecommunications and Data Acquisition Progress Report* 42–121, January–March 1995, Jet Propulsion Laboratory, Pasadena, Calif., pp. 66–77, May 15, 1995.

D. Divsalar and F. Pollara, "Turbo Codes for PCS Applications", *Proceedings of IEEE ICC'95*, Seattle, Wash., pp. 54–59, June 1995.

D. Divsalar and F. Pollara, "Turbo Codes for Deep-Space Communications", IEEE Communication Theory Workshop, Apr. 23–26, 1995, Santa Cruz, Calif.

D. Divsalar and F. Pollara, "Low-rate Turbo Codes for Deep-Space Communications", IEEE International Symposium on Information Theory, September 17–22, Whistler, Canada.

D. Divsalar and F. Pollara, "Multiple Turbo Codes", *MIL-COM 95*, San Diego, Calif., Nov. 5–8, 1995.

D. Divsalar and F. Pollara, "On the Design of Turbo Codes", *The Telecommunications and Data Acquisition Progress Report* 42–123, July–September 1995, Jet Propulsion Laboratory, Pasadena, Calif., pp. 99–121, Nov. 15, 1995.

A number of embodiments of the present invention have been described. Nevertheless, it will be understood that various modifications may be made without departing from the spirit and scope of the invention. For example, where specific values (e.g., for interleaver size) are given, other values generally can substituted in known fashion. A particular encoder may be implemented as a hardware device while the corresponding decoder is implemented in software, for vice versa. Accordingly, it is to be understood that the invention is not to be limited by the specific illustrated embodiment, but only by the scope of the appended claims.

What is claimed is:

1. A system for error-correction coding of a source of original digital data elements, comprising:
    (a) a first systematic convolutional encoder, coupled to the source of original digital data elements, for generating a first series of coded output elements derived from the original digital data elements;
    (b) at least one interleaver, each coupled to the source of original digital data elements, for modifying the order of the original digital data elements to generate respective sets of interleaved elements; and
    (c) at least one next systematic convolutional encoder, each coupled to respective interleaved elements, each for generating a corresponding next series of coded output elements derived from a respective set of interleaved elements, each next series of coded output elements being in parallel with the first series of coded output elements;
    wherein the system for error-correction coding outputs only the first series of coded output elements and each next series of coded output elements.

2. The system of claim 1, further including a decoder for receiving signals representative of at least some of the first series of coded output elements and of at least some of each next series of coded output elements, and for generating the original digital data elements from such received signals.

3. The system of claim 1, further including a multilevel modulator, coupled to the coded output elements of each systematic convolutional encoder, for generating an output modulated signal representative of at least some of such coded output elements.

4. The system of claim 3, wherein the multilevel modulator generates a trellis code modulation.

5. The system of claim 3, further including a demodulator for demodulating the output signal of the multilevel modulator into a data signal representative of at least some of the first series of coded output elements and of at least some of each next series of coded output elements, and a decoder, coupled to the demodulator, for generating the original digital data elements from the data signal.

6. A system for error-correction coding of a plurality of sources of original digital data elements, comprising:
    (a) a first systematic convolutional encoder, coupled to each source of original digital data elements, for generating a first set of series coded output elements derived from the original digital data elements;
    (b) at least one set of interleavers, each set coupled to respective sources of original digital data elements, for modifying the order of the original digital data elements from the respective coupled sources to generate a respective set of interleaved elements; and
    (c) at least one next systematic convolutional encoder, each coupled to at least one set of interleaved elements, each for generating a corresponding next set of series coded output elements derived from the coupled sets of interleaved elements, each next set of series coded output elements being in parallel with the first set of series coded output elements.

7. The system of claim 6, wherein the system for error-correction coding further outputs the original digital data elements.

8. The system of claim 6, wherein the system for error-correction coding outputs only the first set of series coded output elements and each next set of series coded output elements.

9. The stem of claim 6, further including a decoder for receiving signals representative of at least some of the first set of series coded output elements and of at least some of each next set of series coded output elements, and for generating the original digital data elements from such received signals.

10. The system of claim 6, further including a multilevel modulator, coupled to the coded output elements, for generating an output modulated signal representative of at least some of the coded output elements.

11. The system of claim 10, wherein the multilevel modulator generates a trellis code modulation.

12. The system of claim 10, further including a demodulator for demodulating the output signal of the multilevel modulator into a data signal representative of at least some of the first set of series coded output elements and of at least some of each next set of series coded output elements, and a decoder, coupled to the demodulator, for generating the original digital data elements from the data signal.

13. A system for error-correction coding of a source of original digital data elements comprising:

(a) at least one interleaver, each coupled to the source of original digital data elements, for modifying the order of the original digital data elements to generate respective interleaved elements; and (b) a single systematic recursive convolutional encoder module, coupled to the source of original digital data elements and to interleaved elements from at least one interleaver, for generating a set of coded output elements derived from the original digital data elements;

wherein the system for error-correction coding outputs the set of coded output elements and the original digital data elements.

14. The system of claim 13, further including a decoder for receiving signals representative of at least some of the set of coded output elements, and for generating the original digital data elements from such received signals.

15. The system of claim 13, further including a multilevel modulator, coupled to the set of coded output elements of the systematic convolutional encoder, for generating an output modulated signal representative of at least some of the set of coded output elements.

16. The system of claim 15, wherein the multilevel modulator generates a trellis code modulation.

17. The system of claim 15, further including a demodulator for demodulating the output signal of the multilevel modulator into a data signal representative of at least some of the set of coded output elements, and a decoder, coupled to the demodulator, for generating the original digital data elements from the data signal.

18. A system for error-correction coding of a source of original digital data elements, comprising:

(a) a first encoder, coupled to the source of original digital data elements, for generating a plurality of coded intermediate output elements derived from the original digital data elements;

(b) at least one interleaver, each coupled to at least one of the plurality of coded intermediate output elements, for modifying the order of the coded intermediate output elements to generate respective interleaved output elements; and (c) at least one systematic recursive convolutional encoder, each coupled to at least one interleaver, for generating a set of coded output elements derived from the interleaved output elements from each coupled interleaver.

19. The system of claim 18, further including a decoder for receiving signals representative of at least some of the set of coded output elements, and for generating the original digital data elements from such received signals.

20. The system of claim 18, further including a multilevel modulator, coupled to each set of coded output elements, for generating an output modulated signal representative of at least some of the set of coded output elements.

21. The system of claim 20, wherein the multilevel modulator generates a trellis code modulation.

22. The system of claim 20, further including a demodulator for demodulating the output signal of the multilevel modulator into a data signal representative of at least some of the coded output elements, and a decoder, coupled to the demodulator, for generating the original digital data elements from the data signal.

23. A system for error-correction coding of a source of original digital data elements, comprising:

(a) a first systematic convolutional encoder, coupled to the source of original digital data elements, for generating a first series of coded output elements derived from the original digital data elements;

(b) at least one interleaver, each coupled to the source of original digital data elements, for modifying the order of the original digital data elements to generate respective interleaved elements;

(c) at least one next systematic convolutional encoder, each coupled to respective interleaved elements, each for generating a corresponding next series of coded output elements derived from the respective interleaved elements, each next series of coded output elements being in parallel with the first series of coded output elements; and (d) a multilevel modulator, directly coupled to the original digital data elements and to the coded output elements of each systematic convolutional encoder, for generating an output modulated signal representative of at least some of such original digital data elements and coded output elements.

24. The system of claim 23, wherein the multilevel modulator generates a trellis code modulation.

25. A system for error-correction coding and multilevel modulation of a plurality of sources of original digital data elements, comprising:

(a) a first systematic convolutional encoder, coupled to each source of original digital data elements, for systematically selecting a first subset of the original digital data elements and generating a first series of coded output elements derived from the first selected subset, and for outputting at least one source of original digital data elements unchanged;

(b) at least two interleavers, each coupled to a respective one of the plurality of sources of original digital data elements, for modifying the order of the original digital data elements to generate respective sets of interleaved elements;

(c) at least one next systematic convolutional encoder, each coupled to at least two interleavers, each for systematically selecting a next subset from the sets of interleaved elements different from each other selected subset, for generating a corresponding next series of coded output elements derived from the corresponding next subset, each next series of coded output elements being in parallel with the first series of coded output elements, and for outputting at least one set of interleaved elements unchanged; and (d) a multilevel modulator, coupled to the original digital data elements, the unchanged interleaved elements, and the coded output elements, for generating an output modulated signal representative of at least some of such original digital data elements, unchanged interleaved elements, and coded output elements.

26. The system of claim 25, wherein the multilevel modulator generates a trellis code modulation.

27. A system for terminating a turbo encoder comprising:

(a) a plurality of serially connected delay elements D having a tap after each delay element;

(b) a plurality of first selective combinatorial devices, at least one before the first serially connected delay element D, at least one after the last serially connected delay element D, and at least one between each intermediate pair of serially connected delay elements D;

(c) at least one data source line $u_b$, where b is the number of data source lines, each coupled to each first selective combinatorial device as input lines;

(d) at least one set of next selective combinatorial devices, each set comprising a plurality of selective combinatorial devices each coupled to a corresponding tap and serially coupled together, with an end selective combinatorial device of each set selectively coupled to a corresponding data source line;

wherein, to terminate input to the delay elements D, the sets of next selective combinatorial devices are coupled to the corresponding data source line and selectively actuated to select tap coefficients $a_{i0}, \ldots a_{i,m-1}$ for i=1, 2, ... b, to apply to a corresponding data source line, wherein the tap coefficients are obtained by repeated use of the following equation, and by solving the resulting equations:

$$S^k(D) \left[ \sum_{i=1}^{b} u_i^k h_i(D) + DS^{k-1}(D) \right] \bmod h_0(D)$$

where $S^k(D)$ is the state of the turbo encoder at time k with coefficients $S^k_0, S^k_1, \ldots S^k_{m-1}$ for input $u^k_1, \ldots u^k_b$, and termination in state zero is achieved in at most m clock cycles.

28. A decoder system for decoding a plurality of sequences of received signals $y_i$, representative of code elements $x_i$ generated by a turbo encoder from a source of original digital data elements $u_i$, into decoded elements corresponding to the original digital data elements $u_i$, the decoder system comprising:

(a) at least three decoder modules, each having a received signal input i, a feedback input, and an output, the output of each decoder module being coupled to the feedback input of each other decoder module; and (b) a summing module, coupled to each output of each decoder module, for generating final decoded elements from the outputs of the decoder modules;

wherein each sequence of received signals $y_i$ is coupled to the received signal input i of a corresponding decoder module.

29. The decoder system of claim 28, wherein each decoder module includes:

(a) a feedback input comprising a combinatorial element;
(b) a permuter, coupled to the combinatorial element;
(c) a probability-based decoder, coupled to the permuter and including a received signal input;
(d) an inverse permuter, coupled to the probability-based decoder;
(e) a differential combinatorial element, coupled to the inverse permuter; and
(f) a delay element, coupled between the combinatorial element and the differential combinatorial element.

30. The decoder system of claim 29, wherein the probability-based decoder uses the maximum a posteriori probability algorithm.

31. The decoder system of claim 29, wherein the probability-based decoder uses the soft output Viterbi algorithm.

32. An iterative decoder system for decoding at least one sequence of received signals $y_i$, representative of code elements $x_i$ generated by a self-concatenated encoder from a source of original digital data elements $u_i$, into decoded elements corresponding to the original digital data elements $u_i$, the decoder system comprising:

(a) a plurality of feedback inputs each comprising a combinatorial element;
(b) a plurality of permuters, each coupled to a corresponding combinatorial element;
(c) a probability-based decoder, coupled to each permuter and at least one combinatorial element, and including a received signal input and an output;
(d) a plurality of inverse permuters, each coupled to the probability-based decoder so as to receive a signal associated with a corresponding permuter;
(e) a plurality of differential combinatorial elements, one coupled to the output of the probability-based decoder and each other coupled to a corresponding inverse permuter, and each coupled to every non-corresponding feedback input; and
(f) a plurality of delay elements, each coupled between a corresponding combinatorial element and a corresponding differential combinatorial element;

wherein each sequence of received signals $y_i$ is coupled to the received signal input of the probability-based decoder.

33. The decoder system of claim 32, wherein the probability-based decoder uses the maximum a posteriori probability algorithm.

34. The decoder system of claim 32, wherein the probability-based decoder uses the soft output Viterbi algorithm.

35. An iterative decoder system for decoding at least one sequence of received signals $y_i$, representative of code elements $x_i$ generated by a serial encoder from a source of original digital data elements $u_i$, into decoded elements corresponding to the original digital data elements $u_i$, the decoder system comprising:

(a) a plurality of permuters each having an input;
(b) at least one first probability-based decoder, each coupled to a corresponding permuter, and including a received signal input;
(c) a plurality of inverse permuters, each coupled to a corresponding probability-based decoder so as to receive a signal associated with a corresponding permuter;
(d) a plurality of first differential combinatorial elements, each coupled to a corresponding inverse permuter;
(e) a plurality of first delay elements, each coupled between the input of a corresponding permuter and a corresponding first differential combinatorial element;
(f) a second probability-based decoder, coupled to each first differential combinatorial element, and including inputs corresponding to each first differential combinatorial element, and an output;
(g) a plurality of second differential combinatorial elements, each coupled to the second probability-based decoder and to the input of a corresponding permuter;
(h) a plurality of second delay elements, each coupled between corresponding inputs of the second probability-based decoder and a corresponding second differential combinatorial element;

wherein the sequence of received signals $y_i$ is coupled to corresponding received signal inputs of the first probability-based decoders.

36. The decoder system of claim 35, wherein at least one probability-based decoder uses the maximum a posteriori probability algorithm.

37. The decoder system of claim 35, wherein at least one probability-based decoder uses the soft output Viterbi algorithm.

38. A method for error-correction coding of a source of original digital data elements, comprising the steps of:
   (a) generating a first series of systematic convolutional encoded output elements derived from a source of original digital data elements;
   (b) modifying the order of the original digital data elements to generate at least one set of respective interleaved elements; and
   (c) generating at least one corresponding next series of systematic convolutional encoded output elements derived from a corresponding set of respective interleaved elements, each next series of coded output elements being in parallel with the first series of coded output elements;
   (d) outputting only the first series of systematic convolutional encoded output elements and each next series of systematic convolutional encoded output elements.

39. The method of claim 38, further including the steps of:
   (a) receiving signals representative of at least some of the first series of systematic convolutional encoded output elements and of at least some of each next series of systematic convolutional encoded output elements; and
   (b) generating the original digital data elements from such received signals.

40. The method of claim 38, further including the step of generating an output multilevel modulated signal representative of at least some of such coded output elements.

41. The method of claim 40, wherein the multilevel modulation is trellis code modulation.

42. The method of claim 40, further including the steps of:
   (a) demodulating the output multilevel modulated signal into a data signal representative of at least some of the first series of systematic convolutional encoded output elements and of at least some of each next series of systematic convolutional encoded output elements;
   (b) generating the original digital data elements from the data signal.

43. A method for error-correction coding of a plurality of sources of original digital data elements, comprising the steps of:
   (a) generating a first set of series systematic convolutional encoded output elements derived from a plurality of sources of original digital data elements;
   (b) modifying the order of the original digital data elements from the respective sources to generate at least one set of respective interleaved elements; and
   (c) generating at least one corresponding next set of series systematic convolutional encoded output elements derived from a corresponding set of respective interleaved elements, each next set of series systematic convolutional encoded output elements being in parallel with the first set of series systematic convolutional encoded output elements.

44. The method of claim 43, including the further the step of outputting the original digital data elements.

45. The method of claim 43, including the further the step of outputting only the first set of series systematic convolutional encoded output elements and each next set of series systematic convolutional encoded output elements.

46. The method of claim 43, further including the steps of:
   (a) receiving signals representative of at least some of the first set of series systematic convolutional encoded output elements and of at least some of each next set of series systematic convolutional encoded output elements; and
   (b) generating the original digital data elements from such received signals.

47. The method of claim 43, further including the step of generating an output multilevel modulated signal representative of at least some of such systematic convolutional encoded output elements.

48. The method of claim 47, wherein the multilevel modulation is trellis code modulation.

49. The method of claim 47, further including the steps of:
   (a) demodulating the output multilevel modulated signal into a data signal representative of at least some of the first set of series systematic convolutional encoded output elements and of at least some of each next set of series systematic convolutional encoded output elements; and
   (b) generating the original digital data elements from the data signal.

50. A method for error-correction coding of a source of original digital data elements, comprising the steps of:
   (a) modifying the order of a source of original digital data elements to generate at least one set of interleaved elements; and
   (b) generating a set of systematic convolutional encoded output elements derived from the original digital data elements and at least one set of interleaved elements;
   (c) outputting only the set of systematic convolutional encoded output elements.

51. The method of claim 50, further including the steps of:
   (a) receiving signals representative of at least some of the set of systematic convolutional encoded output elements; and
   (b) generating the original digital data elements from such received signals.

52. The method of claim 50, further including the step of generating an output multilevel modulated signal representative of at least some of such systematic convolutional encoded output elements.

53. The method of claim 52, wherein the multilevel modulation is trellis code modulation.

54. The method of claim 52, further including the steps of:
   (a) demodulating the output multilevel modulated signal into a data signal representative of at least some of the set of systematic convolutional encoded output elements; and
   (b) generating the original digital data elements from the data signal.

55. A method for error-correction coding of a source of original digital data elements, comprising the steps of:
   (a) generating a plurality of systematic convolutional encoded intermediate output elements derived from a source of original digital data elements;
   (b) modifying the order of the systematic convolutional encoded intermediate output elements to generate at least one set of respective interleaved output elements; and
   (c) generating a set of systematic convolutional encoded output elements derived from at least one set of interleaved output elements.

56. The method of claim 55, further including the steps of:
(a) receiving signals representative of at least some of the set of systematic convolutional encoded output elements; and
(b) generating the original digital data elements from such received signals.

57. The method of claim 55, further including the step of generating an output multilevel modulated signal representative of at least some of such systematic convolutional encoded output elements.

58. The method of claim 57, wherein the multilevel modulation is trellis code modulation.

59. The method of claim 57, further including the steps of:
(a) demodulating the output multilevel modulated signal into a data signal representative of at least some of the set of systematic convolutional encoded output elements; and
(b) generating the original digital data elements from the data signal.

60. A method for error-correction coding of a source of original digital data elements, comprising the steps of:
(a) generating a first series of systematic convolutional encoded output elements derived from a source of original digital data elements;
(b) modifying the order of the original digital data elements to generate at least one set of interleaved elements;
(c) generating at least one next series of systematic convolutional encoded output elements derived from at least one set of interleaved elements, each next series of systematic convolutional encoded output elements being in parallel with the first series of systematic convolutional encoded output elements; and
(d) generating an output multilevel modulated signal directly from and representative of at least some of such original digital data elements and systematic convolutional encoded output elements.

61. The method of claim 60, wherein the multilevel modulation is trellis code modulation.

62. A method for error-correction coding and multilevel modulation of a plurality of sources of original digital data elements, comprising the steps of:
(a) systematically selecting a first subset of original digital data elements from a plurality of sources of original digital data elements;
(b) generating a first series of systematic convolutional encoded output elements derived from the first selected subset;
(c) outputting at least one source of original digital data elements unchanged;
(d) modifying the order of the original digital data elements to generate at least two sets of interleaved elements;
(e) systematically selecting a next subset from the sets of interleaved elements different from each other selected subset;
(f) generating at least one next series of systematic convolutional encoded output elements derived from a corresponding next subset, each next series of systematic convolutional encoded output elements being in parallel with the first series of systematic convolutional encoded output elements;
(g) outputting at least one set of interleaved elements unchanged; and
(h) generating an output multilevel modulated signal representative of at least some of such original digital data elements, unchanged interleaved elements, and systematic convolutional encoded output elements.

63. The method of claim 62, wherein the multilevel modulation is trellis code modulation.

64. A method for terminating input to a turbo encoder comprising a plurality of serially connected delay elements D having a tap after each delay element; a plurality of first selective combinatorial devices, at least one before the first serially connected delay element D, at least one after the last serially connected delay element D, and at least one between each intermediate pair of serially connected delay elements D; at least one data source line $u_b$, where b is the number of data source lines, each coupled to each first selective combinatorial device as input lines; and at least one set of next selective combinatorial devices, each set comprising a plurality of selective combinatorial devices each coupled to a corresponding tap and serially coupled together, with an end selective combinatorial device of each set selectively coupled to a corresponding data source line; the method comprising the steps of:
(a) coupling the sets of next selective combinatorial devices to the corresponding data source line;
(b) selectively actuating the sets of next selective combinatorial devices to select tap coefficients $a_{i,0}, \ldots a_{i,m-1}$ for i=1, 2, ... b, to apply to a corresponding data source line, wherein the tap coefficients are obtained by repeated use of the following equation, and by solving the resulting equations:

$$S^k(D)\left[\sum_{i=1}^{b} u_i^k h_i(D) + DS^{k-1}(D)\right] \bmod h_0(D)$$

where $S^k(D)$ is the state of the turbo encoder at time k with coefficients $S^k_0, S^k_1, \ldots S^k_{m-1}$ for input $u^k_1, \ldots u^k_b$, and termination in state zero is achieved in at most m clock cycles.

65. A method for decoding a plurality of sequences of received signals $y_i$, representative of systematic convolutional encoded elements $x_i$ generated from a source of original digital data elements $u_i$, into decoded elements corresponding to the original digital data elements $u_i$, the method comprising the steps of:
(a) coupling at least three decoder modules, each having a received signal input i, a feedback input, and an output, such that the output of each decoder module is coupled to the feedback input of each other decoder module;
(b) applying each sequence of received signals $y_i$ to the received signal input i of a corresponding decoder module; and
(c) summing the output of each decoder module to generate final decoded elements.

66. The method of claim 65, wherein each decoder module includes:
(a) a feedback input comprising a combinatorial element;
(b) a permuter, coupled to the combinatorial element;
(c) a probability-based decoder, coupled to the permuter and including a received signal input;
(d) an inverse permuter, coupled to the probability-based decoder;
(e) a differential combinatorial element, coupled to the inverse permuter; and (f) a delay element, coupled between the combinatorial element and the differential combinatorial element.

67. The method of claim 66, wherein the probability-based decoder uses the maximum a posteriori probability algorithm.

68. The decoder method of claim 66, wherein the probability-based decoder uses the soft output Viterbi algorithm.

69. An iterative method for decoding at least one sequence of received signals $y_i$, representative of systematic convolutional encoded elements $x_i$ generated by a self-concatenated encoder from a source of original digital data elements $u_i$, into decoded elements corresponding to the original digital data elements $u_i$, the method comprising the steps of:

(a) applying feedback signals to inputs of a plurality of combinatorial elements to generate first output signals;

(b) applying the first output signals to a plurality of permuters to generate second output signals;

(c) applying selected ones of the first and second output signals, and each sequence of received signals $y_i$, to a probability-based decoder to generate third output signals and a decoded output for decoded elements;

(d) applying the third output signals to a plurality of inverse permuters to generate fourth output signals;

(e) applying the fourth output signals to a plurality of differential combinatorial elements to generate feedback signals;

(f) applying the feedback signals to non-corresponding inputs of the plurality of combinatorial elements; and (g) coupling a plurality of delay elements between a corresponding combinatorial element and a corresponding differential combinatorial element.

70. The decoder method of claim 69, wherein the probability-based decoder uses the maximum a posteriori probability algorithm.

71. The decoder method of claim 69, wherein the probability-based decoder uses the soft output Viterbi algorithm.

72. An iterative method for decoding at least one sequence of received signals $y_i$, representative of code elements $x_i$ generated by a serial encoder from a source of original digital data elements $u_i$, into decoded elements corresponding to the original digital data elements $u_i$, the method comprising the steps of:

(a) applying feedback signals to respective inputs of a plurality of permuters to generate first output signals;

(b) applying the first output signals, and the sequence of received signals $y_i$, to at least one first probability-based decoder to generate second output signals;

(c) applying the second output signals to a plurality of inverse permuters to generate third output signals;

(d) applying the third output signals to a plurality of first differential combinatorial elements to generate fourth output signals;

(e) coupling a plurality of first delay elements between respective inputs of corresponding permuters and corresponding first differential combinatorial elements;

(f) applying the fourth output signals to a second probability-based decoder to generate fifth output signals and a decoded output for decoded elements;

(g) applying the fifth output signals to a plurality of second differential combinatorial elements, to generate feedback signals coupled to the second probability-based decoder and to the inputs of corresponding permuters;

(h) coupling a plurality of second delay elements between corresponding inputs of the second probability-based decoder and corresponding second differential combinatorial elements.

73. The method of claim 72, wherein at least one probability-based decoder uses the maximum a posteriori probability algorithm.

74. The method of claim 72, wherein at least one probability-based decoder uses the soft output Viterbi algorithm.

* * * * *

UNITED STATES PATENT AND TRADEMARK OFFICE
CERTIFICATE OF CORRECTION

PATENT NO. : 6,023,783
DATED : February 8, 2000
INVENTOR(S) : Dariush Divsalar and Fabrizio Pollara It is certified that error appears in the above-identified patent and that said Letters Patent is hereby corrected as shown below:

<u>Column 1,</u>
Line 1, insert -- This application claims the benefit of prior U.S. provisional application serial no. 60/017,784, filed May 15, 1996. --

Signed and Sealed this

Twenty-first Day of August, 2001

*Attest:*

*Nicholas P. Godici*

NICHOLAS P. GODICI
*Attesting Officer*     *Acting Director of the United States Patent and Trademark Office*